United States Patent [19]
Agrawal et al.

[11] Patent Number: 6,127,843
[45] Date of Patent: Oct. 3, 2000

[54] DUAL PORT SRAM MEMORY FOR RUN TIME USE IN FPGA INTEGRATED CIRCUITS

[75] Inventors: Om P. Agrawal, Los Altos; Herman M. Chang, Cupertino; Bradley A. Sharpe-Geisler; Bai Nguyen, both of San Jose, all of Calif.

[73] Assignee: Vantis Corporation, San Jose, Calif.

[21] Appl. No.: 08/996,049

[22] Filed: Dec. 22, 1997

[51] Int. Cl.[7] .................................................. H03K 19/177
[52] U.S. Cl. ................................................. 326/40; 326/47
[58] Field of Search ................................ 326/40, 41, 47, 326/37, 38; 365/189.08

[56] References Cited

U.S. PATENT DOCUMENTS

| | | | |
|---|---|---|---|
| 4,912,342 | 3/1990 | Wong et al. | 307/465 |
| 5,212,652 | 5/1993 | Agrawal et al. | 364/489 |
| 5,241,224 | 8/1993 | Pedersen et al. | 307/465 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,477,165 | 12/1995 | ElAyat et al. | 326/38 |
| 5,555,214 | 9/1996 | Sung et al. | 365/221 |
| 5,559,450 | 9/1996 | Ngai et al. | 326/40 |
| 5,566,123 | 10/1996 | Freidin et al. | 365/230.05 |
| 5,644,496 | 7/1997 | Agrawal et al. | 364/489 |
| 5,744,980 | 4/1998 | McGowan et al. | 326/40 |
| 5,787,007 | 7/1998 | Bauer | 364/489 |
| 5,801,547 | 9/1998 | Kean | 326/40 |

FOREIGN PATENT DOCUMENTS

WO 98/10517  12/1998  WIPO .......................... H03K 19/177

OTHER PUBLICATIONS

Actel Corporation Product Specification: 3200DX Field Programmable Gate Arrays—The System Logic Integrator™ Family, Aug. 1995, pp. 1–9, 14, 18–20.

Advance Product Brief, Dec. 1996, Lucent Technologies: Optimized Reconfigurable Cell Array (ORCA™) OR3Cxxx/OR3Txxx Series Field–Programmable Gate Arrays.

Product Brief, Jun. 1997, Lucent Technologies: ORCA® OR2CxxA (5.0V) and OR2TxxA (3.3V) Series Field–Programmable Gate Arrays.

*Primary Examiner*—Michael Tokar
*Assistant Examiner*—James H. Cho
*Attorney, Agent, or Firm*—Fliesler, Dubb, Meyer & Lovejoy LLP

[57] ABSTRACT

A field-programmable gate array device (FPGA) having plural rows and columns of logic function units (VGB's) further includes plural columns of embedded memory blocks, where each memory block is embedded in a corresponding row of logic function units. Each logic function unit (VGB) is organized to process a nibble of data. Each embedded memory block is multi-ported and organized to store addressable nibbles of data. Interconnect resources are provided for efficiently transferring nibbles of data between the logic function units (VGB's) and corresponding memory blocks. Further interconnect resources (SVIC's) are provided for supplying address and control signals to each memory block. In one embodiment each memory block has at least one read-only port and at least one read/write port that are individually addressable and individually switchable into high output impedance tri-state modes.

44 Claims, 39 Drawing Sheets

PORT_1 ASYNCH READ

PORT_2 ASYNCH READ

PORT_2 PRE-ADDRESS ASYNCH READ

DUAL PORT SRAM MEMORY FOR RUN TIME USE IN FPGA INTEGRATED CIRCUITS

CROSS REFERENCE TO RELATED APPLICATIONS

The following copending U.S. patent application(s) is/are assigned to the assignee of the present application, and its/their disclosures is/are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(C) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(D) Ser. No. 08/995,615 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(E) Ser. No. 08/995,615 filed Dec. 22, 1997, by Om Agrawal et al. and originally entitled, "FLEXIBLE DIRECT CONNECTIONS BETWEEN INPUT/OUTPUT BLOCKs (IOBS) AND VARIABLE GRAIN BLOCKs (VGBs) IN FPGA INTEGRATED CIRCUITS"; and, (F) Ser. No. 08/995,615 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS".

CROSS REFERENCE TO RELATED PATENTS

The following U.S. patent(s) are assigned to the assignee of the present application, and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

BACKGROUND

1. Field of the Invention

The invention is generally directed to integrated circuits, more specifically to on-chip memory provided for run-time use within Programmable Logic Devices (PLD's), and even more specifically to a subclass of PLD's known as Field Programmable Gate Arrays (FPGA's).

2. Description of Related Art

Field-Programmable Logic Devices (FPLD's) have continuously evolved to better serve the unique needs of different end-users. From the time of introduction of simple PLD's such as the Advanced Micro Devices 22V10TM Programmable Array Logic device (PAL), the art has branched out in several different directions.

One evolutionary branch of FPLD's has grown along a paradigm known as Complex PLD's or CPLD's. This paradigm is characterized by devices such as the Advanced Micro Devices MACH™ family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means. Typically, each of the many CLB's of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect. A version of hard wired interconnect wherein a given conductor is dedicatedly connected to be always driven by a particular output driver, is sometimes referred to as 'direct connect'.

In addition to the above-mentioned basic components, it is sometimes desirable to include on-chip reprogrammable memory that is embedded between CLB's and available for run-time use by the CLB's and/or resources of the FPGA for temporarily holding storage data. This embedded run-time memory is to be distinguished from the configuration memory because the latter configuration memory is generally not reprogrammed while the FPGA device is operating in a run-time mode. The embedded run-time memory may be used in speed-critical paths of the implemented design to implement, for example, FIFO or LIFO elements that buffer data words on a first-in/first-out or last-in/first-out basis. Read/write speed and appropriate interconnecting of such on-chip embedded memory to other resources of the FPGA can limit the ability of a given FPGA architecture to implement certain speed-critical designs.

Modern FPGA's tend to be fairly complex. They typically offer a large spectrum of user-configurable options with respect to how each of many CLB's should be configured, how each of many interconnect resources should be configured, and how each of many IOB's should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

FPGA-configuring software typically cycles through a series of phases, referred to commonly as 'partitioning', 'placement', and 'routing'. This software is sometimes referred to as a 'place and route' program. Alternate names may include, 'synthesis, mapping and optimization tools'. In the partitioning phase, an original circuit design (which is usually relatively large and complex) is divided into smaller chunks, where each chunk is made sufficiently small to be implemented by a single CLB, the single CLB being a yet-unspecified one of the many CLB's that are available in the yet-unprogrammed FPGA device. Differently designed FPGA's can have differently designed CLB's with respective logic-implementing resources. As such, the maximum size of a partitioned chunk can vary in accordance with the specific FPGA device that is designated to implement the original circuit design. The original circuit design can be specified in terms of a gate level description, or in Hardware Descriptor Language (HDL) form or in other suitable form.

After the partitioning phase is carried out, each resulting chunk is virtually positioned into a specific, chunk-implementing CLB of the designated FPGA during a subsequent placement phase.

In the ensuing routing phase, an attempt is made to algorithmically establish connections between the various chunk-implementing CLB's of the FPGA device, using the interconnect resources of the designated FPGA device. The goal is to reconstruct the original circuit design by reconnecting all the partitioned and placed chunks.

If all goes well in the partitioning, placement, and routing phases, the FPGA configuring software will find a workable 'solution' comprised of a specific partitioning of the original circuit, a specific set of CLB placements and a specific set of interconnect usage decisions (routings). It can then deem its mission to be complete and it can use the placement and routing results to generate the configuring code that will be used to correspondingly configure the designated FPGA.

In various instances, however, the FPGA configuring software may find that it cannot complete its mission successfully on a first try. It may find, for example that the initially-chosen placement strategy prevents the routing phase from completing successfully. This might occur because signal routing resources have been exhausted in one or more congested parts of the designated FPGA device. Some necessary interconnections may have not been completed through those congested parts. Alternatively, all necessary interconnections may have been completed, but the FPGA configuring software may find that simulation-predicted performance of the resulting circuit (the so-configured FPGA) is below an acceptable threshold. For example, signal propagation time may be too large in a speed-critical part of the FPGA-implemented circuit.

In either case, if the initial partitioning, placement and routing phases do not provide an acceptable solution, the FPGA configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the FPGA-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. FPGA configuring programs typically try to explore a multitude of promising avenues within a finite amount of time to see what effects each partitioning, placement, and routing move may have on the ultimate outcome. This in a way is analogous to how chess-playing machines explore ramifications of each move of each chess piece on the end-game. Even when relatively powerful, high-speed computers are used, it may take the FPGA configuring software a significant amount of time to find a workable solution. Turn around time can take more than 8 hours.

In some instances, even after having spent a large amount of time trying to find a solution for a given FPGA-implementation problem, the FPGA configuring software may fail to come up with a workable solution and the time spent becomes lost turn-around time. It may be that, because of packing inefficiencies, the user has chosen too small an FPGA device for implementing too large of an original circuit.

Another possibility is that the internal architecture of the designated FPGA device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. Another example is 'control logic' which is less random than fully 'random logic' but less regular than 'bus oriented' designs. There may be many more taxonomical descriptions. The point is that some FPGA structures may be better suited for implementing random logic while others may be better suited for implementing bus oriented designs or other kinds of designs.

If the FPGA configuring software fails in a first run, the user may choose to try again with a differently-structured FPGA device. The user may alternatively choose to spread the problem out over a larger number of FPGA devices, or even to switch to another circuit implementing strategy such as CPLD or ASIC (where the latter is an Application Specific hardwired design of an IC). Each of these options invariably consumes extra time and can incur more costs than originally planned for.

FPGA device users usually do not want to suffer through such problems. Instead, they typically want to see a fast turnaround time of no more than, say 4 hours, between the time they complete their original circuit design and the time a first-run FPGA is available to implement and physically test that design. More preferably, they would want to see a fast turnaround time of no more than, say 30 minutes, for successful completion of the FPGA configuring software when executing on a 80486-80686 PC platform (that is, a so-commercially specified, IBM compatible personal computer) and implementing a 25000 gate or less, design in a target FPGA device.

FPGA users also usually want the circuit implemented by the FPGA to provide an optimal emulation of the original design in terms of function packing density, cost, speed, power usage, and so forth irrespective of whether the original design is taxonomically describable generally as 'random logic', or as 'bus oriented', or as a combination of these, or otherwise.

When multiple FPGA's are required to implement a very large original design, high function packing density and efficient use of FPGA internal resources are desired so that implementation costs can be minimized in terms of both the number of FPGA's that will have to be purchased and the amount of printed circuit board space that will be consumed.

Even when only one FPGA is needed to implement a given design, a relatively high function packing density is still desirable because it usually means that performance speed is being optimized due to reduced wire length. It also usually means that a lower cost member of a family of differently sized FPGA's can be selected or that unused resources of the one FPGA can be reserved for future expansion needs.

In summary, end users want the FPGA configuring software to complete its task quickly and to provide an efficiently-packed, high-speed compilation of the functionalities provided by an original circuit design irrespective of the taxonomic organization of the original design.

In the past, it was thought that attainment of these goals was primarily the responsibility of the computer programmers who designed the FPGA configuring software. It has been shown however, that the architecture or topology of the unprogrammed FPGA can play a significant role in determining how well and how quickly the FPGA configuring software completes the partitioning, placement, and routing tasks.

The architectural layout and implementation of on-chip embedded memory can also play a role in how well the FPGA configuring software is able to complete the partitioning, placement and routing tasks with respect to using embedded memory; and also how well the FPGA-implemented circuit performs in terms of propagating signals into, through and out of the on-chip embedded memory.

SUMMARY OF THE INVENTION

An improved FPGA device in accordance with the invention includes multiple columns of multi-ported SRAM blocks for holding run-time storage data. In each such SRAM block, a first of the multiple ports is a read/write port (Port_1) and a second is a read-only port (Port_2).

In one embodiment, the read/write port (Port_1) of each SRAM block in a first such memory column (e.g., LeftMC) may be coupled through user-configuration to adjacent bidirectional interconnect lines (e.g., tri-stated horizontal longlines) for providing time-multiplexed writing and reading of storage data. The read/write port of each SRAM block in a second such memory column (e.g., RightMC) may be coupled through user-configuration to adjacent bidirectional inter-connect lines (ABIL's) that are either the same or different from lines used by the first memory column (e.g., LeftMC). When coupled to the same lines, the SRAM block of either column may output its data for writing into the SRAM block of other column by way of such same ABIL's. When not coupled to the same lines, SRAM blocks in both columns (LMC and RMC) may be simultaneously used each for either writing or reading storage data by way of the different ABIL's.

In the same one embodiment, the read-only port (Port_2) of each SRAM block in the first memory column (e.g., LMC) may be coupled through user-configuration to a first subset of adjacent interconnect lines (AIL's). The read-only port of each SRAM block in second memory column (e.g., RMC) may be coupled through user-configuration to a second subset of AIL's, where the second subset is at least partially different from the first subset of AIL's. Each of the first and second subset of AIL's that are usable by the read-only ports (Port_2) includes at least one of the ABIL's (adjacent bidirectional interconnect lines) used by a corresponding read/write port (Port_1) such that storage data output by the read-only port (Port_2) may be written into the corresponding read/write port (Port_1) on a time-multiplexed basis.

Each of the first and second subset of AIL's that are usable by the read-only ports (Port_2) includes further adjacent interconnect lines (2×L, 4×L, 8×L lines) that are shorter or otherwise faster than the ABIL's and allow for faster output of stored data by way of the read-only ports (Port_2) as compared to output of the same stored data by way of the read/write ports (Port_1).

Special, vertical interconnect channels are included within the improved FPGA device for supplying read-address signals and write-address signals to the SRAM blocks as well as additional control signals. Address signals may be broadcast via special longlines (SMaxL lines) to all SRAM blocks of a given column or localized to groups of SRAM blocks in a given column by using shorter special vertical lines (S4×L lines).

One of the features of the multi-ported structure is that read operations can be performed simultaneously at the multiple ports of each SRAM block using respective, and typically different, address signals for each such port, as well as different interconnect lines for receiving the output data. The data output (data reading) bandwidth of the embedded memory can be thereby maximized, if such maximize bandwidth is desired.

Another of the features of the multi-ported structure is that the apparent depth and width of the embedded memory may be configured in various ways other than to maximize data reading bandwidth. For example, writing of data may be time-wise alternated between the read/write port (Port_

1) of the first and second memory columns (LMC/RMC) while data output (reading) simultaneously occurs at the other 3 ports, namely, the other read/write port (Port_1) and the two read-only ports (Port_2).

Other aspects of the invention will become apparent from the below detailed description.

BRIEF DESCRIPTION OF THE DRAWINGS

The below detailed description makes reference to the accompanying drawings, in which:

FIG. 1 and 1A–1B illustrate a first FPGA having an 8 x 8 matrix of VGB's (Variable Grain Blocks) with an embedded left memory column (LMC) and an embedded right memory column (RMC) in accordance with the invention;

FIG. 4 and 4A–4B illustrate more details of a Right Memory Column (RMC), and in particular of two adjacent memory blocks and of the relation of the memory blocks to an adjacent super-VGB core tile and its horizontal interconnect channels (HIC's);

DETAILED DESCRIPTION

Figure 1A:
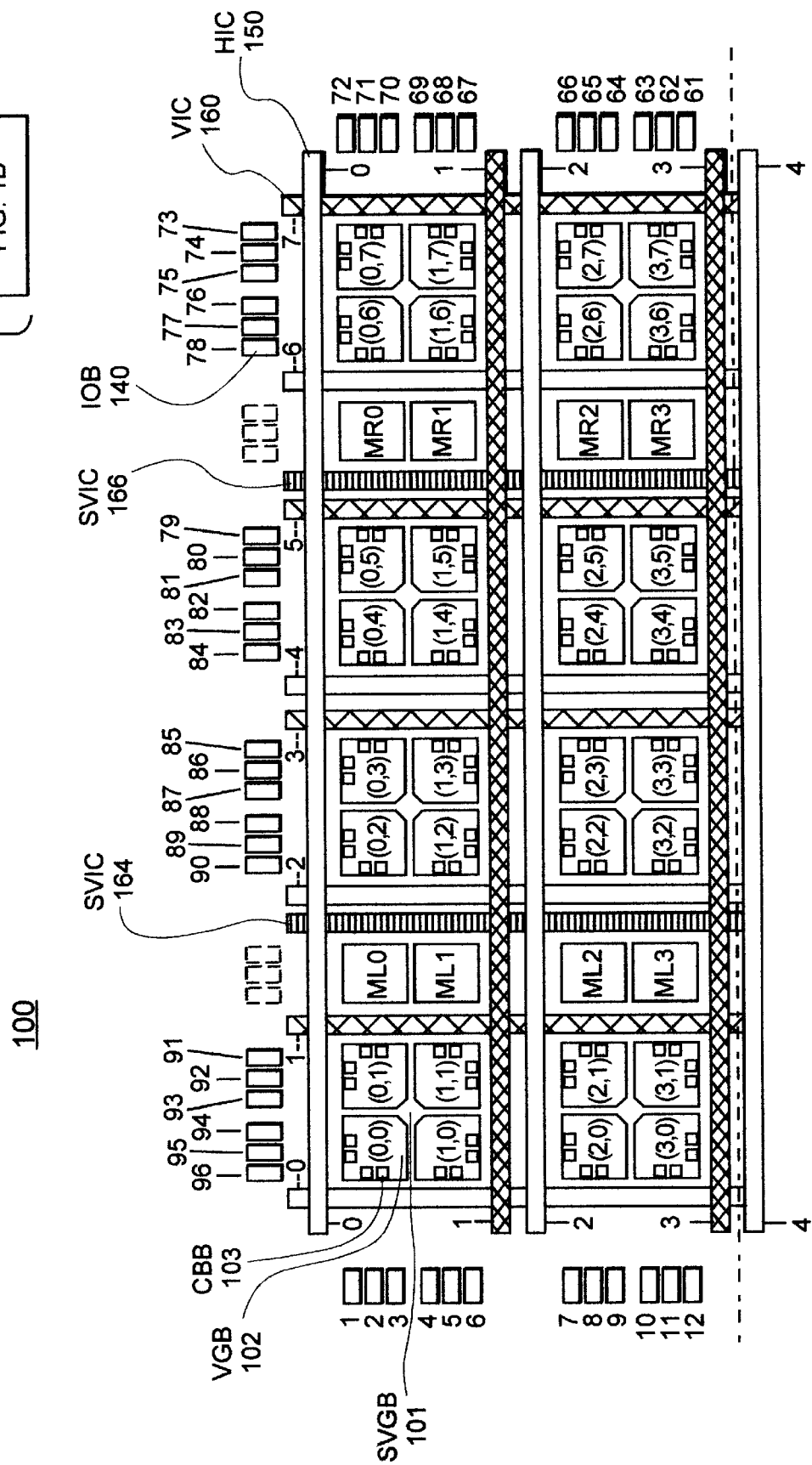

FIG. 1 shows a macroscopic view of an FPGA device 100 in accordance with the invention. The illustrated structure is preferably formed as a monolithic integrated circuit.

The macroscopic view of FIG. 1 is to be understood as being taken at a magnification level that is lower than later-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity.

FPGA device 100 includes a regular matrix of super structures defined herein as super-VGB's (SVGB's). In the illustrated embodiment, a dashed box(upper left corner) circumscribes one such super-VGB structure which is referenced as 101. There are four super-VGB's shown in each super row of FIG. 1 and also four super-VGB's shown in each super column. Each super row or column contains plural rows or columns of VGB's. One super column is identified as an example by the braces at 111.

Larger matrices with more super-VGB's per super column and/or super row are of course contemplated. FIG. 1 is merely an example.

There is a hierarchy of user-configurable resources within each super-VGB. At a next lower level, each super-VGB is seen to contain four VGB's. In the illustrated embodiment, identifier 102 points to one such VGB within SVGB 101.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 103 points to one such CBB within VGB 102.

At a next lower level, each CBB has its own hierarchy of user configurable resources. Some of these will be shown in later figures. A more detailed description of the hierarchal resources of the super-VGB's, VGB's, CBB's, and so forth, may be found in the above-cited Ser. No. 08/948,306 filed Oct. 9, 1997 by Om P. Agrawal et al. and originally entitled, "VARIABLE GRAIN ARCHITECTURE FOR FPGA INTEGRATED CIRCUITS", whose disclosure is incorporated herein by reference.

It is sufficient for the present to appreciate that each CBB is capable of producing and storing at least one bit of result data and/or of outputting the result data to adjacent interconnect lines. Each VGB (102) is in turn, therefore capable of producing and outputting at least 4 such result bits at a time to adjacent interconnect lines. This is referred to as nibble-wide processing. Nibble-wide processing may also be carried out by the four CBB's that line the side of each SVGB (e.g., 101).

With respect to the adjacent interconnect lines (AIL's), each SVGB is bounded by two horizontal and two vertical interconnect channels (HIC's and VIC's). An example of a HIC is shown at 150. A sample VIC is shown at 160. Each such interconnect channel contains a diverse set of interconnect lines as will be seen later.

The combination of each SVGB (e.g., 101) and its surrounding interconnect resources (of which resources, not all are shown in FIG. 1) is referred to as a matrix tile. Matrix tiles are tiled one to the next as seen, with an exception occurring about the vertical sides of the two central, super columns, 115. Columns 114 (LMC) and 116 (RMC) of embedded memory are provided along the vertical sides of the central pair 115 of super columns. These columns 114, 116 will be examined in closer detail shortly.

Figure 4A:
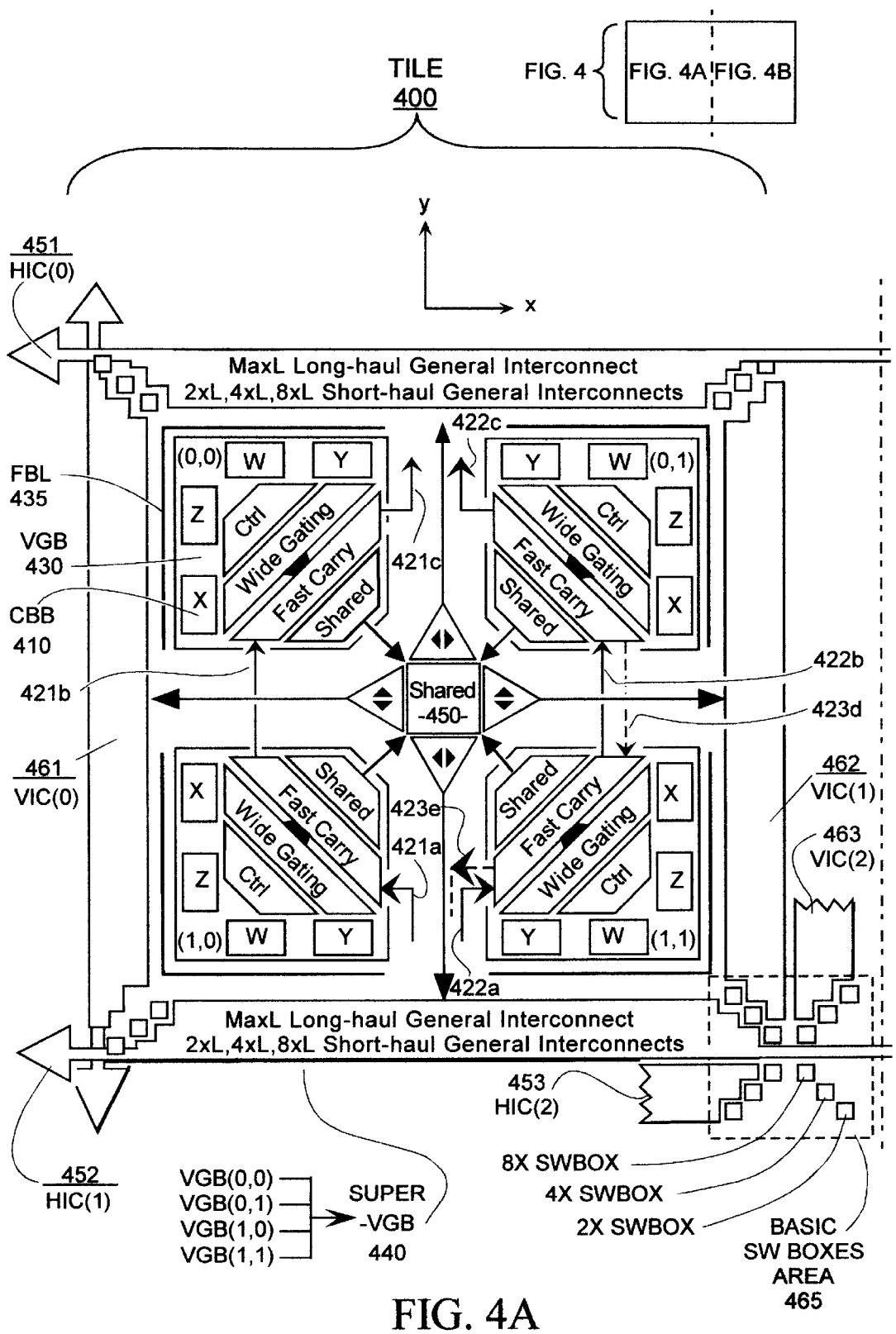
Figure 4B:
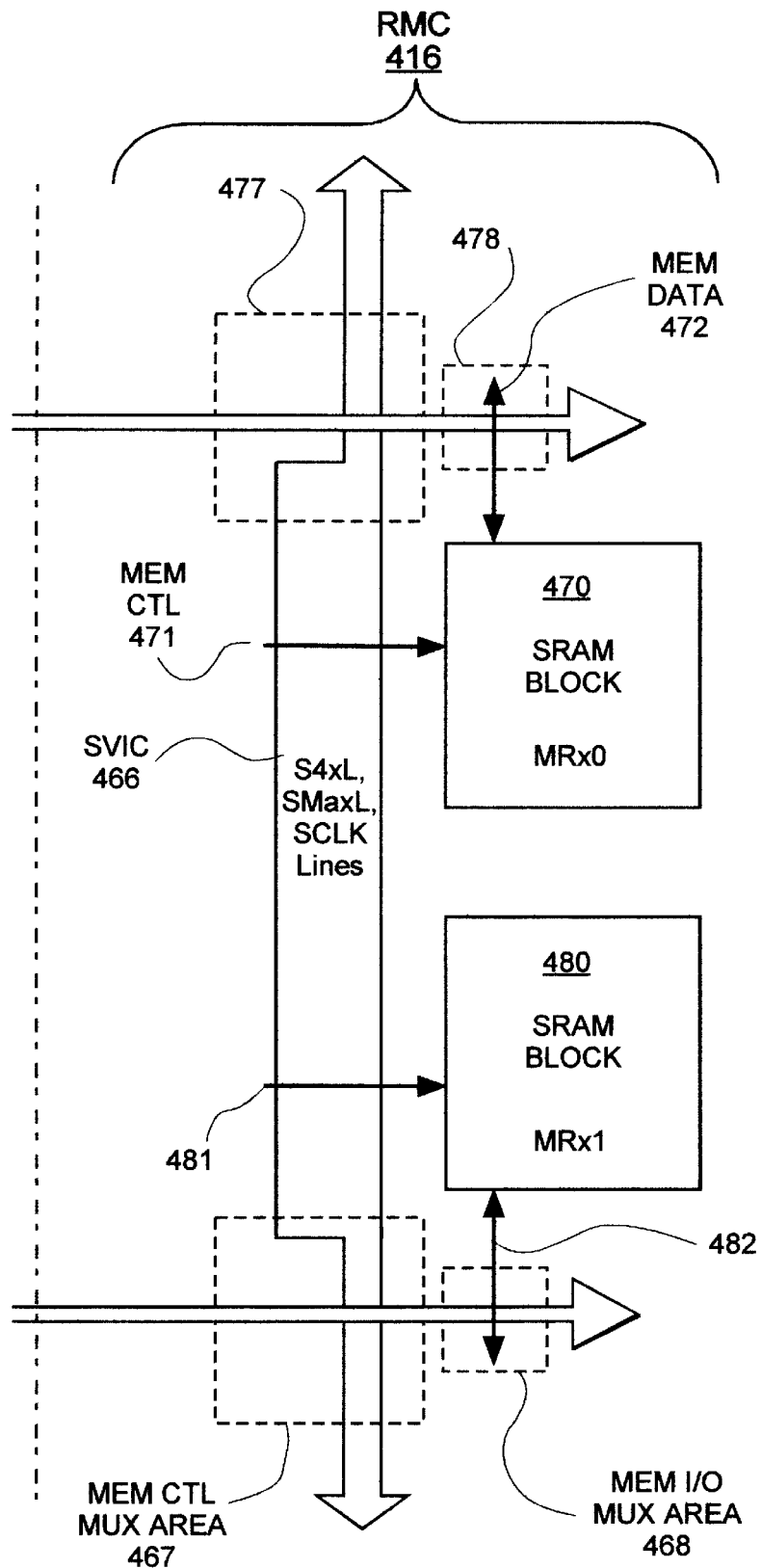

From a more generalized perspective, the tiling of the plural tiles creates pairs of adjacent interconnect channels within the core of the device 100. An example of a pair of adjacent interconnect channels is seen at HIC's 1 and 2. The peripheral channels (HIC0, HIC7, VIC0, VIC7) are not so paired. Switch matrix boxes (not shown, see FIG. 2) are formed at the intersections at the respective vertical and horizontal interconnect channels. The switch matrix boxes form part of each matrix tile construct that includes a super-VGB at its center. See area 465 of FIG. 4.

The left memory column (LMC) 114 is embedded as shown to the left of central columns pair 115. The right memory column (RMC) 116 is further embedded as shown to the right of the central columns pair 115. It is contemplated to have alternate embodiments with greater numbers of such embedded memory columns symmetrically distributed in the FPGA device and connected in accordance with the teachings provided herein for the illustrative pair of columns, 114 and 116.

Within the illustrated LMC 114, a first, special, vertical interconnect channel (SVIC) 164 is provided adjacent to respective, left memory blocks ML0 through ML7. Within the illustrated RMC 164, a second, special, vertical interconnect channel (SVIC) 166 is provided adjacent to respective, right memory blocks MR0 through MR7.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 114 or RMC 116. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 is organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (102) and/or to the nibble-wise organization of each group of four CBB's that line the side of each SVGB (101). Thus, there is a data-width match between each embedded memory block and each group of four CBB's or VGB. As will be seen a similar kind of data-width matching also occurs within the diversified resources of the general interconnect mesh.

At the periphery of the FPGA device 100, there are three input/output blocks (IOB's) for each row of VGB's and for each column of VGB's. One such IOB is denoted at 140. The IOB's in the illustrated embodiment are shown numbered from 1 to 96. In one embodiment, there are no IOB's directly above and below the LMC 114 and the RMC 116. In an alternate embodiment, special IOB's such as shown in phantom at 113 are provided at the end of each memory column for driving address and control signals into the corresponding memory column.

Each trio of regular IOB's at the left side (1–24) and the right side (49–72) of the illustrated device 100 may be user-configured to couple to the nearest HIC. Similarly, each trio of regular IOB's on the bottom side (25–48) and top side (73–96) may be user-configured for exchanging input and/or output signals with lines inside the nearest corresponding VIC. The SIOB's (e.g., 113), if present, may be user-configured to exchange signals with the nearest SVIC (e.g., 164). Irrespective of whether the SIOB's (e.g., 113) are present, data may be input and/or output from points external of the device 100 to/from the embedded memory columns 114, 116 by way of the left side IOB's (1–24) and the right side IOB's (49–72) using longline coupling, as will be seen below. The longline coupling allows signals to move with essentially same speed and connectivity options from/to either of the left or right side IOB's (1–24, 49–72) respectively to/from either of the left or right side memory columns.

Data and/or address and/or control signals may also be generated within the FPGA device 100 by its internal VGB's and transmitted to the embedded memory 114, 116 by way of the HIC's, as will be seen below.

The VGB s are numbered according to their column and row positions. Accordingly, VGB(0,0) is in the top left corner of the device 100; VGB(7,7) is in the bottom right corner of the device 100; and VGB(1,1) is in the bottom right corner of SVGB 101.

Each SVGB (101) may have centrally-shared resources. Such centrally-shared resources are represented in FIG. 1 by the diamond-shaped hollow at the center of each illustrated super-VGB (e.g., 101). Longline driving amplifiers (see FIGS. 7A–7D) correspond with these diamond-shaped hollows and have their respective outputs coupling vertically and horizontally to the adjacent HIC's and VIC's of their respective super-VGB's.

As indicated above, each super-VGB in FIG. 1 has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB as will be described below. Another of these processes is implementation of a 4:1 dynamic multiplexer within each CBB. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 114/116. As will be seen, nibble-wide data may be transferred between one or more groups of four CBB's each to a corresponding one or more blocks of embedded memory (MLx or MRx) by way of sets of 4 equally-long lines in a nearby HIC. Each such set of 4 equally-long lines may be constituted by so-called, double-length lines (2×L lines), quad-length lines (4×L lines), octal-length lines (8×L lines) or maximum length longlines (MaxL lines).

In one particular embodiment of the FPGA device, the basic matrix is 10-by-10 SVGB's, with embedded memory columns 114/116 positioned around the central two super columns 115. (See FIG. 2.) In that particular embodiment, the integrated circuit is formed on a semiconductor die having an area of about 120,000 mils$^2$ or less. The integrated circuit includes at least five metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have channel lengths of 0.35 microns or 0.25 microns or less. Amplifier output transistors and transistors used for interfacing the device to external signals may be larger, however.

As indicated above, the general interconnect channels (e.g., HIC 150, VIC 160 of FIG. 1) contain a diverse set of interconnect lines. FIG. 2 shows a distribution 200 of different-length horizontal interconnect lines (2×L, 4×L, 8×L) and associated switch boxes of a single horizontal interconnect channel (HIC) 201, as aligned relative to vertical interconnect channels in an FPGA of the invention. This particular FPGA has a 10×10 matrix of super-VGB's (or a 20×20 matrix of VGB's). The embedded memory columns (114/116) are not fully shown, but are understood to be respectively embedded in one embodiment, between VIC's 7–8 and 11–12, as indicated by zig-zag symbols 214 and 216.

For an alternate embodiment, symbol 214 may be placed between VIC's 6 and 7 while symbol 216 is placed between VIC's 12 and 13 to indicate the alternate placement of the embedded memory columns 114/116 between said VIC's in the alternate embodiment. For yet another alternate embodiment, zig-zag symbol 214 may be placed between VIC's 8 and 9 while zig-zag symbol 216 is placed between VIC's 10 and 11 to represent corresponding placement of the embedded memory columns 114/116 in the corresponding locations. Of course, asymmetrical placement of the embedded memory columns 114/116 relative to the central pair of SVGB columns (115) is also contemplated. In view of these varying placement possibilities, the below descriptions of which 2×L, 4×L or 8×L line intersects with corresponding columns 214/216 should, of course, be read as corresponding to the illustrated placement of symbols 214 and 216 respectively between VIC's 7–8 and VIC's 11–12 with corresponding adjustments being made if one of the alternate placements of 214/216 is chosen instead.

By way of a general introduction to the subject of interconnect resources, it should be noted that the interconnect mesh of FPGA 100 includes lines having different lengths. It may be said that, without taking into account any length changes created by the imposition of the embedded memory columns 114/116, the horizontally-extending general interconnect channels (HIC's) and vertically-extending general interconnect channels (VIC's) of the FPGA device 100 are provided with essentially same and symmetrically balanced interconnect resources for their respective horizontal (x) and vertical (y) directions. These interconnect resources include a diversified and granulated assortment of MaxL lines, 2×L lines, 4×L lines and 8×L lines as well as corresponding 2×L switch boxes, 4×L switch boxes, and 8×L switch boxes.

Figure 5:
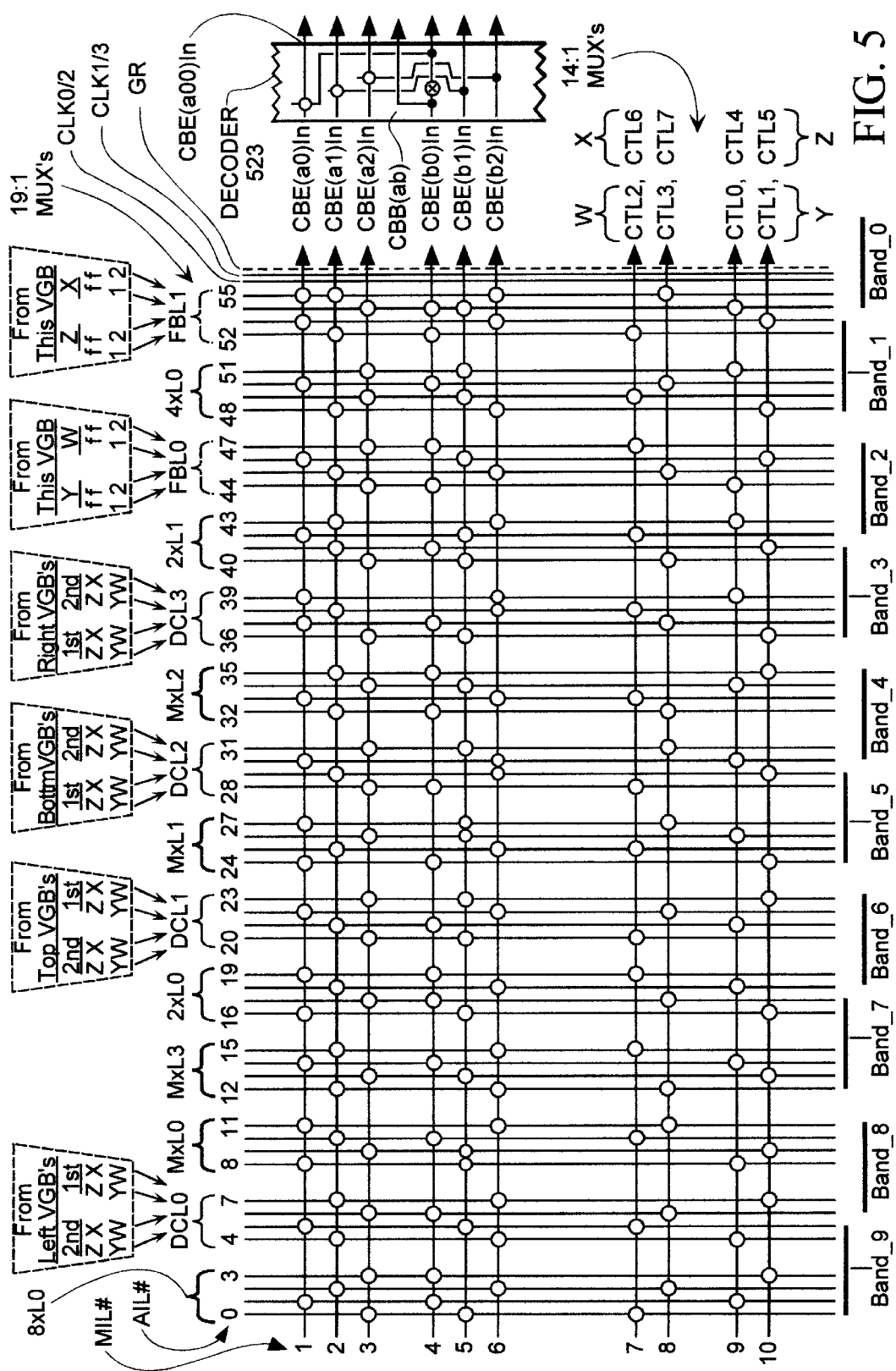
FIG. 5 shows the AIL line numbering system used herein and illustrates how the AIL's (adjacent interconnect lines) may be configurably coupled to input terminals (MIL's) of an adjacent Configurable Building Block (CBB)

In one embodiment, each general channel, such as the illustrated example in FIG. 2 of HIC 201 (the horizontal interconnect channel), contains the following resources: eight double-length (2×L) lines, four quad-length (4×L) lines, four octal-length (8×L) lines, sixteen full-length (Max L) lines, sixteen direct-connect (DC) lines, eight feedback (FB) lines and two dedicated clock (CLK) lines. Vertical ones of the general interconnect channels (VIC's) contain an additional global reset (GR) longline. This total of 58/59 lines is seen in FIG. 5. Not all of these lines are shown in FIG. 2. Note that each of the 2×L, 4×L, 8×L and MaxL line sets includes at least four lines of its own kind for carrying a corresponding nibble's worth of data or address or control signals.

In FIG. 2, core channels 1 through 18 are laid out as adjacent pairs of odd and even channels. Peripheral channels 0 and 19 run alone along side the IOB's (see FIG. 1). Although not shown in FIG. 2, it should be understood that each switch box has both horizontally-directed and vertically-directed ones of the respective 2×L, 4×L, and 8×L lines entering into that respective switch box. (See region 465 of FIG. 4.) A given switchbox (X×Sw) may be user-configured to continue a signal along to the next X×L line (e.g., 2×L line) of a same direction and/or to couple the signal to a corresponding same kind of X×L line of an orthogonal direction.

Group 202 represents the 2×L lines of HIC 201 and their corresponding switch boxes. For all of the 2×L lines, each such line spans the distance of essentially two adjacent VGB's (or one super-VGB). Most 2×L lines terminate at both ends into corresponding 2× switch boxes (2×Sw's). The terminating 2×Sw boxes are either both in even-numbered channels or both in odd-numbered channels. Exceptions occur at the periphery where either an odd or even-numbered channel is nonexistent. As seen in the illustrated embodiment 200, interconnections can be made via switch boxes from the 2×L lines of HIC 201 to any of the odd and even-numbered vertical interconnect channels (VIC's) 0–19.

With respect to the illustrated placement 214/216 of embedded memory columns 114/116, note in particular that 2×L line 223 and/or its like (other, similarly oriented 2×L lines) may be used to provide a short-haul, configurable connection from SVGB 253 (the one positioned to the right of VIC #6) to LMC 214. Similarly, line 224 and its like may be used to provide a short-haul connection from SVGB 254 (the one positioned to the right of VIC #8) to LMC 214. Line 225 and/or its like may be used to provide a short-haul connection from SVGB 255 to RMC 216. Line 226 and/or its like may be used to provide a short-haul connection from SVGB 256 to RMC 216. Such short-haul connections may be useful for quickly transmitting speed-critical signals such as address signals and/or data signals between a nearby SVGB (253–256) and the corresponding embedded memory column 114 or 116.

Group 204 represents the 4×L lines of HIC 201 and their corresponding switch boxes. Most 4×L lines each span the distance of essentially four, linearly-adjacent VGB's and terminate at both ends into corresponding 4× switch boxes (4×Sw's). The terminating 4×Sw boxes are either both in even-numbered channels or both in odd-numbered channels. As seen in the illustrated embodiment 200, interconnections can be made via switch boxes from the 4×L lines of HIC 201 to any of the odd and even-numbered vertical interconnect channels (VIC's) 0–19.

With respect to the illustrated placement 214/216 of embedded memory columns 114/116, note in particular that 4×L line 242 and/or its like (other, similarly oriented 4×L lines that can provide generally similar coupling) may be used to provide a medium-haul configurable connection between LMC 214 and either one or both of SVGB 252 and SVGB 253. Line 243 and/or its like may be used to provide a configurable connection of medium-length between LMC 214 and either one or both of SVGB's 253 and 254. Similarly, line 245 and/or its like may be used to provide medium-length coupling between RMC 216 and either one or both of SVGB's 255 and 256. Moreover, line 247 and/or its like may be used to configurably provide medium-haul interconnection between RMC 216 and either one or both of SVGB's 257 and 256. Such medium-haul interconnections may be useful for quickly propagating address signals and/or data signals in medium-speed applications.

Group 208 represents the 8×L lines of HIC 201 and their corresponding switch boxes. Most 8×L lines (7 out of 12) each spans the distance of essentially eight, linearly-adjacent VGB's. A fair number of other 8×L lines (5 out of 12) each spans distances less than that of eight, linearly-adjacent VGB's. Each 8×L line terminates at least one end into a corresponding 8× switch box (8×Sw). The terminating 8×Sw boxes are available in this embodiment only in the core odd-numbered channels (1, 3, 5, 7, 9, 11, 13, 15 and 17). Thus, in embodiment 200, interconnections can be made via switch boxes from the 8×L lines of HIC 201 to any of the nonperipheral, odd-numbered vertical interconnect channels (VIC's).

With respect to the illustrated placement 214/216 of embedded memory columns 114/116, note in particular that 8×L line 281 or its like may be used to provide even longer-haul, configurable connection from between LMC 214 and any one or more of SVGB's 251–254. (In one embodiment where 214 places to the left of VIC 7, 8×L line 280 provides configurable interconnection between LMC 214 and any one or more of SVGB's 250–253.) In the illustrated embodiment, 8×L line 282 may be used to provide 8×L coupling between any two or more of: LMC 214 and SVGB's 252–255. Line 283 may be used to provide 8×L coupling between any two or more of: IMC 214, RMC 216, and SVGB's 253–256. Line 284 may be used to provide 8×L coupling between any two or more of: LMC 214, RMC 216, and SVGB's 254–257. Line 285 may be used to provide S×L coupling between any two or more of: RMC 216 and SVGB's 255–258. Line 286 may be similarly used to provide 8×L coupling between any two or more of: RMC 216 and SVGB's 256–259.

In addition to providing configurable coupling between the intersecting memory channel 214 and/or 216, each of the corresponding 2×L, 4×L, and 8×L lines may be additionally used for conveying such signals between their respective switchboxes and corresponding components of the intersecting memory channel.

Referring briefly back to FIG. 1, it should be noted that the two central super columns 115 are ideally situated for generating address and control signals and broadcasting the same by way of short-haul connections (such shown in the embodiment of FIG. 18) to the adjacent memory columns 114 and 116. High-speed data may be similarly conveyed from the memory columns 114/116 to the SVGB's of central columns 115 (such shown in the embodiment of FIGS. 20–21).

Figure 3A:
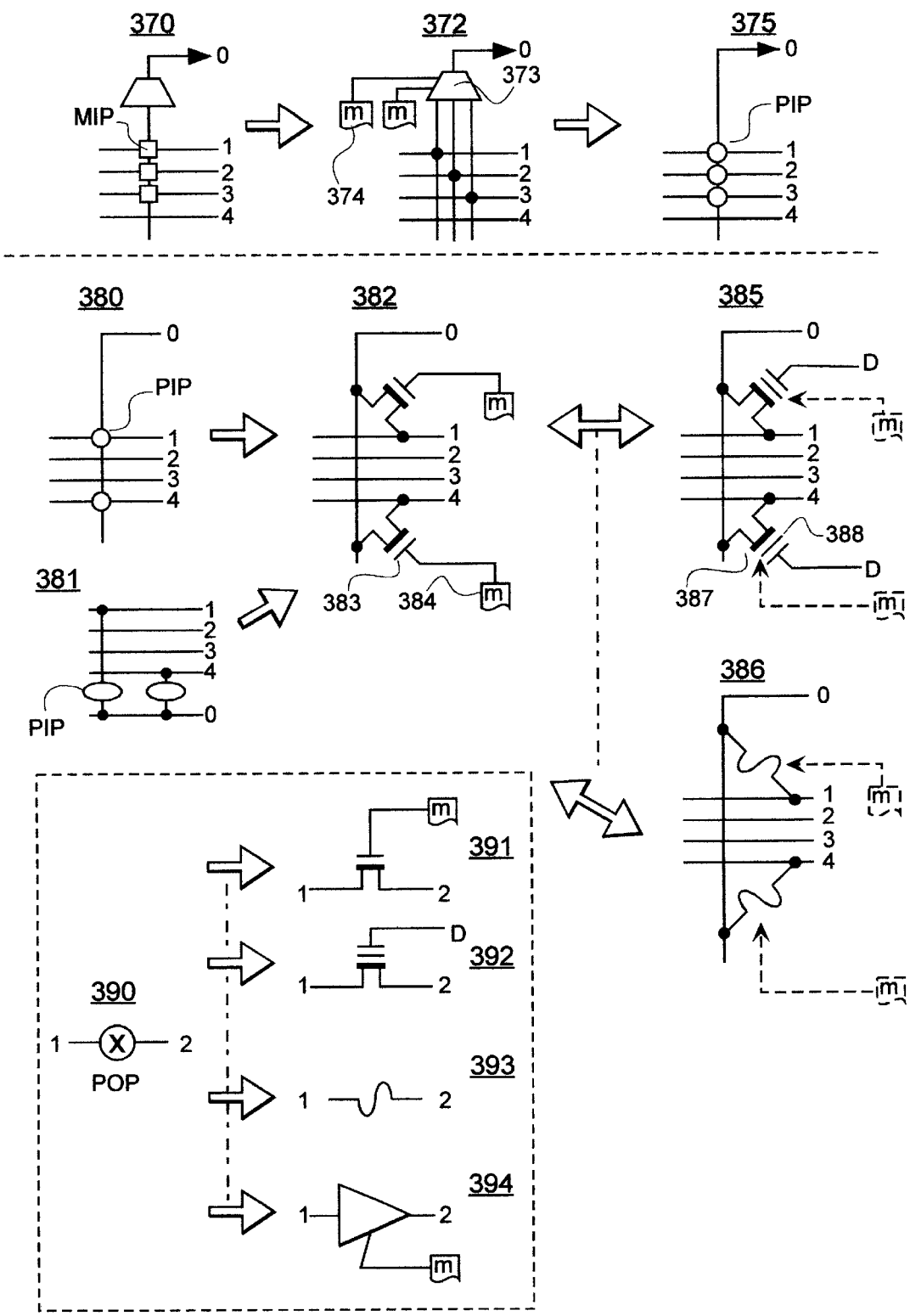
FIG. 3A provides a legend for symbols used within others of the drawings.

Before exploring more details of the architecture of FPGA device 100, it will be useful to define a legend for various symbols that may be used within the drawings. Such a legend is set forth in FIG. 3A. Unless otherwise stated, a single line going into a multiplexer symbol such as shown at 370 of FIG. 3A represents an input bus of one or more wires. Each open square box such as the MIP shown at 370 represents a point for user-configurable acquisition of a signal from the crossing line (e.g., 1, 2, 3). One implementation is shown at 372. Multiplexer 373 is controlled by configuration memory bits 374. The number of configuration memory bits 374 can vary depending on the number of MIP's (multiplexer input points) and whether selection decoding is carried out or not. One embodiment that has no selection decoding is shown at 375. Here, a PIP (programmable interconnect point) is placed at each MIP occupied intersection of output line 0 with crossing lines 1–4. Each of these PIP's is understood to have a single configuration memory bit controlling its state. In the active state the PIP creates a connection between the crossing lines.

In the inactive state the PIP leaves an open between the illustrated crossing lines. Each of the crossing lines remains continuous however in its respective direction (x or y).

PIP's (each of which is represented by a hollow circle covering a crossing of two continuous lines) may be implemented in a variety of manners as is well known in the art. Two PIP's are shown at 380 for programmably creating a coupling between line 0 and respective ones of lines 1 and 4. In one embodiment shown at 382, pass transistors such as MOSFET 383 have their source and drain coupled to the crossing lines while the transistor gate is controlled by a configuration memory bit such as 384. In an alternate embodiment shown at 385, nonvolatilely-programmable floating gate transistors such as 387 have their source and drain coupled to the crossing lines. The charge on the floating gate 388 represents the configuration memory bit. A dynamic signal D or a static turn-on voltage may be applied to the control gate as desired. In yet another alternate embodiment shown at 386, nonvolatilely-programmable fuses or anti-fuses have their ends connected to the crossing lines. Each of examples 382, 385 and 386 demonstrates a bidirectional PIP for which signal flow between the crossing lines (e.g., 0 and 1) can move in either direction. Where desirable, PIP's can also be implemented with unidirectional signal coupling means such as AND gates, tri-state drivers (see 394), and so forth.

An alternate symbol for a PIP is constituted by a hollow ellipse covering a strapping connection between two parallel lines such as shown at 381. The schematic of 381 is an alternate way of representing the circuit of 380.

Another symbol used herein is the POP such as shown at 390. POP stands for 'Programmable Opening Point' and it is represented by a hollow circle with an 'X' inside. Unless otherwise stated, each POP is understood to have a single configuration memory bit controlling its state. In the active state the POP creates an opening between the collinear lines (1,2) entering it. In the inactive state the POP leaves closed an implied connection between the collinear lines (1,2) entering it. Possible implementations of POP's are shown at 391 through 394. In EEPROM implementation 392, the control gate signal D will be typically tied to the channel-inducing state so that the charge on the floating gate controls the POP state exclusively. The tri-state driver implementation of 394 is unidirectional of course. One embodiment of 394 comprises a CMOS output stage driven front-end decoder logic that inverts the input signal prior to presenting it to the end-stage CMOS inverter. The front-end decoder logic drives each of the P- and N-channel devices of the end-stage inverter into a non-conductive mode when a high-impedance open state is dictated by the corresponding configuration memory bit. Many other alternatives will be apparent to those skilled in the art.

Figure 3B:
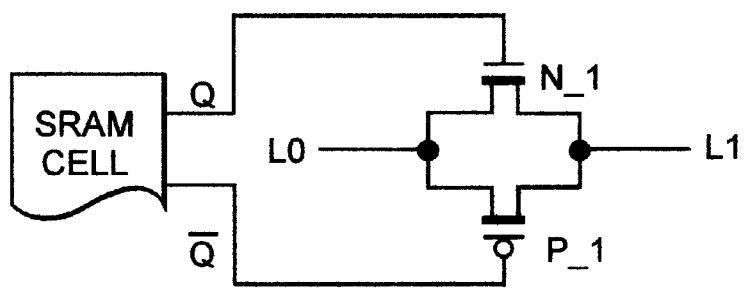
FIG. 3B is a schematic of a first transmission gate implementation of a PIP.

FIG. 3B shows yet another implementation of a bidirectional PIP at 395. Lines L0 and L1 are the programmably interconnectable entities. In this particular case, the controlling memory is an SRAM cell (Static Random Access Memory) having complementary Q and Q-bar outputs. The Q output drives the gate of an N-channel MOSFET, N_1 of the PIP. The Q-bar output drives the gate of an P-channel MOSFET, P_1 of the PIP. In general, transistor P_1 should be made with a larger channel width than that of transistor N_1 to compensate for the lower mobility of carriers in the P-channel of the P_1 device.

Figure 3C:
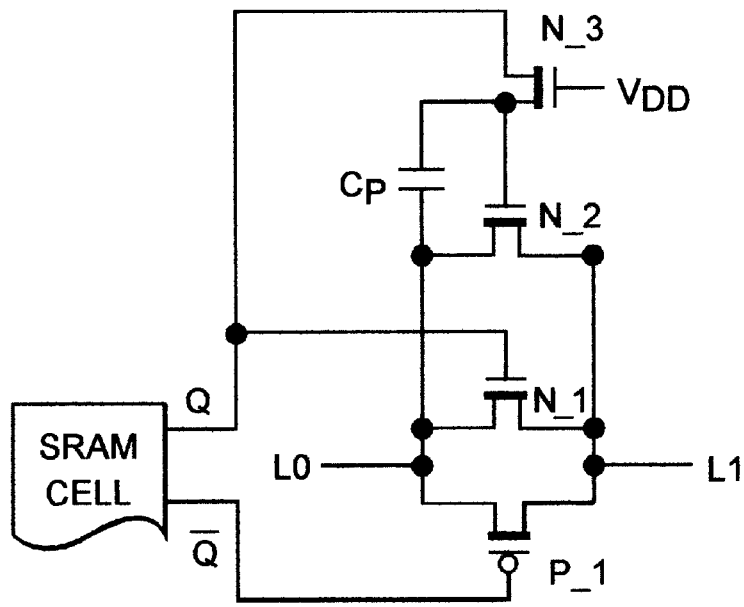
FIG. 3C is a schematic of a second transmission gate implementation of a PIP.

FIG. 3C shows yet another implementation of a bidirectional PIP at 398. Like reference symbols are used where appropriate for elements having like counterparts in FIG. 3B. The PIP shown at 398 may be referred to as a boot-strapped transmission gate. The parasitic gate-to-source capacitance $C_P$ of additional N-transistor N_2 may be used improve the conductivity of the PIP between L0 and L1 when Q is high (and Q-bar is at a lower voltage) and a low-to-high transition appears at L0 for transmission onto L1. Capacitance Cp couples the low-to-high transition to the gate of N_2. N_3 had pre-established a slightly below threshold voltage on the gate of N_2 by virtue of N_3 having its drain coupled to the high Q, the source of N_3 being connected to the gate of N_2, and the gate of N_3 being coupled to VDDI the high voltage rail of the device. The capacitively coupled low-to-high transition boosts the voltage of N_2's gate above threshold and turns N_2 on. This assists the normally slower P_1 device with passing the low-to-high transition from L0 to L1. As such P_1 can be made with a channel width that is comparatively smaller than the width used for the PMOS device in the PIP 395 of FIG. 3B.

Figure 3D:
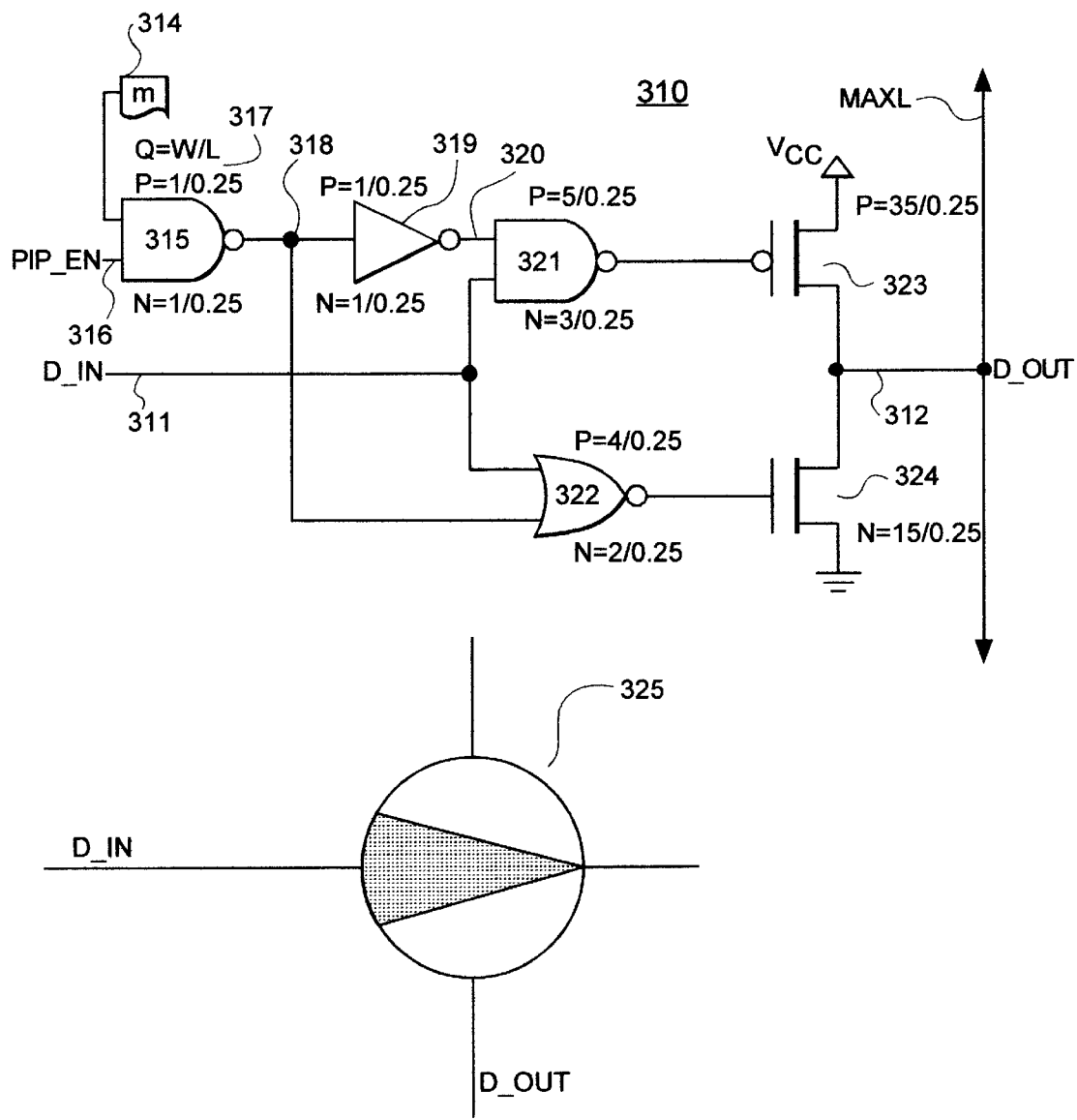
FIG. 3D is a schematic of a tristate driver implementation of a unidirectional PIP.

FIG. 3D shows an implementation of a unidirectional PIP at 310. This implementation 310 corresponds to a tri-state driver implementation such as shown at 394 of FIG. 3A. A corresponding icon for PIP 310 is shown at 325. Input data is applied at D_IN terminal 311. If the PIP is not in a high-impedance output mode, the corresponding data is seen on D_OUT terminal 312. The corresponding configuration memory bit for activating the unidirectional PIP 310 is shown at 314. Configuration memory cell 314 drives one input of NAND gate 315 while a second input 316 of NAND gate 315 receives a PIP enabling signal (PIP_EN). PIP_EN may be used to place a group of PIP's like 310 into a low-power, Hi-Z mode by lowering a common PIP_EN line to logic '0'.

NAND gate 315 has a CMOS configuration including a P-channel output transistor with a channel width versus length ratio of 1.0/0.25 and an N-channel transistor also with a width/length ratio of 1.0/0.25. The basic formula for such characterization of a given transistor Q (be it P-channel or N-channel type) is shown at 317 as Q=W/L (width over length each in microns). A similar notation is used for other devices of FIG. 3D.

The output 318 of NAND gate 315 drives a first input of NOR gate 322. The same output 318 is also coupled to an input 320 of a second NAND gate 321 by way of inverter 319. The D_IN signal (311) is coupled to respective second inputs of NAND gate 321 and NOR gate 322.

Unidirectional PIP implementation 310 has a CMOS driver comprised of P-channel transistor 323 (W/L=35/0.025) and N-channel transistor 324 (W/L=15/0.025) forming its output stage. NAND gate 321 drives the gate of P-transistor 323. NOR gate 322 drives the gate of N-transistor 324.

If either of configuration memory bit 314 or PIP_EN line 316 is low (logic '0'), the output stage 323/324 goes into a high-impedance output mode. This is so because the resulting logic I1l at node 318 forces the output of NOR gate 322 low, thereby placing output transistor 324 in a non-conductive state. Simultaneously, the logic '0' at node 320 forces the output of NAND gate 321 high to thereby place P-transistor 323 in a nonconductive mode.

When both of 314 and 316 are at logic '1', data transitions flow from D IN line 311 to D OUT line 312 as follows. A high-to-low transition (otherwise known as a falling edge) on D_IN line 311 activates the P-transistor of NOR gate 322 so as to quickly charge the gate of N-transistor 324 and switch transistor 324 into a conductive state, thereby pulling line 312 low. At the same time, the relatively larger P-transistor of NAND gate 321 (1.25 times wider than the P of 322) discharges the relatively wider gate of P-transistor 323 (2.67 times wider than that of 324) so as to turn P transistor 323 off.

When a low-to-high transition (otherwise known as a rising edge) occurs on D_IN line 311, a relatively large N-transistor in NAND gate 321 charges the gate of P-transistor 323 so as to quickly turn transistor 323 on, and thereby drive line 312 high. At the same time, a slightly smaller N-transistor within NOR gate 322 (0.50 times as wide) discharges the narrower gate of the N-output transistor 324 (0.43 times as wide) so as to place transistor 324 in a non-conductive state.

Figure 3E:
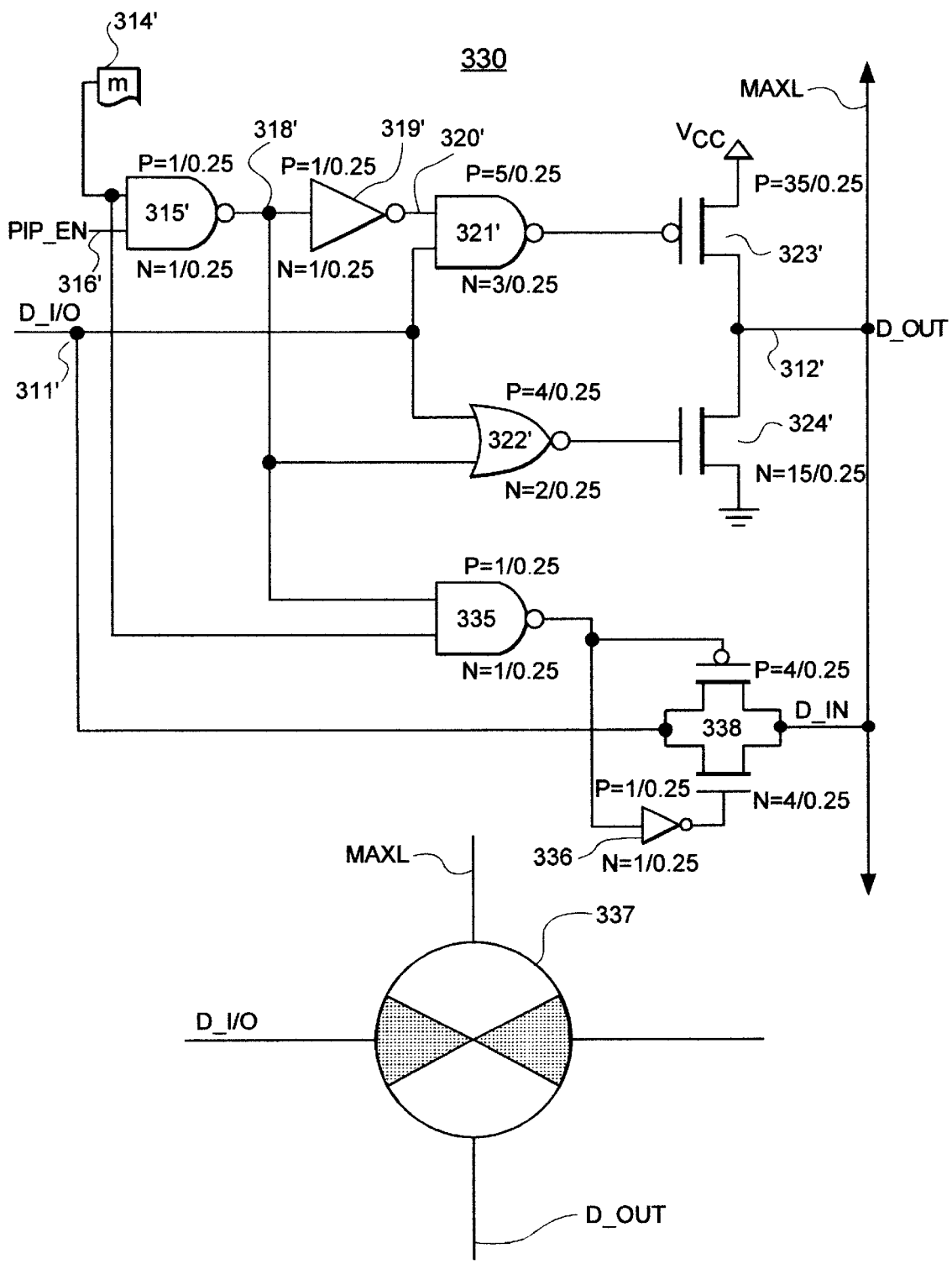
FIG. 3E is a schematic of a tristate driver implementation of a bidirectional PIP.

FIG. 3E shows an implementation of a bidirectional PIP at 330. This design includes elements like those of FIG. 3D that share same reference numerals but are marked with primes. These like elements do not have to be described again. In addition to the like elements, NAND gate 335, inverter 336, and transmission gate 338 are further provided in circuit 330 for establishing a data input path from the adjacent interconnect line (e.g., MaxL) to the D_I/O node 311'. A logic '1' at node 318' (due to PIP_EN 316' going low) in combination with activation of configuration memory 314' drives the output of NAND gate 335 low. This low output then switches the illustrated transmission gate 338 into the conductive mode. Conversely, a logic '0' at node 318' due to PIP_EN 316' going high in combination with activation of configuration memory 314' drives the output of NAND gate 335 high and places transmission gate 338 into the nonconductive mode. An icon for representing the bidirectional tri-stateable PIP 330 is shown at 337.

Figure 3F:
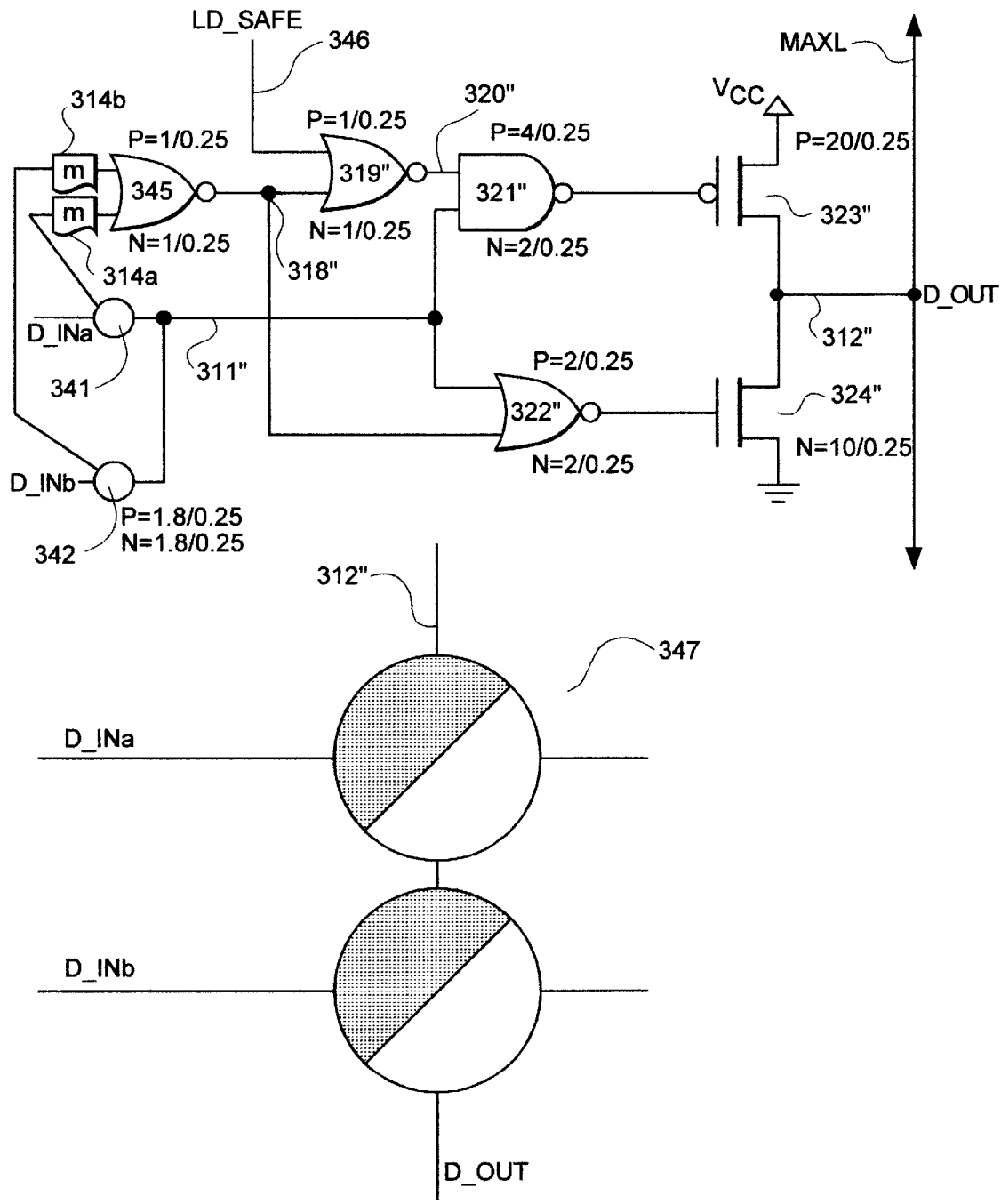
FIG. 3F is a schematic of a compact tristate driver implementation for plural unidirectional PIP's.

FIG. 3F shows another implementation of unidirectional PIP's at 340. This design includes elements like those of FIG. 3D that share same reference numerals and are marked with double-primes. Most of these like-referenced elements do not have to be described again. One exception is at 319" where a NOR gate replaces the original inverter of FIG. 3D. Input 346 of this NOR gate 319" receives a load-safe (LD_SAFE) signal which should be raised to logic '1' during loading of the configuration memory. A corresponding logic '0' is forced onto line 320" during such loading of the configuration memory, and this in turn causes NAND gate 321" to turn off P transistor 323" so as to prevent inadvertent current sourcing during loading of the configuration memory.

In addition to the like, double-prime referenced elements, circuit 340 includes additional NOR gate 345, first and second PIP's 341 and 342, and their respective input lines, D_INa and D_INb. Respective configuration memory cells 314a and 314b of the first and second PIP's 341 and 342 are also shown. The active or nonactive logic states of configuration memory cells 314a and 314b are coupled to respective first and second inputs of NOR gate 345. The respective data outputs of the first and second PIP's 341 and 342 are joined onto line 311". If both of the first and second PIP's 341 and 342 are inactive (that is, both of memory cells 314a and 314b are configured to the logic '0' state), NOR gate 345 drives node 318" high (to logic '1'). This deactivates the line-driving transistors 323" and 324" and thereby saves power. If either of the first and second PIP's 341 and 342 is active, NOR gate 345 drives node 318" low so as to permit usage of the line-driving transistors 323" and 324".

Each of the first and second PIP's 341 and 342 of FIG. 3F includes a transmission gate employing P and N transistors (see 338 of FIG. 3E) that are substantially smaller than respective line-driving transistors 323" and 324". In one embodiment, they are at least five times smaller. The P and N transistors of NOR gate 345 are respectively at least ten times smaller than line-driving transistors 323" and 324". Space is saved by using the dual input configuration of circuit 340 in place of two duplications of elements 321", 322", 323" and 324" for implementing unidirectional PIP's.

An icon for representing the dual-input, unidirectional tristateable PIP circuit 340 is shown at 347 as two, half-shaded circles lying on the shared output line D_OUT (312"). It is of course within the contemplation of the invention to allow for sharing of elements 321", 322", 323" and 324" by more than two input lines, in which case the number of PIP's such as 341 and 342 would be increased and the number of inputs to NOR gate 345 would be correspondingly increased.

Referring now to FIG. 4, this figure provides a mid-scopic view of some components within an exemplary matrix tile 400 that lays adjacent to embedded memory column, RMC 416. Of course, other implementations are possible for the more macroscopic view of FIG. 1.

The mid-scopic view of FIG. 4 shows four VGB's brought tightly together in mirror opposition to one another. The four, so-wedged together VGB's are respectively designated as (0,0), (0,1), (1,0) and (1,1). The four VGB's are also respectively and alternatively designated herein as VGB_A, VGB_B, VGB_C, and VGB_D.

Reference number 430 points to VGB_A which is located at relative VGB row and VGB column position (0,0). Some VGB internal structures such as CBB's Y, W, Z, and X are visible in the mid-scopic view of FIG. 4. An example of a Configurable Building Block (CBB) is indicated by 410. As seen, the CBB's 410 of each VGB 430 are arranged in an L-shaped organization and placed near adjacent interconnect lines. Further VGB internal structures such as each VGB's common controls developing (Ctrl) section, each VGB's wide-gating supporting section, each VGB's carry-chaining (Fast Carry) section, and each VGB's coupling to a shared circuit 450 of a corresponding super-structure (super-VGB) are also visible in the mid-scopic view of FIG. 4. VGB local feedback buses such as the L-shaped structure shown at 435 in FIG. 4 allow for high-speed transmission from one CBB to a next within a same VGB, of result signals produced by each CBB.

The mid-scopic view of FIG. 4 additionally shows four interconnect channels surrounding VGB's (0,0) through (1,1). The top and bottom, horizontally extending, interconnect channels (HIC's) are respectively identified as 451 and 452. The left and right, vertically extending, interconnect channels (VIC's) are respectively identified as 461 and 462.

Two other interconnect channels that belong to other tiles are partially shown at 453 (HIC2) and 463 (VIC2) so as to better illuminate the contents of switch boxes area 465. Switch boxes area 465 contains an assortment of 2xL switch boxes, 4x switch boxes and 8x switch boxes, which may be provided in accordance with FIG. 2.

In addition, a memory-control multiplexer area 467 is provided along each HIC as shown for configurably coupling control signals from the horizontal bus (e.g., HIC 452) to special vertical interconnect channel (SVIC) 466. The illustrated placement of multiplexer area 467 to the right of the switch boxes (SwBoxes) of VIC's 462 and 463 is just one possibility. Multiplexer area 467 may be alternatively placed between or to the left of the respective switch boxes of VIC's 462 and 463.

In one embodiment (see FIG. 8), SVIC 466 has sixteen, special maximum length lines (16 SMaxL lines), thirty-two, special quad length lines (32 S4×L lines), and four special clock lines (SCLK0–3). SVIC 466 carries and couples control signals to respective control input buses such as 471, 481 of corresponding memory blocks such as 470, 480.

A memory-I/O multiplexer area 468 is further provided along each HIC for configurably coupling memory data signals from and to the horizontal bus (e.g., HIC 452) by way of data I/O buses such as 472, 482 of corresponding memory blocks such as 470, 480. Again, the illustrated placement of multiplexer area 468 to the right of the switch boxes (SwBoxes) of VIC's 462 and 463 is just one possibility. Multiplexer area 468 may be alternatively placed between or to the left of the respective switch boxes of VIC's 462 and 463.

Memory control multiplexer area 477 and memory I/O multiplexer area 478 are the counterparts for the upper HIC 451 of areas 467 and 468 of lower HIC 452. Although not specifically shown, it is understood that the counterpart, left memory channel (LMC) is preferably arranged in mirror symmetry to the RMC 416 so as to border the left side of its corresponding matrix tile.

As seen broadly in FIG. 4, the group of four VGB's, (0,0) through (1,1) are organized in mirror image relationship to one another relative to corresponding vertical and horizontal centerlines (not shown) of the group and even to some extent relative to diagonals (not shown) of the same group. Vertical and horizontal interconnect channels (VIC's and HIC's) do not cut through this mirror-wise opposed congregation of VGB's.

As such, the VGB's may be wedged-together tightly.

Similarly, each pair of embedded memory blocks (e.g., 470 and 480), and their respective memory-control multiplexer areas (477 and 467), and their respective memory-I/O multiplexer areas (478 and 468) are organized in mirror image relationship to one another as shown. Horizontal interconnect channels (HIC's) do not cut through this mirror-wise opposed congregation of embedded memory constructs. As such, the respective embedded memory constructs of blocks MR×0 (in an even row, 470 being an example) and MR×1 (in an odd row, 480 being an example) may be wedged-together tightly. A compact layout may be thereby achieved.

With respect to mirror symmetry among variable grain blocks, VGB (0,1) may be generally formed by flipping a copy of VGB (0,0) horizontally. VGB (1,1) may be similarly formed by flipping a copy of VGB (0,1) vertically. VGB (1,0) may be formed by flipping a copy of VGB (1,1) horizontally, or alternatively, by flipping a copy of VGB (0,0) vertically. The mirror-wise symmetrical packing-together of the four VGB's (0,0 through 1,1) is referred to herein as a 'Super Variable Grain Block' or a super-VGB 440.

In a preferred embodiment, the mirror symmetry about the diagonals of the super-VGB is not perfect. For example, there is a Fast Carry section in each VGB that allows VGB's to be chained together to form multi-nibble adders, subtractors or counters. (A nibble is a group of 4 data bits. A byte is two nibbles or 8 data bits. A counter generally stores and feeds back its result so as to provide cumulative addition or subtraction.) The propagation of rippled-through carry bits for these Fast Carry sections is not mirror wise symmetrical about the diagonals of each super-VGB 440. Instead it is generally unidirectional along columns of VGB's. Thus, CBB's X, Z, W, and Y are not interchangeable for all purposes.

The unidirectional propagation of carry bits is indicated for example by special direct connect lines 421a, 421b and 421c which propagate carry bits upwardly through the Fast Carry portions of VGB's (0,0) and (1,0). The unidirectional propagation is further indicated by special direct connect lines 422a, 422b and 422c which propagate carry bits upwardly through the Fast Carry portions of VGB's (0,1) and (1,1).

Such unidirectional ripple-through of carry bits may continue across the entire FPGA device so as to allow addition, subtraction or count up/down results to form in bit aligned fashion along respective columns of the FPGA device. Bit aligned results from a first set of one or more columns can be submitted to other columns (or even resubmitted to one or more columns of the first set) for further bit aligned processing. In one embodiment, the X CBB generally produces the relatively least significant bit (LSB) of result data within the corresponding VGB, the Z CBB generally produces the relatively next-more significant bit, the W CBB generally produces the relatively next-more significant bit, and the Y CBB generally produces the relatively most significant bit (MSB) of result data within the corresponding VGB.

In an alternate embodiment, propagation of rippled-through carry bits may be zig-zagged first up and then down through successive columns of VGB's. In such an alternate zig-zagged design, the significance of bits for adder/subtractor circuits would depend on whether the bits are being produced in an odd or even column of VGB's.

The local feedback lines 435 of each VGB may be used to feedback its registered adder outputs to one of the adder inputs and thereby define a counter. The counter outputs can be coupled by way of the adjacent HIC to either an intersecting SVIC (e.g., 466, so as to provide address sequencing) or to an adjacent data port (e.g., 472, 482, so as to store counter results in the embedded memory at designated time points).

FIGS. 5–7D are provided to facilitate the understanding of the coupling that is provided by way of the HIC's (e.g., 451 and 452) between the embedded memory blocks (470) and corresponding inputs and outputs of the super-VGB's (440). It is helpful to study the I/O structure of selected components within each super-VGB to some extent so that the data and control input/output interplay between the embedded memory columns 114/116 and the SVGB's can be appreciated. At the same time, it is to be understood that the description given here for the SVGB's is less extensive than that given in the above-cited Ser. No. 08/948,306. The description given here for the SVGB's is intended to provide no more than a basic understanding of the cooperative structuring of the embedded memory blocks (470/480) and corresponding inputs and outputs of the super-VGB's (440).

Each of the X, Z, W, and Y Configurable Building Blocks has six 19:1, input-terms acquiring multiplexers for acquiring a corresponding six input term signals of the CBB. The CBB can process the acquired signals in accordance with user-configuration instructions to produce result signals.

Each of the X, Z, W, and Y CBB's further has a result-signal storing register (not shown) and a 2/4/8×L drive amplifier for configurably outputting either a register-stored version of a CBB result signal or a nonstored (unregistered) result signal of the CBB onto adjacent ones of the 2×L lines, 4×L lines and 8×L lines. Control signals may be used by the CBB for controlling its internal, result-signal storing register (not shown). These control signals are acquired by way of respective, controls input multiplexers (14:1 Ctrl) of the respective CBB's X,Z,W,Y. There are two such controls input multiplexers (14:1 Ctrl) provided for each CBB.

In addition to its 2/4/8×L drive amplifier (not shown) each of the X, Z, W, and Y CBB's further has a dedicated direct-connect (DC) drive amplifier (not shown) for configurably outputting either a register-stored version of a CBB result signal or an nonstored (unregistered) result signal of the CBB onto adjacent ones of so-called, direct connect lines. Moreover, each CBB has means for outputting its registered or unregistered result-signals onto feedback lines (FBL's) of the VGB. The DCL's (direct connect lines) and FBL's are not immediately pertinent to operation of the embedded memory blocks (470) but are mentioned here for better understanding of next-described FIG. 5.

FIG. 5 illustrates a partial-populating scheme for the input-term and control-signal acquiring multiplexers of the respective X, Z, W, and Y CBB's of one embodiment in accordance with the invention. The adjacent interconnect lines (AIL's) are respectively numbered as #0 through #55. There are two dedicated clock (CLK) lines in each interconnect channel and one additional, global reset (GR) line in each VIC that are not included in this count. In one embodiment, AIL's 0–55 represent interconnect lines in the most immediately adjacent channel for each of CBB's X, Z, W, and Y.

In an alternate embodiment, AIL's 0–55 represent interconnect lines in the most immediately adjacent channel for each of CBB's X and Y while for the other CBB's, Z and W, the AIL's 0–55 of FIG. 5 represent the interconnect lines of the next adjacent channel. The exception is at the periphery of the matrix (see FIG. 1) where there is no next adjacent channel, in which case AIL's 0–55 represent interconnect lines in the most immediately adjacent channel also for CBB's Z and W. This alternate configuration allows each VGB to acquire input term signals and control signals from both the even-numbered and odd-numbered interconnect channels that surround it. It is of course within the contemplation of the invention to have other configurations, such as for example wherein the CBB's that reach the most immediately adjacent channel are X and W rather than X and Y; and such as wherein the CBB's that reach the next adjacent channel are X and Y rather than Z and W.

Multiplexer input lines (MIL's) are numbered in FIG. 5 as 1 through 10. MIL's 1–3 correspond to the three 19:1 input term acquiring multiplexers of a first LUT (e.g., 'a') in each of the X, Z, W, Y CBB's. MIL's 4–6 correspond to the three 19:1 input term acquiring multiplexers of a second LUT (e.g., 'b') in each of the X, Z, W, Y CBB's. MIL's 7–8 correspond to the two 14:1 control signal acquiring multiplexers of each of the W and X CBB's. MIL's 9–10 correspond to the two 14:1 control signal acquiring multiplexers of each of the Y and Z CBB's.

The illustrated partially-populated distribution of PIP's over the intersections of AILS's 0–55 and MIL's 1–10 should be self-explanatory in view of the legend shown in FIG. 3A. They provide respective means for acquiring input logic bits (be they input term or control bits) into the corresponding CBB.

AIL's 0–3 represent the four 8×L lines in each general interconnect channel (VIC or HIC). AIL's 4–7 represent a first group (DCL0) of four of the 16 direct connect lines in each such interconnect channel. The remaining DCL's are represented by the 20–23 (DCL1), 28–31 (DCL2) and 36–39 (DCL3) sets of AIL's. AIL's 8–11 represent a first group (M×L0) of four of the 16 Ma×L lines in each general interconnect channel. The remaining M×L's are represented by the 24–27 (M×L1), 32–35 (M×L2) and 12–15 (M×L3) sets of AIL's.

AIL's 16–19 represent a first group (2×L0) of four of the 8 2×L lines in each interconnect channel. The other four 2×L lines are represented by the 40–43 (2×L1) group. AIL's 44–47 represent a first group (FBL0) of four of the 8 feedback lines in each interconnect channel. The other four feedback lines are represented by the 52–55 (FBL1) group. AIL's 48–51 represent the four 4×L lines in each interconnect channel.

The VIC's further include clock longlines CLK0 and CLK1 as well as global reset line GR. The HIC's further include CLK2 and CLK3 but not GR. The globally-distributed signals of CLK0–CLK3 further appear on the special clock longlines SCLK0–SCLK3 of the special vertical channels (SVIC's, see 861 of FIG. 8), as will be explained later. The shared control section of each VGB 430 acquires clock and reset signals from the adjacent control lines CLK0–CLK3 and GR and distributes derived control signals for the VGB from these.

Signal sources for the direct connect lines and the feedback lines are indicated respectively above corresponding AIL groups. In group DCL0 for example, AIL 7 is driven by either the X or the W DC driver of the neighboring VGB that is immediately to the left of the current VGB. AIL 6 is driven by either the Z or the Y DC driver of the neighboring VGB that is immediately to the left of the current VGB. AIL 5 is driven by either the X or the W DC driver of the next, not immediately-neighboring VGB that is to the left of the current VGB. AIL 4 is driven by either the Z or the Y DC driver of the next-adjacent VGB that is to the left of the current VGB.

Each of MIL's 0–6 is loaded by essentially the same number of 19 PIP's that form the corresponding 19:1 multiplexer. As such, there is roughly a same amount of signal propagation delay in going through each such multiplexer to the corresponding LUT. There is some additional delay or loading from PIP's and POP's that form the intervening decoder layer between the input term acquiring multiplexers and the LUT's of the respective CBB. A representative part of that decoder layer is shown at 523.

Note that for each of AIL's 0–55 there are at least two PIP connections to two different MIL's, one of which is placed in the MIL# 1–3 set and another of which is in general, differently placed in the MIL# 4–6 set. In other words, are at least two possible MIL's which can be used to acquire an input term signal moving along a given AIL and feed the acquired signal to one or the other of two possible LUT's ('a' or 'b'). Thus if one of the two 19:1 multiplexers that can couple to a given AIL is already consumed, or the corresponding LUT is already consumed, the FPGA configuring software has the possibility of alternatively using the other multiplexer and/or LUT for implementing a circuit chunk that requires a particular input term signal moving along the given AIL.

Each of AIL's 54 and 55 have at least three PIP connections to a respective three different MIL's. Feedback signals from the f1 and f2 lines of the X CBB output therefore have 3 possible ways of being transmitted into the respective MIL 1–6 inputs of any one of the X, Z, W, and Y Configurable Building Blocks of the same VGB. These MIL 1–6 inputs are alternatively named as CBE(a0)In, CBE(a1)In, CBE(a2) In, CBE(b0)In, CBE(b1)In, and CBE(b2)in FIG. 5. Note that CBE(b0)In is different from the others in that a POP (Programmable Opening Point) is provided for it in decoder section 523. CBB(ab) represents an intercepted signal that may be used for compounding or folding together the 'a' and 'b' parts of the corresponding CBB. Such compounding is beyond the focus of the present disclosure and will not be described further.

Note also that in the case where the PIP's of the signal-acquiring multiplexers of FIG. 5 are of the bidirectional type (e.g., FIGS. 3B or 3C), simultaneous activation of two or more PIP's on a same AIL (during FPGA configuration time), creates a bidirectional strapping interconnection between the corresponding MIL's of those PIP's. Such a use of the PIP's of the signal-acquiring multiplexers of FIG. 5 provides a 'through-the-AIL strapping' function which is again beyond the focus of the present disclosure and will not be described further.

The basic message of FIG. 5 as presented here is to identify the AIL numbers of different kinds of interconnect lines and to show how such AIL's (adjacent interconnect lines) can supply data and/or controls to each CBB.

Figure 6:
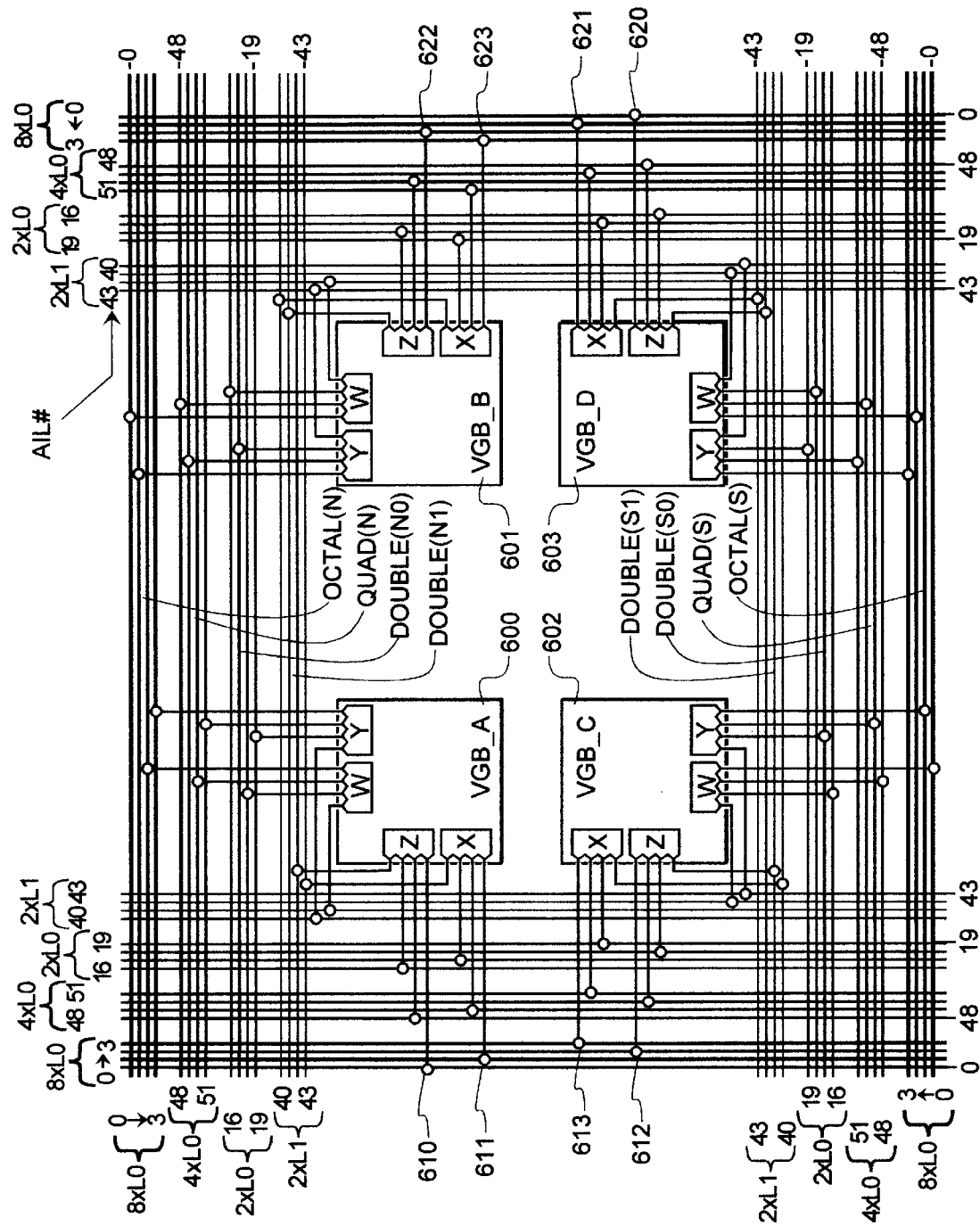
FIG. 6 illustrates how the 2/4/8×L output lines of respective CBB's (X, Z. W, Y) within a SVGB are configurably couplable to surrounding interconnect channels.

FIG. 6 looks at the 2/4/8×L driver output connections for each super-VGB. In FIG. 6, each CBB has four respective output lines for driving nearby 2×L interconnect lines, 4×L interconnect lines and 8×L interconnect lines that surround the encompassing super-VGB. The four respective output lines of each CBB may all come form one internal 2/4/8×L line driving amplifier or from different drive amplifiers.

The layout of FIG. 6 is essentially symmetrical diagonally as well as horizontally and vertically. The octal length (8×L) lines are positioned in this embodiment further away from the VGB's 600–603 than are the 4×L and 2×L lines of the respective vertical and horizontal interconnect channels. AIL line 0 of each of the illustrated VIC's and HIC's is at the outer periphery and AIL numbers run generally from low to high as one moves inwardly. The quad length (4×L) lines are positioned in this embodiment further away from the VGB's than are the double length (2×L) lines of the respective VIC's and HIC's. It is within the contemplation of the invention to alternatively position the octal length (8×L) lines closest to VGB's 600–603, the quad length (4×L) lines next closest, and the double length (2×L) lines of the respective VIC's and HIC's furthest away from surrounded VGB's 600–603. The same pattern of course repeats in each super-VGB of the FPGA core matrix.

VGB_A (600) can couple to same AIL's in the northern octals (Octals(N)) as can VGB_D (603) in the southern octals (Octals(S)). A similar, diagonal symmetry relation exists between VGB_B (601) and VGB_C (602). Symmetry for the eastern and western octal connections is indicated by PIP's 610, 611, 613 and 612 moving southwardly along the west side of the tile and by counterposed PIP's 620, 621, 623 and 622 moving northwardly along the east side.

Note that the non-adjacent 2×L connections of this embodiment (e.g., the PIP connection of the Y CBB in 1600 to vertical AIL #40) allow for coupling of a full nibble of data from any VGB to the 2×L lines in either or both of the adjacent VIC's and HIC's. Thus, bus-oriented operation may be efficiently supported by the L-organized CBB's of each VGB in either the horizontal or vertical direction. Each CBB of this embodiment has essentially equivalent access to output result signals to immediately adjacent 2×L, 4×L and 8×L lines as well as to nonadjacent 2×L lines (in the AIL 40–43 sets). Each pair of VGB's of a same row or column can output 4 independent result signals to a corresponding 4 lines in any one of the following 4-line buses: (a) the immediately adjacent 2×L0 group (AIL's 16–19), (b) the immediately adjacent 4×L group (AIL's 48–51), (c) the immediately adjacent 8×L group (AIL's 0–3), and (d) the not immediately adjacent 2×L1 group (AIL's 40–43).

Aside from having dedicated 2/4/8×L drivers in each CBB, there are shared big drivers (tristateable MaxL drivers) at the center of each super-VGB for driving the MaxL lines of the surrounding horizontal and vertical interconnect channels (HIC's and VIC's). Referring to a FIG. 7A, a scheme for connecting the shared big drivers (MaxL drivers) to the adjacent MaxL interconnect lines is shown for the case of super-VGB (0,0). This super-VGB (also shown as 101 in FIG. 1) is surrounded by horizontal interconnect channels (HIC's) 0 and 1 and by vertical interconnect channels (VIC's) 0 and 1. The encompassed VGB's are enumerated as A=(0,0), B=(0,1), C=(1,0) and D=(1,1). A shared big logic portion of the SVGB is shown at 750. Shared big logic portion receives input/control signals 700, 701, 710, 711 and responsively sends corresponding data and control signals to sixteen, three-state (tristate) longline driving amplifiers that are distributed symmetrically relative to the north, east, south and west sides of the SVGB. The sixteen, tristate drivers are respectfully denoted as: N1 through N4, E1 through E4, S1 through S4, and W1 through W4. Angled line 700 represents the supplying of generically-identified signals: DyOE, Yz, Wz, Xz, Zz, FTY (1,2) and FTX(1,2) to block 750 from VGB_A. DyOE is a dynamic output enable control. Yz, Wz, Xz, Zz are respective result signals from the Y, W, X, Z CBB's of VGB_A. FTY(1,2) and FTX(1,2) are feedthrough signals passed respectively through the Y and X CBB's of VGB_A. Angled lines 701, 710 and 711 similarly and respectively represent the supplying of the above generically-identified signals to block 750 from VGB_B, VGB_C and VGB_D.

Note that the tristate (3-state) nature of the shared big drivers means that signals may be output in time multiplexed fashion onto the MaxL lines at respective time slots from respective, bus-mastering ones of the SVGB's along a given interconnect channel.

The adjacent MaxL interconnect lines are subdivided in each HIC or VIC into four groups of 4 MaxL lines each. These groups are respectively named MaxL0, MaxL1, MaxL2 and MaxL3 as one moves radially out from the core of the super-VGB. MaxL drivers N1 through N4 respectively connect to the closest to the core, lines of respective groups MaxL0, MaxL1, MaxL2 and MaxL3 of the adjacent north HIC.

MaxL drivers E1 through E4 similarly and respectively connect to the closest to the core ones of MaxL lines in respective groups MaxL0–MaxL3 of the adjacent east VIC. MaxL drivers S1 through S4 similarly and respectively connect to the closest to the core ones of MaxL lines in respective groups MaxL0–MaxL3 of the adjacent south HIC. MaxL drivers W1 through W4 similarly and respectively connect to the closest to the core ones of MaxL lines in respective groups MaxL0–MaxL3 of the adjacent west vertical interconnect channel (VIC(0)).

As one steps right to a next super-VGB (not shown), the N1–N4 connections move up by one line in each of the respective groups MaxL0–MaxL3, until the top most line is reached in each group, and then the connections wrap around to the bottom most line for the next super-VGB to the right and the scheme repeats.

A similarly changing pattern applies for the southern drives. As one steps right to a next super-VGB (not shown), the S1–S4 connections move down by one line in each of the respective groups MaxL0–MaxL3, until the bottom most line is reached in each group, and then the connections wrap around to the top most line for the next super-VGB to the right and the scheme repeats.

A similarly changing pattern applies for the eastern and western drives. As one steps down to a next super-VGB (not shown), the E1-E4 and W1-W4 connections move outwardly by one line in each of the respective groups MaxL0–MaxL3, until the outer most line is reached in each group, and then the connections wrap around to the inner most line of each group for the next super-VGB down and the scheme repeats.

Figure 7A:
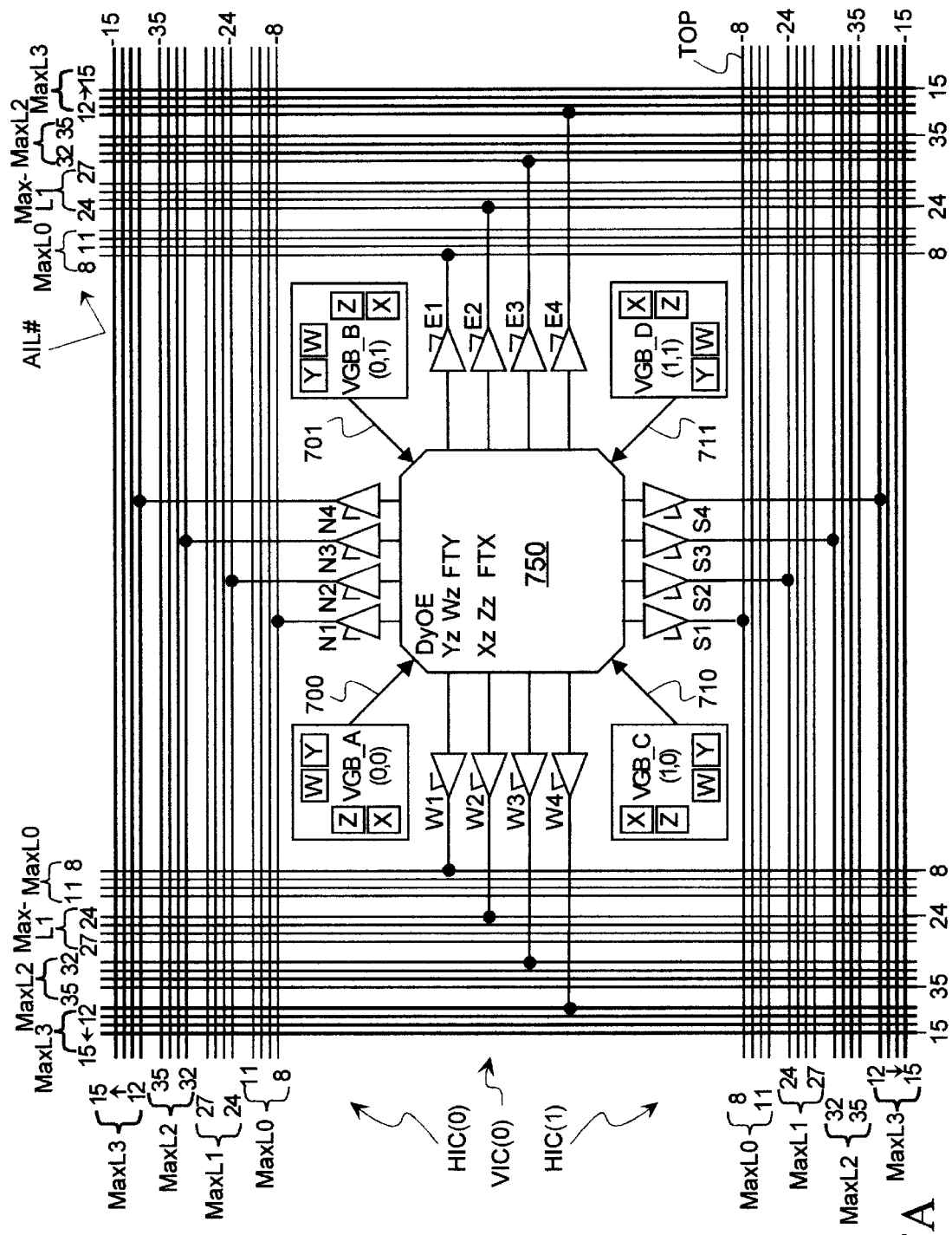
FIGS. 7A–7D illustrate how the MaxL line drivers of respective SVGB's are coupled to surrounding inter-connect channels.
Figure 7B:
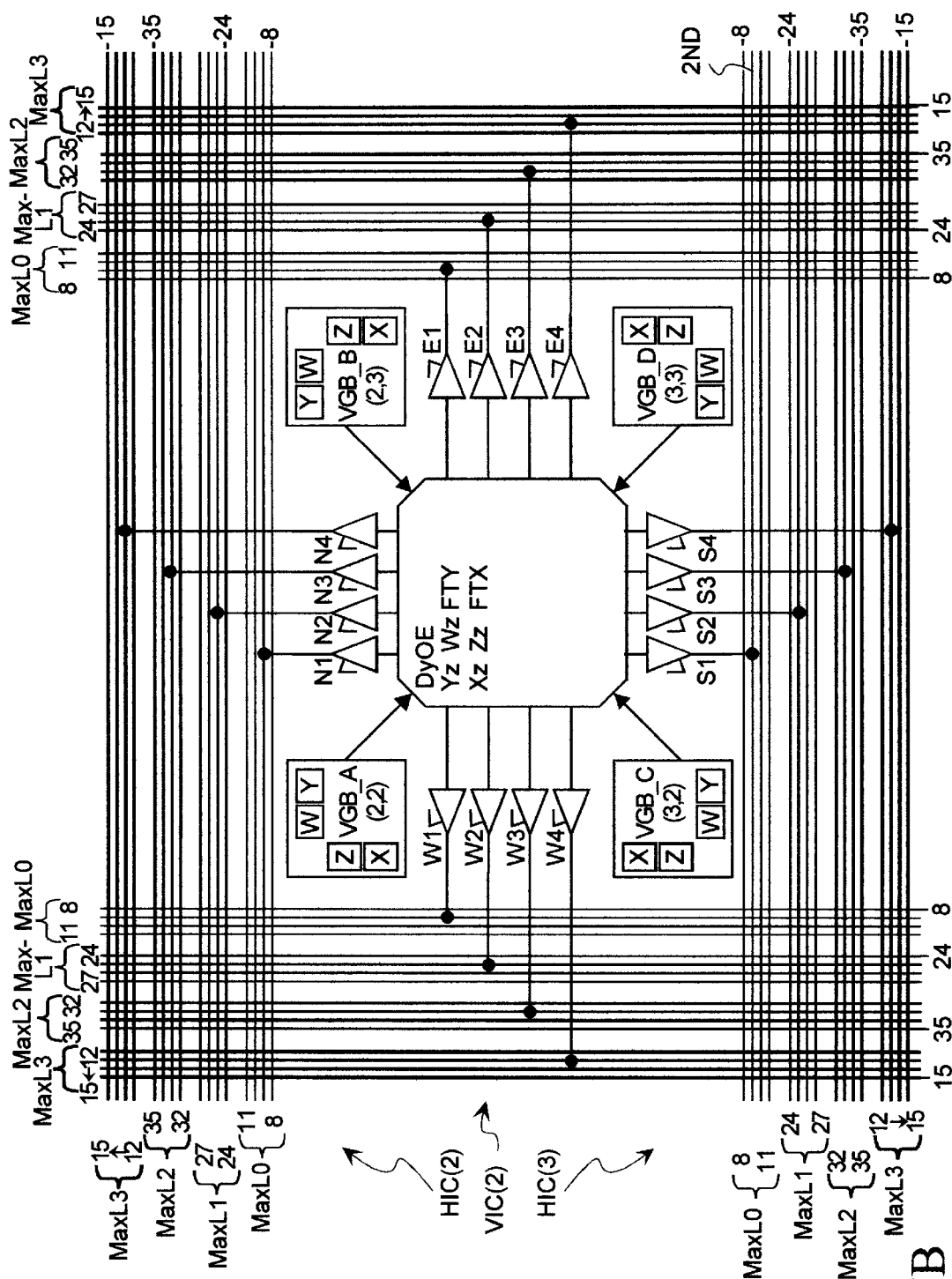

FIG. 7B shows a sampling of this out-stepping pattern of connections for the super-VGB surrounded by HIC's 2 and 3 and by VIC's 2 and 3. The encompassed VGB's are enumerated as A=(2,2), B=(2,3), C=(3,2) and D=(3,3).

Figure 7C:
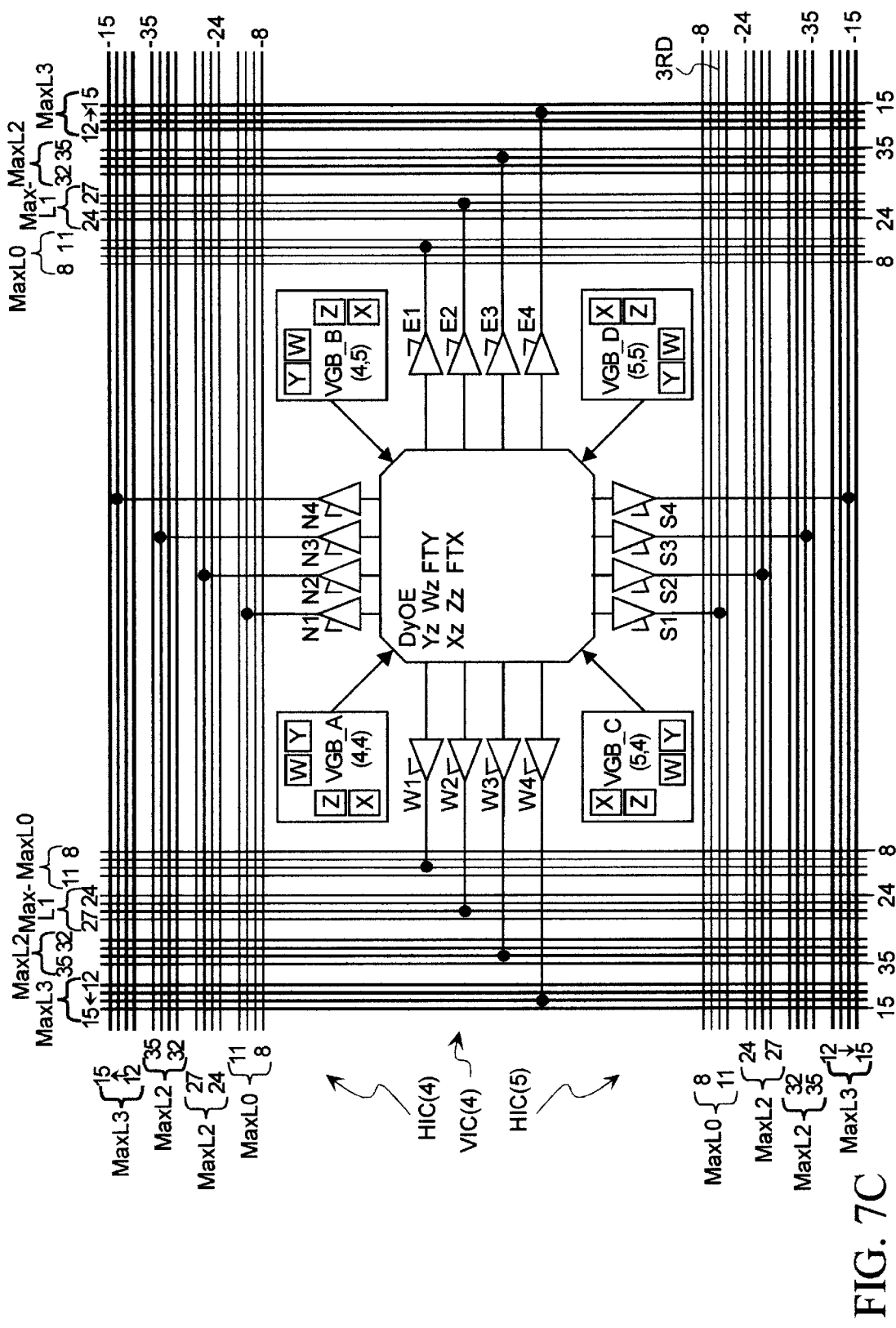

FIG. 7C shows a sampling of this out-stepping pattern of connections for the next super-VGB along the diagonal, which super-VGB is surrounded by HIC's 4 and 5 and by VIC's 4 and 5. The encompassed VGB's are enumerated as A=(4,4), B=(4,5), C=(5,4) and D=(5,5).

Figure 7D:
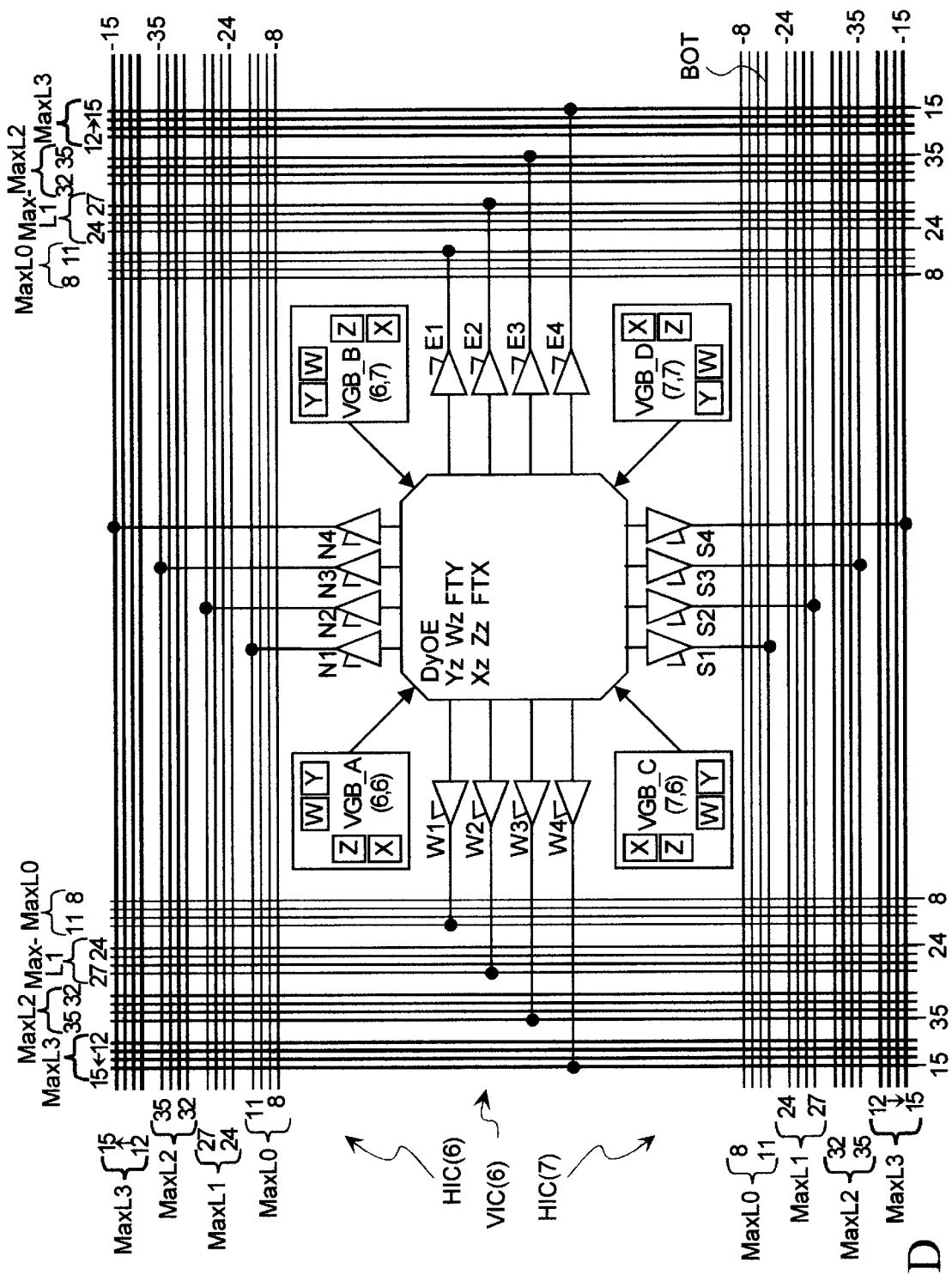

FIG. 7D shows a sampling of this out-stepping pattern of connections for the next super-VGB along the diagonal, which super-VGB is surrounded by HIC's 6 and 7 and by VIC's 6 and 7. The encompassed VGB's are enumerated as A=(6,6), B=(6,7), C=(7,6) and D=(7,7).

The combination of FIGS. 7A–7D demonstrates how all 16 MaxL lines of a given HIC can be driven by the northern or southern MaxL drivers of a horizontal succession of four super-VGB's. The combination of FIGS. 7A–7D also demonstrates how all 16 MaxL lines of a given VIC can be driven by the eastern or western MaxL drivers of a vertical succession of four super-VGB's. Bus-wide operations can be supported for nibble-wide buses by just one super-VGB acting as the bus driver. Bus-wide operations can be supported for byte-wide buses by a pair of super-VGB's acting as bus master. Bus-wide operations can be supported for 16 bit-wide buses by a quadruple of super-VGB's acting as bus master. For wider buses, the driving super-VGB's can be configured to behave as dynamic multiplexers that provide time-multiplexed sharing of the adjacent MaxL lines. For example, each of the X, Z, W, and/or Y CBB's of each longline-driving super-VGB can be configured as a 4:1 multiplexer by configuring each 3-input LUT 'a' and 'b' as a 2:1 dynamic multiplexer and then folding together the two 2:1 multiplexers. The respective output signals Xz, Zz, Wz, and/or Yz of these CBB's can then drive the shared big drives to provide neighboring VGB's with time shared access to the driven longlines of the respective, longline-driving super-VGB.

Note that there is a same number (e.g., 16) of MaxL drivers as there are CBB's (X,Z,W,Y times 4) within each super-VGB. The combination of FIGS. 7A–7D provides a structure through which CBB result signals may be configurably routed to the longlines (MaxL lines) of either one of orthogonal interconnect channels, or alternatively, simultaneously broadcast to the longlines of such orthogonal interconnect channels.

The group of MaxL lines in each channel that are driven by tristate drivers of FIG. 7A are referred to herein as the 'TOP'set. This TOP set comprises AIL's #8, #24, #32 and #12 of respective groups MaxL0, MaxL1, MaxL2 and MaxL3. (The designation of this set as being TOP is arbitrary and coincides with the label TOP in the right bottom corner of FIG. 7A as applied to the bottom MaxL0 group.)

In similar fashion, the group of MaxL lines in each channel that are driven by tristate drivers of FIG. 7B are referred to herein as the '2ND' set. This 2ND set comprises AIL's #9, #25, #33 and #13. The group of MaxL lines in each channel that are driven by tristate drivers of FIG. 7C are referred to herein as the '3RD' set. This 3RD set comprises AIL's #10, #26, #34 and #14. The group of MaxL lines in each channel that are driven by tristate drivers of FIG. 7D are referred to herein as the 'BOT' set. This BOT set comprises AIL's #11, #27, #35 and #15.

Figure 7E:
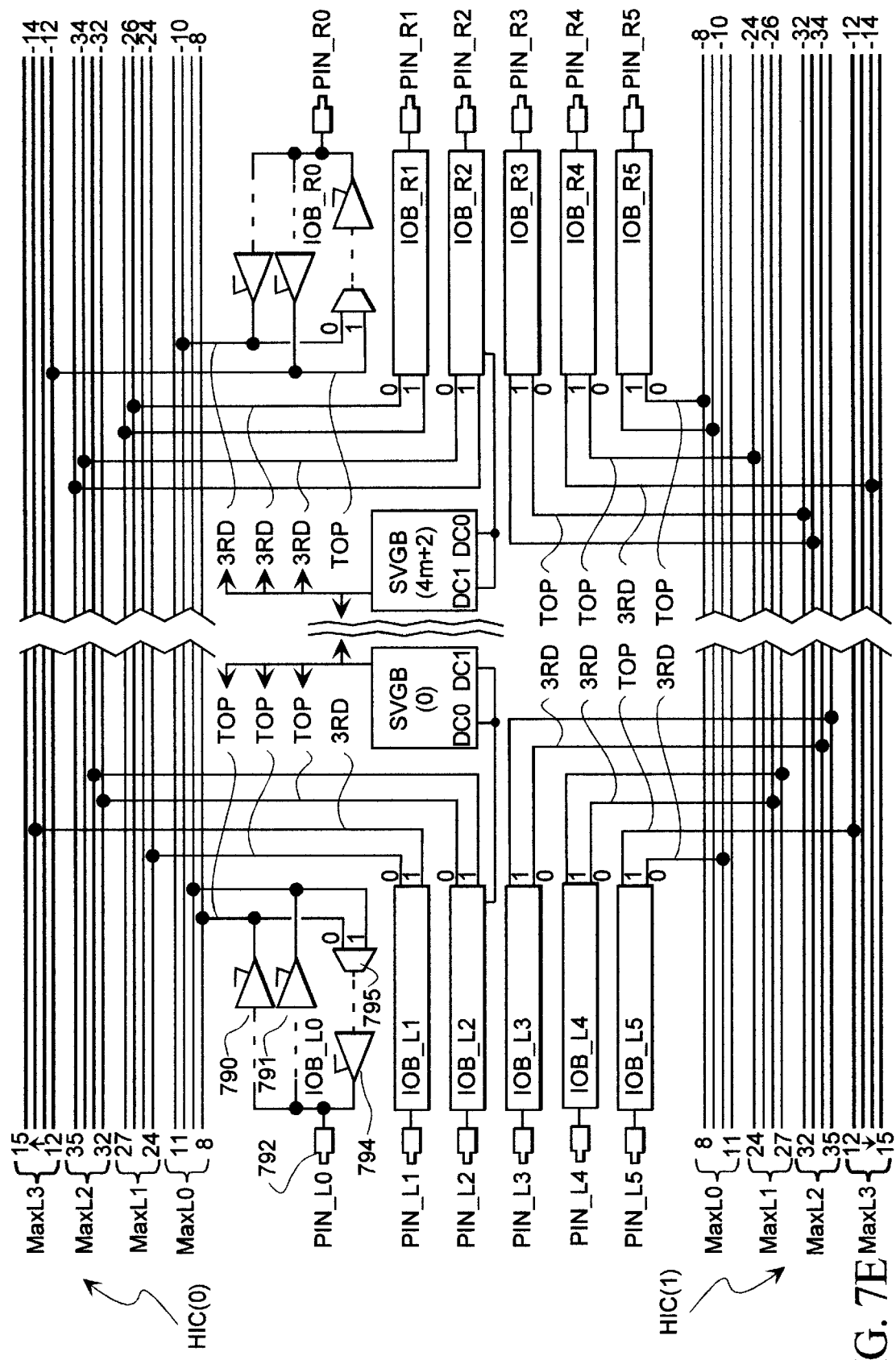
FIG. 7E illustrates how the MaxL line drivers of respective IOB's are coupled to surrounding interconnect channels.

FIG. 7E illustrates how IOB's interface with the MaxL lines, and in particular the TOP set of AIL's #8, #24, #32 and #12; and the 3RD set of AIL's #10, #26, #34 and #14.

Internal details of each IOB are not germane to the present disclosure and are thus not fully shown. As seen in FIG. 7E however, each IOB such as IOB_L0 (at the top, left) includes two longline driving tristate drivers 790 and 791 for driving a respective pair of MaxL lines. The illustrated tristate drivers 790 and 791 for example, respectively drive TOP AIL #8 and 2ND AIL #9. Input signals of the respective two longline driving tristate drivers, 790 and 791, may be configurably derived from a number of sources including external I/O pin 792 of the FPGA device 100. (Other sources include one or both of two bypassable and serially-coupled registers {not shown} within each IOB.) Each IOB such as IOB_L0 further includes a pin-driving tristate driver (with configurably-variable slew rate) such as shown at 794. Input signals of the pin-driving tristate driver 794 may be configurably derived from a number of sources including from user-configurable multiplexer 795. Two of the selectable inputs of multiplexer 795 are coupled to the same two longlines driven by that same IOB. In the case of IOB_L0 for example, that would be TOP AIL #8 and 2ND AIL #9.

The remaining IOB's shown in FIG. 7E have similar internal structures, which structures are not further detailed herein. As seen, at the left side of the FPGA device 100 between even-numbered HIC(0) and odd-numbered HIC(1), there are provided six IOB's respectively identified as IOB_L0 through IOB_L5. At the right side of the FPGA device 100 there are further provided six more IOB's respectively identified as IOB_R0 through IOB_R5. The external I/O pins are similarly identified as PIN_R0 through PIN_R5 on the right side and as PIN_L0 through PIN_L5 on the left side. The same connection pattern repeats between every successive set of even and odd-numbered HIC's. FIG. 7E may be rotated ninety degrees to thereby illustrate the IOB-to-MaxL lines connectivity pattern for the VIC's as well. (References to horizontal lines will of course be changed to vertical and references to left and right IOB's will of course be changed to top and bottom.) On the left side, IOB_L0, IOB_L1 and IOB_L2 collectively provide bidirectional coupling at least to 3 TOP longlines (AIL's #8, #24, #32) and 1 3RD longline (AIL #14) in the adjacent even-numbered HIC(0). On the right side, IOB_R0, IOB_R1 and IOB_R2 collectively provide bidirectional coupling at least to 3 3RD longlines (AIL's #10, #26, #34) and 1 TOP longline (AIL #12) in the adjacent and same even-numbered HIC(0). The combination of the six IOB's of HIC(0) therefore allow for bidirectional coupling of nibble-wide data either to the TOP set ((AIL's #8, #24, #32 and #12) and/or to the 3RD set (AIL's #10, #26, #34 and #14).

As seen in the bottom half of FIG. 7E, on the left side, IOB_L5, IOB_L4 and IOB_L3 collectively provide bidirectional coupling at least to 3 3RD longlines (AIL's #10, #26, #34) and 1 TOP longline (AIL #12) in the adjacent odd-numbered HIC(1). On the right side, IOB_R5, IOB_R4 and IOB_R3 collectively provide bidirectional coupling at least to 3 TOP longlines (AIL's #8, #24, #32) and 1 3RD longline (AIL #14) in the same odd-numbered HIC(1). The combination of the six IOB's of HIC(1) therefore allow for bidirectional coupling of nibble-wide data either to the TOP set (AIL's #8, #24, #32 and #12) and/or to the 3RD set (AIL's #10, #26, #34 and #14) of the odd-numbered, adjacent HIC.

In addition to the above-described couplings between the IOB's and the MaxL lines of the interconnect mesh, IOB's also couple by way of direct connect wires to peripheral ones of the SVGB's for both input and output. More specifically, there are direct connect wires connecting the left-side IOB's (IOB_L0 through IOB_L5) to adjacent SVGB's of super column number 0. Two such wires are represented as DC1 and DC2 coupling IOB_L2 to the illustrated column-0 SVGB. The same SVGB(0) corresponds to that of FIG. 7A insofar as driving the longlines of the adjacent HIC. FIG. 7E indicates that these super column 0 SVGB's can drive the same TOP set of longlines (AIL's #8, #24, #32 and #12) that may be driven by the IOB's, and as will later be seen, by the embedded memory.

There are further direct connect wires connecting the right-side IOB's (IOB_R0 through IOB_R5) to adjacent SVGB's of the rightmost super column. The column number of the rightmost super column is preferably (but not necessarily) equal to an even integer that is not a multiple of four. In other words, it is equal to 4m+2 where m=1, 2, 3, etc. and the leftmost super column is numbered 0. That means there are a total of 4m+3 SVGB's per row. The latter implies that square SVGB matrices will be organized for example as 11×11, 13×13, 19×19, 23×23 SVGB's and so on. (If the same organizations are given in terms of VGB's, they become 22×22, 26×26, 38×38, 46×46 VGB's and so on.) In such cases, the rightmost SVGB, number(4m+2) will corresponds to that of FIG. 7C insofar as driving the longlines of the adjacent HIC is concerned. The same rightmost SVGB number (4m+2) connects by way of direct connect wires to the right-side IOB's. FIG. 7E indicates that these super column number 4m+2 SVGB's can drive the same 3RD set of longlines (AIL's #10, #26, #34 and #14) that may be driven by the IOB's, and as will later be seen, by the embedded memory.

In alternate embodiments, the extent of direct connect between IOB's to adjacent columns of SVGB's is increased from extending to just the most adjacent super column to extending to at least the first two or three nearest super columns. This allows the right-side IOB's to reach the SVGB's that drive the 3RD longline set with direct connections.

Aside from direct connect wires, IOB's may be further coupled to the SVGB's of the device by 2×L, 4×L, 8×L lines of the adjacent HIC's. Coupling between the IOB's and the 2×L, 4×L, 8×L lines of adjacent HIC's may be provided through a configurable dendrite structure that extends to the multiplexer 795 of each IOB from pairs of adjacent HIC's. The specific structure of such configurable dendrite structures (not shown) is not germane to the present disclosure. It is sufficient to understand that configurable coupling means are provided for providing coupling between the 2×L, 4×L, 8×L lines of the adjacent HIC's and the corresponding IOB's.

Figure 8:
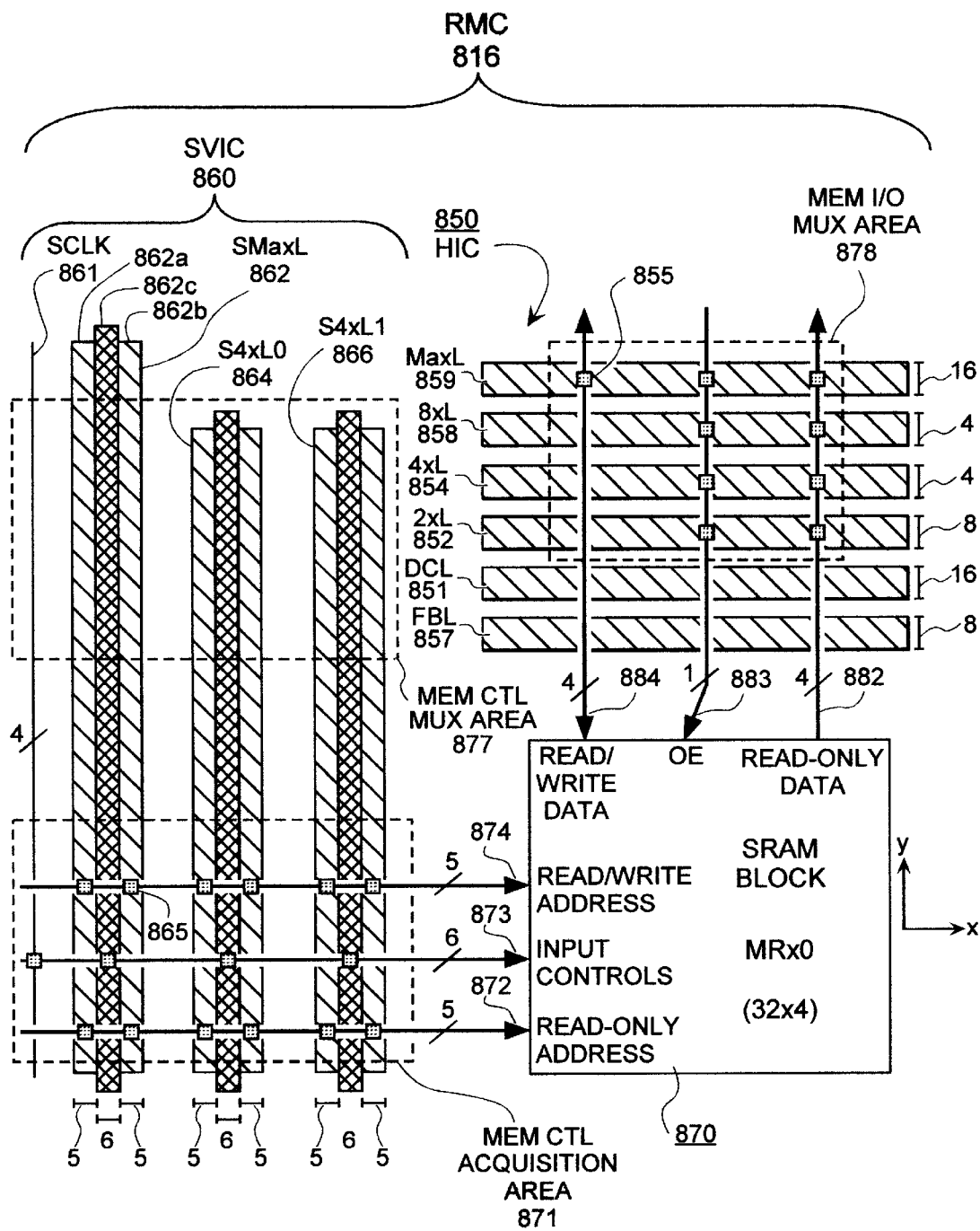
FIG. 8 is a further magnified illustration of one embodiment of FIG. 4, showing further details of a Right Memory Column (RMC), and in particular of a given SRAM block in accordance with the invention and its neighboring interconnect channels.

FIG. 8 may now be referred to while keeping in mind the input/output structures of the surrounding SVGB's and IOB's as described above for respective FIGS. 5–7E. A right memory channel (RMC) is broadly shown at 816. The RMC 816 includes a special vertical interconnect channel (SVIC) as shown under the braces of 860 and a memory block as shown at 870.

A horizontal interconnect channel (HIC) that belongs to the general interconnect of the FPGA is shown passing through at 850. Darkened squares such as at 855 are used to indicate general areas of possible interconnection (e.g., PIP connections) to various portions of the passing-through HIC.

Memory I/O multiplexer area 878 (first dashed box) corresponds to area 478 of FIG. 4. Memory control multiplexer area 877 (second dashed box) corresponds to area 477 of FIG. 4. Memory control acquisition area 871 (third dashed box) corresponds to symbol 471 of FIG. 4.

Memory block 870 contains a multi-ported SRAM array organized as 32-by-4 bits (for a total of 128 bits). One of the ports is of a read-only type as indicated at 882. Another port is bidirectional and provides for both reading of nibble-wide data out of memory block 870 and for writing of nibble-wide data into memory block 870 as indicated at 884. Output enable terminal 883 cooperates with the read/write data port 884, as will be explained shortly. For sake of convenience, the read/write port 884 is also be referred to herein as the first port, or Port_1. The read-only data port 882 is referred to as the second port, or Port_2.

Two different address signals may be simultaneously applied to memory block 870 for respectively defining the target nibble (4 data bits) that are to pass through each of first and second data ports, 884 and 882. As such, a 5-bit wide first address-receiving port 874 is provided in block 870 for receiving address signals for the read/write data port 884 (Port_1). A second 5-bit wide address-input port 872 is provided for receiving independent address signals for association with the read-only data port 882 (Port_2). Additionally, a 6-bit wide controls-input port 873 is provided in block 870 for receiving various control signals from the adjacent SVIC 860 as will be detailed shortly. The respective combination of 5, 6, and 5 (address, control, address) lines adds up to a total of 16 such lines.

SVIC 860 contains a diversified set of special-function interconnect lines. A first set of four longlines are dedicated to carrying the CLK0–CLK3 clock signals of the FPGA array. This set of four clock lines is denoted as SCLK bus 861. Another set of sixteen longlines is illustrated at 862 and identified as special maximum length lines (SMaxL). Like the other longlines of integrated circuit 100, the SMaxL lines 862 extend continuously and fully over a corresponding working dimension of the FPGA matrix. The SMaxL lines 862 are subdivided into respective groups of 5, 6 and 5 lines each as denoted by identifiers 862a, 862c and 862b. Configurable interconnections of these respective components 862a–c with crossing buses 872–874 are denoted by darkened squares such as at 865. It is seen from the darkened square icons of FIG. 8 that either of the 5-bit wide longline components 862a or 862b can supply a 5-bit wide address signal to either one or both of address-input ports 874 and 872. Similarly, the 6-bit wide vertical longline component 862c may be used for supplying all six of the control signals supplied to 6-bit wide port 873.

SVIC 860 further includes two sets of special, quad-length lines respectively denoted as S4×L0 and S4×L1. These sets of quad-lines are respectively illustrated at 864 and 866 as being each sixteen lines wide. In each set of quad lines, the set is further subdivided into respective components of five, six and five lines (5/6/5) in the same manner that wires-group 862 was. Again, darkened squares are used to indicate the provision of configurable interconnections to the respective ports 872, 873 and 874 of memory block 870. Unlike the staggered organization of the general quad-length lines (4×L lines) shown in FIG. 2, in one embodiment of the FPGA device 100 the special, quad-length lines in the two sets, S4×L0 (864) and S4×L1 (866) are not staggered and are not joined one to the next by switch boxes. This non-staggered organization allows for simultaneous broadcast to a group of as many as 4 adjacent SRAM blocks (4×4×32 bits of memory) of five bits of address signals for each respective address port (874,872) and/or six bits of control signals for each respective control port (873). Omission of switch boxes in the two special quad-length sets, S4×L0 (864) and S4×L1 (866), helps to reduce capacitive loading and thereby helps to speed the transmission of address and/or control signals to ports 872,873, 874 by way of S4×L0 (864) and S4×L1 (866).

Memory control acquisition area 871 (dashed box) is defined by the darkened square connections of SVIC 860 to ports 872, 873, 874 of block 870. The memory control acquisition area 871 may be configured by the FPGA user such that the five bits of the read-only address input port 872 may be acquired from the five-bit wide components of any one of line sets 862, 864 and 866. Similarly, the five-bit address signal of the read/write input port 874 may be acquired from any one of these vertical line subsets. The six control signals of input controls port 873 may be acquired partially from the SCLK bus 861 and/or fully from any one of the six-bit wide components of vertical line sets 862, 864 and 866.

FPGA-wide address or control signals that are common to a given embedded memory column 114/116 may be broadcast as such over longlines such as that of SVIC components 861 and 862. More localized address or control signals that are common to a given section of an embedded memory column 114/116 may be broadcast as such over S4×L components 864 and 866 of the SVIC.

Figure 18:
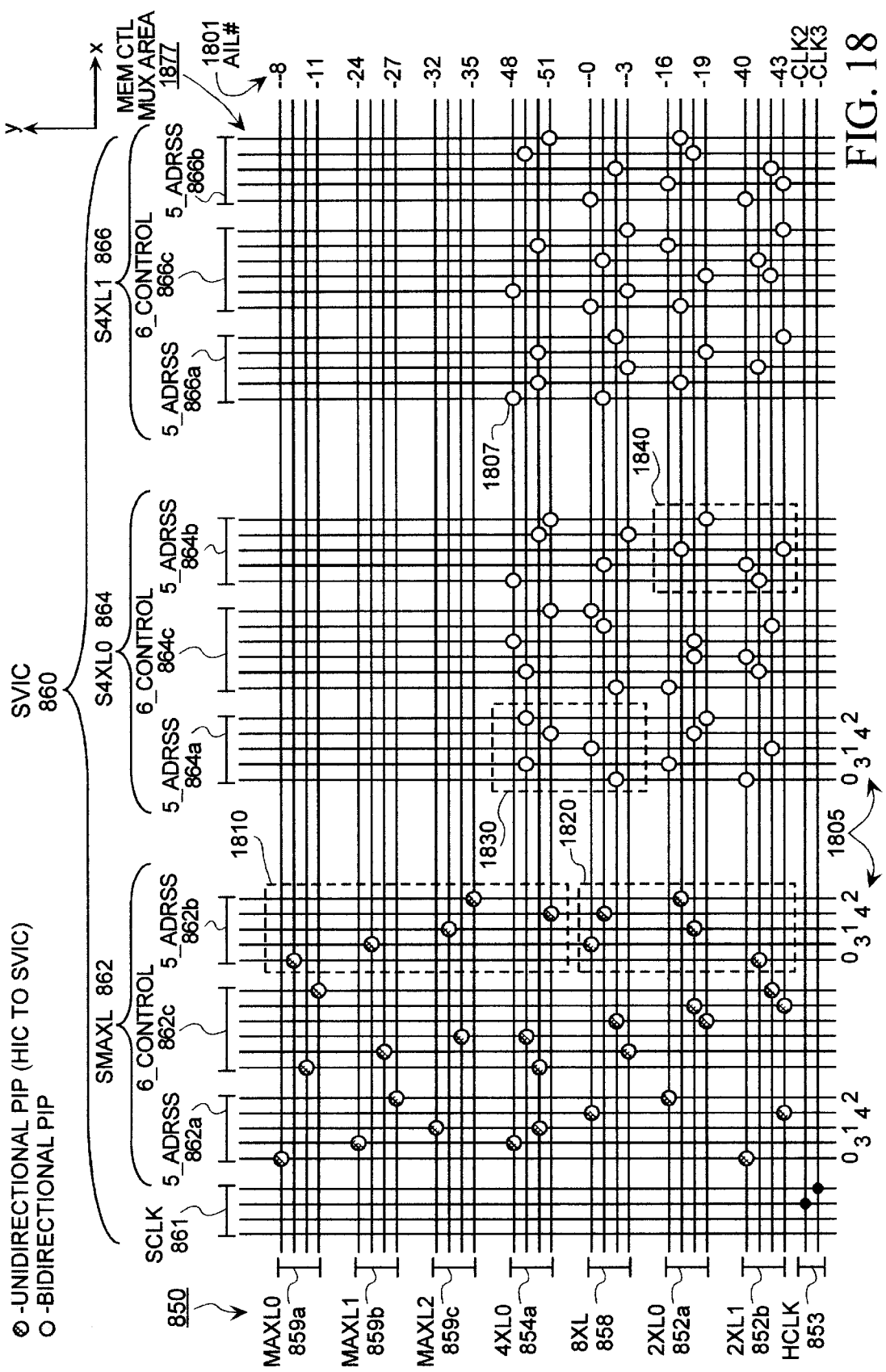
FIG. 18 is a schematic diagram of one embodiment of FIG. 4 showing a user-configurable, intercoupling of address and control signals from a crossing-over horizontal interconnect channel (HIC) to the special vertical interconnect channel (SVIC)

HIC 850 crosses with SVIC 860 in the region of memory control multiplexer area 877. A possible embodiment of crossing-buses interconnections for area 877 is shown in FIG. 18.

As seen in FIG. 8, HIC 850 also has a set of subcomponents. More specifically, there are sixteen longlines denoted at 859 as the MaxL set. There are four octal-length lines denoted at 858 as the 8×L set. There are four quad-length lines denoted at 854 as the 4×L set. There are eight double-length lines denoted at 852 as the 2×L set. Furthermore, there are sixteen direct-connect lines denoted at 851 as the DCL set. Moreover, there are eight feedback lines denoted at 857 as the FBL set. Nibble-wide data transmission is facilitated by the presentation of each of these diversified interconnect resources (851, 852, 854, 857–859) as a number of wires, where the number is an integer multiple of 4.

Within the dashed box of FIG. 8 that is designated as memory I/O multiplexer area 878, darkened squares are provided to show the general interconnections that may be formed (in accordance with one embodiment) between HIC 850 and the buses extending from ports 882, 883 and 884 of the memory block 870. As seen, in this embodiment, the read/write data port 884 (Port_1) is restricted to configurable connections only with the MaxL set 859. This restriction allows for run-time switching between read and write modes. It should be recalled from FIGS. 7A–7E that the longlines of the MaxL set 859 can be driven by tristate drivers of the adjacent SVGB's and/or IOB's. As will be seen in FIG. 9, the read/write data port 884 (Port_1) also has tristate drive capability. Data can thus be output onto the tristateable MaxL set 859 by a given bus master (SVGB or IOB) that wants to write data into the read/write data port 884 (Port_1) or output onto the tristateable MaxL set 859 by Port_1 itself when Port_1 (884) is in a read mode.

The read-only data port 882 (Port_2) can output data signals, in accordance with the illustrated interconnect possibilities, to any one or more of the MaxL set 859, the 8×L set 858, the 4×L set 854 and the 2×L set 852.

Output enable signals may be acquired by port 883 in accordance with the illustrated interconnect possibilities, from one of sets 859, 858, 854 and 852.

It is within the contemplation of the invention to have other patterns of interconnect coupling possibilities in multiplexer area 878. However, for one embodiment of SRAM block 870, the particular intercoupling possibilities shown in 878 is preferred for the following reasons. The read-only data port 882 (Port_2) tends to output read data at a faster rate than does the read/write data port 884 (Port_1). As such, it is particularly useful to be able to output this more-quickly accessed data (from Port_2) by way of the shorter-length (and thus faster) 2×L lines 852. A user-configurable multiplexer coupling is therefore provided from the read-only data port 882 to the 2×L lines set 852. Additional user-configurable multiplexer couplings are further provided to line sets 854, 858 and 859.

The writing of data into port 884 or the reading of data from port 884 tends to be a relatively slower process as compared to the reading of data from port 882. At the same time, it is desirable to be able to source data into port 884 from any column of the FPGA device 100 (FIG. 1) and/or from any column of IOB's (1–24, 49–72). User-configurable multiplexer connections 855 are therefore provided for bi-directional and tristateable transfer of data between the read/write data port 884 and the MaxL lines set 859. However, it is not desirable to have further user-configurable interconnections between read/write data port 884 and the other, not-tristateable line sets 858, 854, 852, 851 and 857 of HIC 850. Converting the other line sets 858, 854, 852, 851 and 857 of HIC 850 into tristateable lines would consume additional space in the integrated circuit 100 because the 2/4/8×L outputs (FIG. 6) of the CBB's would have to be converted into tristate drivers for this one purpose without providing substantial improvement in speed and performance. As such, in a preferred embodiment, the read/write data port 884 (Port_1) is couplable only to the adjacent MaxL lines set 859.

It will be seen later (in the embodiments of FIGS. 9 and 12–13), that the OE port 883 may be used to time the outputting of time-multiplexed data from port 884. The output data may be pre-stored in a Port_1 read-register (not shown in FIG. 8). As such, high-speed coupling of control signals to port 883 may be desirable even if the Port_1 data portion 884 couples only to longlines 859. Data may be time-multiplexed onto longlines 859 at relatively high switching speed by using the high-speed enabling function of the OE port 883. Accordingly, as seen in FIG. 8, user-configurable multiplexer options are provided for coupling control signals to OE port 883 from the shorter (faster) line sets 852, 854 and 858 as well as from longer line set 859.

Figure 9:
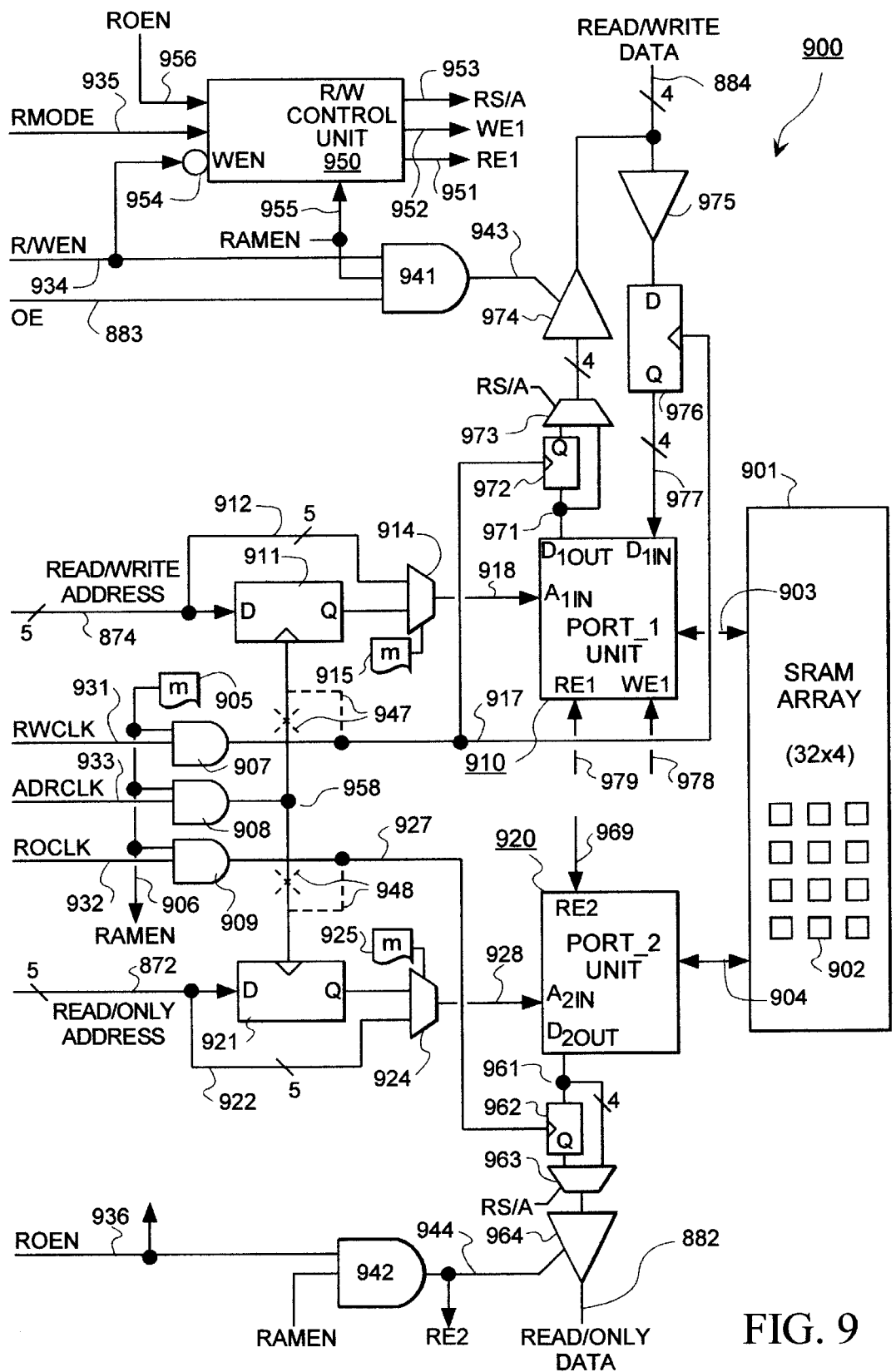
FIG. 9 is a further magnified illustration of one embodiment of FIG. 8, showing further details inside of a given SRAM block.

FIG. 9 shows a next level of details within an SRAM block such as 870 of FIG. 8. The internal structure of such an SRAM block is generally designated as 900 and includes an SRAM array 901. Repeated, dual-port memory cells are provided within array 901. Each such dual-port memory cell is referenced as 902. (See FIG. 10 for one embodiment 1002 of such a cell.)

In one embodiment of FPGA device 100 (FIG. 1), there are 128 dual-ported memory cells 902 within SRAM array 901. The data of these cells 902 may be simultaneously accessed by way of respective, bidirectional couplings 903 and 904. Couplings 903 and 904 carry both address and data signals for the correspondingly accessed cells.

A first configuration memory bit 905 of the FPGA device 100 is dedicated to a respective SRAM block 900 for allowing users to disable transition-sensitive inputs of block 900 in cases where block 900 is not being used. A logic '*0*' is stored in configuration memory bit 905 when block 900 is not used. A logic '1' signal in configuration memory bit 905 becomes an active RAM enabling signal 906 (RAMEN) that permits block 900 to be used.

A first port control unit 910 (Port_1 Unit) is provided for controlling operations of the read/write data port 884 and its corresponding address input port 874.

The supplied five-bit address signal 874 for Port_1 may be stored within a first address-holding register 911 of block 900 and/or it may be transmitted through bypass path 912 to a first data input of address multiplexer 914. A second data input of multiplexer 914 receives the Q output of the first address-storing register 911. Configuration memory bit 915 controls multiplexer 914 to select as the current address signal ($A_{1in}$) of Port_1, either the signal present at the first input (912) or at the second input (Q) of address-selecting multiplexer 914. The selected address signal 918 is then applied to the address input $A_{1in}$ of the Port_1 unit 910.

An address-strobing signal 958 may be applied to a clock input of address-storing register 911 for causing register 911 to latch onto the signal presented on line 874. The address-strobing signal 958 is produced by passing a rising edge of an address clock signal (ADRCLK) through control-input terminal 933 and through an address-strobe enabling AND gate 908. The second input of AND gate 908 is connected to the RAMEN signal 906 so that the output of gate 908 is pulled low (to logic '0') when RAMEN is at logic '0'.

In addition to address-input port 918, the Port_1 unit 910 has a $D_{1out}$ port (971) from which data may be read out and a $D_{1in}$ port (977) into which data may be written. Port_1 unit 910 further includes a write-enable terminal 978 (WE1) onto which a logic '1' signal must be placed in order to move write data from the $D_{1in}$ port 977 into SRAM array 901 by way of coupling 903. Unit 910 further has a read-enable terminal 979 (RE1) onto which a logic '1' signal must be placed in order to move read data from array 901 to the $D_{1out}$ port 971 by way of coupling 903.

The $D_{1out}$ port 971 is 4-bits wide and is coupled to the D input port of a 4-bit wide, read-register 972. The Q output of register 972 couples to one selectable input of a synch controlling multiplexer 973. The $D_{1out}$ port 971 additionally couples to a second 4-bit wide selectable input of multiplexer 973. An RS/A control signal (Read Synch or Asynch control) is applied to the selection control terminal of the synch controlling multiplexer 973 for selecting one of its inputs as a signal to be output to tri-state output driver 974. The RS/A signal comes from a control output 953 of an R/W control unit 950. Another output terminal 952 of the R/W control unit produces the WE1 signal which couples to terminal 978. Yet another output terminal 951 produces the RE1 signal which couples to terminal 979.

The output enabling terminal of tri-state driver 974 is coupled to output 943 of a Port_1 read-enabling AND gate 941. AND gate 941 includes three input terminals respectively coupled to receive the RAMEN signal 906, the OE signal from line 883, and an R/WEN signal as provided on line 934.

Line 934 (R/WEN) is one of the six lines that form control port 873 (FIG. 8). The other five lines are respectively: 931 for receiving an RWCLK (read/write clock) signal, 932 for receiving an ROCLK (read-only clock) signal, 933 for receiving the already-mentioned ADRCLK signal, 935 for receiving an RMODE signal, and 936 for receiving an ROEN (read-only enable) signal.

The RWCLK (read/write clock) signal on line 931 passes through AND gate 907 when RAMEN is true to provide access-enabling strobes on line 917 for Port_1. Line 917 couples to a rising-edge sensitive, clock input of the read register 972 of Port_1. Register 972 acquires the $D_{1out}$ signal at its D input for storage upon the rising edge of each pulse presented on line 917.

The Port_1 access-enabling line 917 also connects to a rising-edge sensitive, clock input of a write-data storing register 976. Register 976 receives four bits of write-data at its D input port from write buffer (high input impedance amplifier) 975. The input of buffer 975 connects to the 4-bit wide read/write data port 884. The output (Q) of register 976 couples to the 4-bit wide $D_{1in}$ input of the Port_1 unit 910.

It is seen, therefore, that acquisition of memory write data through port 884 occurs in synchronism with the RWCLK signal 931. For writing to occur, an active write-enable signal WEN must further be applied to terminal 954 of the read/write control unit 950. WEN 954 is the binary inverse of the R/WEN signal on control line 934. The combination of R/WEN control line 934 and OE control line 883 is provided so that the read/write port (Port_1) may have at least three separate states, namely, high-impedance output (Hi-Z), active bistable output (reading), and data inputting (writing).

In an alternate embodiment, the dashed, alternate connection and dashed line cut indicated by 947 is made and the responsiveness of registers 911 and 972 is modified such that one of these registers (e.g., 911) latches on the rising edge of passed-through RWCLK pulses and the other of these registers (e.g., 972) latches on the opposed falling edge of passed-through RWCLK pulses. The pulse width of the passed-through RWCLK pulses (917) would be adjusted in such an alternate embodiment to be at least equal to or greater than the address-strobe to read-valid latency of Port_1. Register 976 may latch on either edge of the passed-through RWCLK pulses (917). If write-register 976 is made to latch on the pulse edge opposite to that of read-register 972, write and read-back operations may be carried out in close time proximity to one another.

In yet another alternate embodiment, the dashed, alternate connection and dashed line cut indicated by 948 is made and the responsiveness of register 921 is modified such that register 921 latches on a predetermined one of the rising and falling edges of passed-through ROCLK pulses (927). If both of modifications 947 and 948 are made, then the ADRCLK control signal 933 and its associated hardware (e.g., 908 of FIG. 9 and the 9:1 ADRCLK multiplexer of FIG. 19A or 19B) may be eliminated to thereby provide a more compact device.

Figure 11:
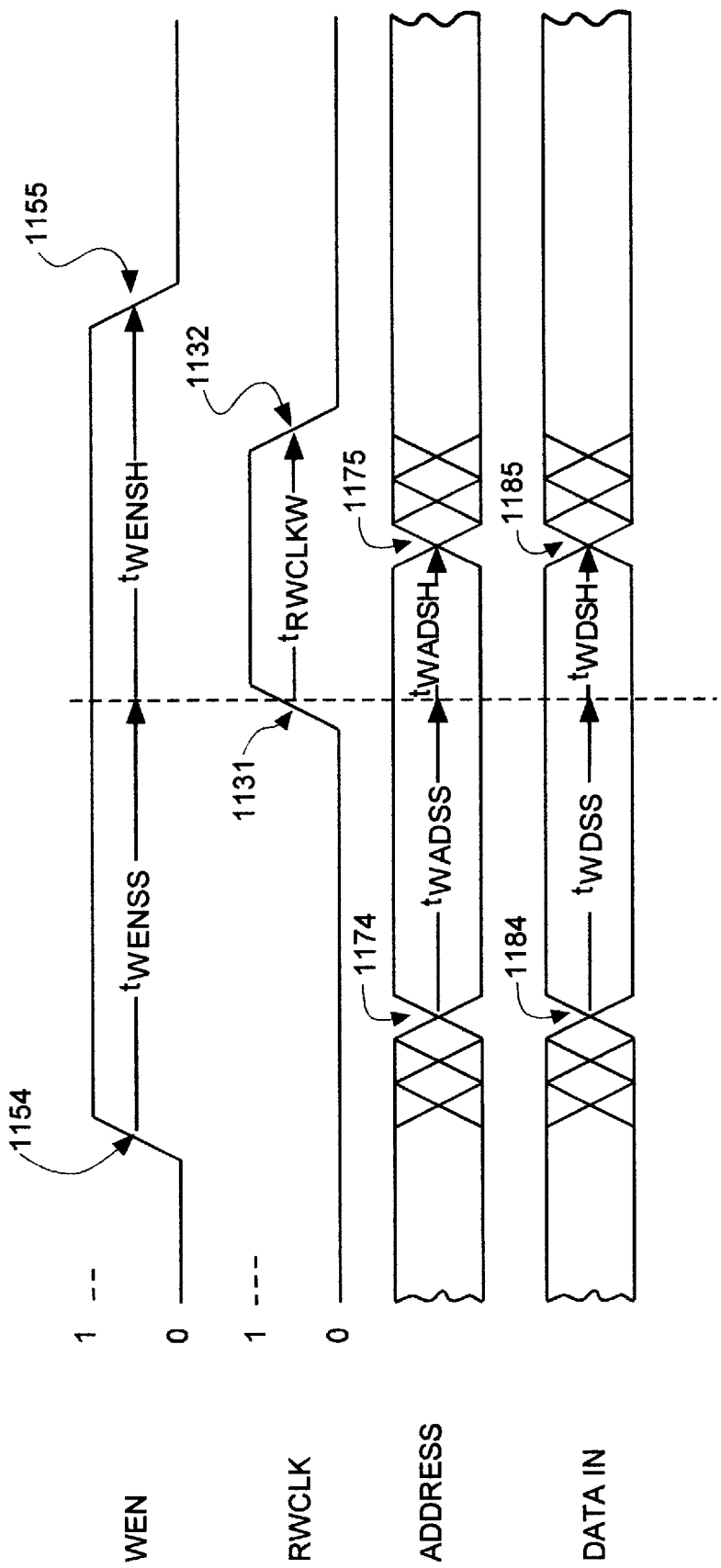
FIG. 11 is a timing diagram showing combinations of events that may occur during a synchronous write operation through Port_1 (read/write port) of FIG. 9.

Referring to FIG. 11, a process for performing a synchronous write to memory array 901 by way of the Port_1 data terminal 884 and the Port_1 address terminal 874 will now be described. Control line 934 (R/WEN) needs to be taken low so as to produce the equivalent of applying a logic '1' to the WEN input 954 of control unit 950. Threshold crossing 1154 in FIG. 11 represents the transition of WEN to the logic '1' state. Threshold crossing 1131 represents the transition of the RWCLK signal (931) to the logic '1' state. Duration $t_{WENss}$ represents a specified, minimum synch-setup time between WEN transition 1154 and the time that RWCLK transitions (1131) to logic '1'.

The Port_1 address-input signal on bus 874 and the Port_1 data-input signal on bus 884 (see FIG. 9) should be stabilized before the rising edge 1131 of the RWCLK signal on line 931. Time point 1174 in FIG. 11 represents the beginning of a stabilized state for the Read/Write address signal on bus 874. Duration $t_{WADss}$ represents a specified, minimum synch-setup time between address stabilization point 1174 and the time that RWCLK transitions (1131) to logic '1'. Time point 1184 in FIG. 11 represents the beginning of a stabilized state for the Read/Write data signal on bus 884. Duration $t_{WDss}$ represents a specified, minimum synch-setup time between data stabilization point 1184 and the time that RWCLK transitions (1131) to logic '1'.

Writing to the SRAM array 901 occurs during a first portion of the RWCLK pulse. Control unit 950 causes the WE1 (write enable) signal 952,978 to be at logic '1' during this time. If WE1 is at logic '0', writing cannot occur. Input 955 of control unit 950 must receive an active RAMEN signal for WE1 to go to logic '1'.

Duration $t_{RWCLKw}$ in FIG. 11 represents a specified, minimum pulse width between rising edge point 1131 and the time that RWCLK transitions (1132) back to logic '0', if at all. Duration $t_{WADsh}$ represents a specified, minimum synch-hold time between rising edge point 1131 and the time point 1175 that address signal 874 may switch to a new value. Duration $t_{WDsh}$ represents a specified, minimum synch-hold time between rising edge point 1131 and the time point 1185 that data signal 884 may switch to a new value. Duration $t_{WENsh}$ represents a specified, minimum synch-hold time between rising edge point 1131 and the time point 1155 that the WEN signal may be optionally taken back to logic '0'. The various durations may of course vary in accordance with the specific semiconductor technology used to implement circuit 900. A negative synch-hold time may indicate that the release point occurs before rising edge point 1131 of the RWCLK pulse rather than after, as does a positive value.

Figure 12:
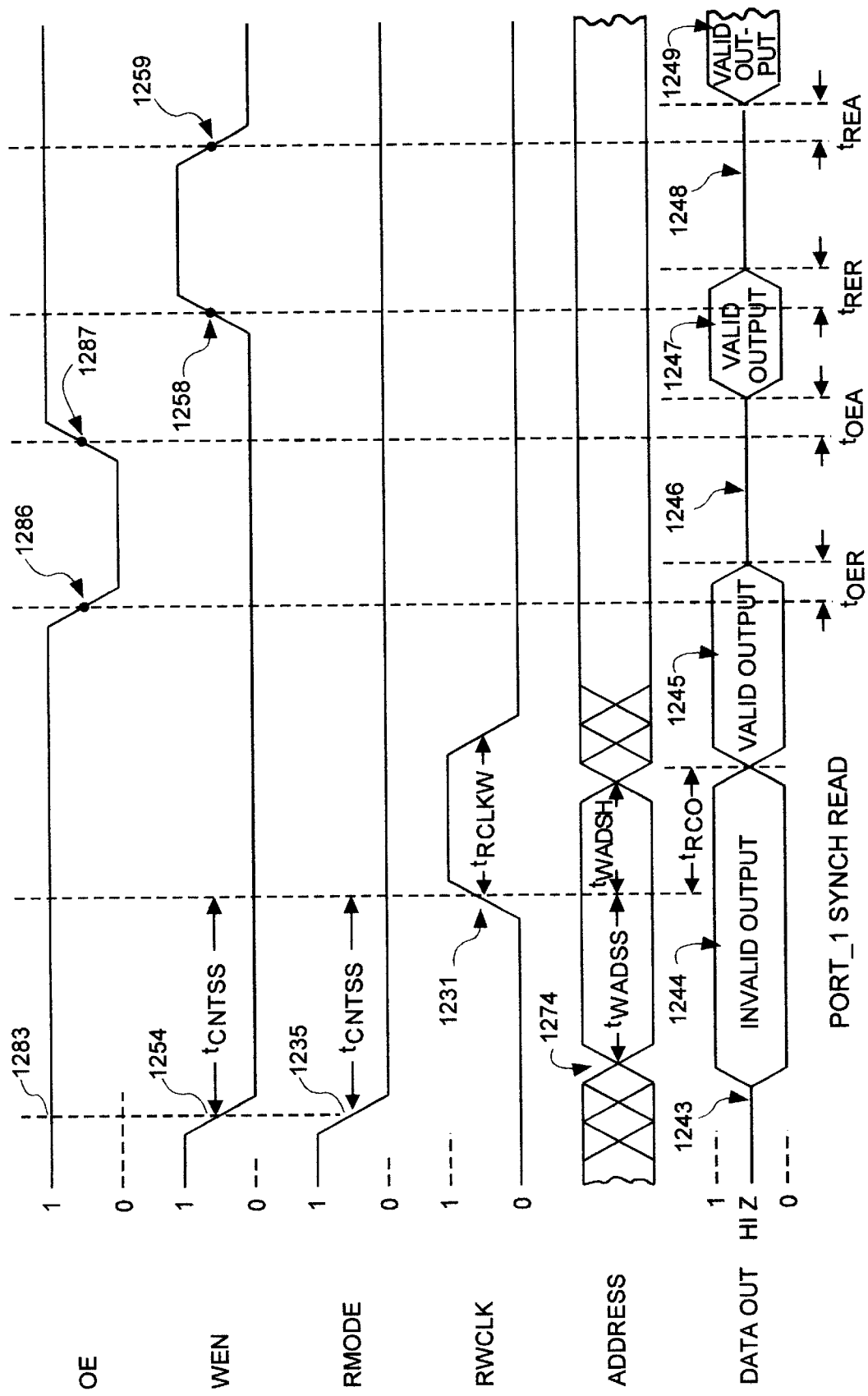
FIG. 12 is a timing diagram showing combinations of events that may occur during a synchronous read operation through Port_1 of FIG. 9.

Referring to FIG. 12, the process for performing a synchronous read from memory array 901 by way of the Port_1 data bus 884 and the Port_1 address bus 874 will now be described. Control line 934 (R/WEN) needs to be taken high so as to produce a logic '1' at the corresponding input of AND gate 941. Raising R/WEN high is equivalent to applying a logic '0' to the WEN input 954 of control unit 950. Threshold crossing 1254 in FIG. 12 represents the transition of WEN to the logic '0' state. The OE signal input on line 883 for AND gate 941 is already assumed to be high as indicated at 1283. RAMEN is also assumed to be high. As seen at 1243, the output of the Port_1 tristate driver 974 is in the Hi-Z (high impedance) state while output 943 of AND gate 941 is low. State 1244 represents the outputting of invalid data from tristate driver 974 after WEN goes low at time point 1254 but prior to the rising edge time 1231 of the RWCLK signal (931).

Figure 13:
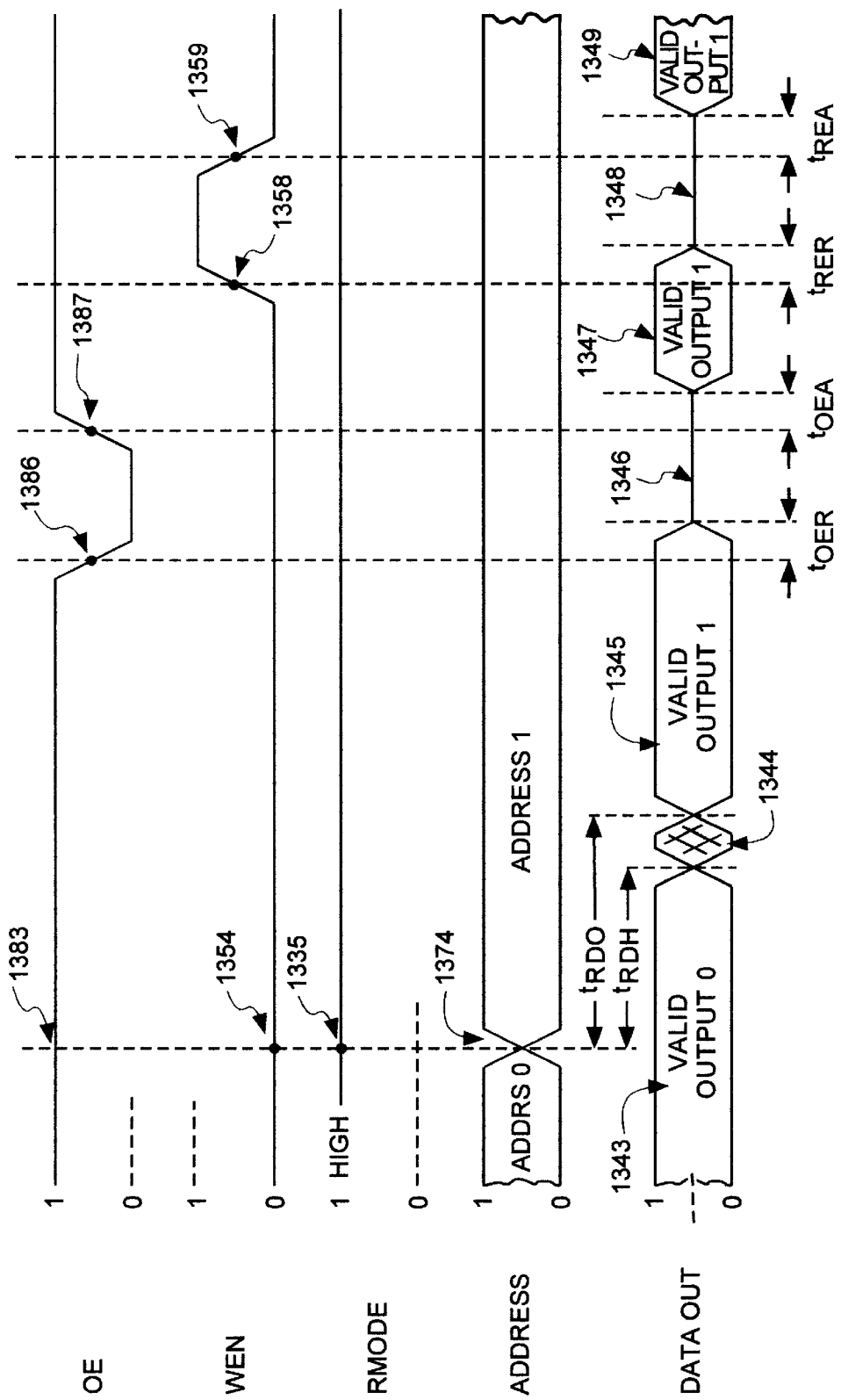
FIG. 13 is a timing diagram showing combinations of events that may occur during an asynchronous read operation wherein the read address is provided in an asynchronous manner through Port_1 of FIG. 9.

Threshold crossing 1231 represents the transition of the RWCLK signal (931) to the logic '1' state in FIG. 12. Duration $t_{CNTss}$ represents a specified, minimum synch-setup time between WEN transition 1254 and the time that RWCLK transitions (1231) to logic '1'. The same control specification, $t_{CNTss}$ may also represent a specified, minimum synch-setup time between RMODE transition 1235 and the time that RWCLK transitions (1231) to logic '1'. RMODE signal 935 (FIG. 9) should be low during synchronous read operations and high during asynchronous read operations. (FIG. 13 shows an asynchronous read operation.) Time point 1274 in FIG. 12 represents the beginning of a stabilized state for the Read/Write address signal on bus 874. Duration $t_{WADss}$ represents a specified, minimum synch-setup time between address stabilization point 1274 and the time that RWCLK transitions (1231) to logic '1'. Duration $t_{RCO}$ represents a specified, minimum read latency time between when the address is latched at clock point 1231 and valid data may be read out from the Port_1 data bus 884. State 1245 represents such outputting of valid data.

If the OE line 883 goes low such as represented at time point 1286, the output of driver 974 will return to the Hi-Z state as indicated at 1246. Duration $t_{OER}$ represents a specified, minimum enable read latency until valid state 1245 ends. If the OE line goes back high such as represented at time point 1287, the output of driver 974 will again return to the valid data output state as indicated at 1247. Duration $t_{OEA}$ represents a specified, minimum enable read access delay until Hi-Z state 1246 ends.

Similarly, if the R/WEN line 934 goes low (and thus WEN goes high) such as represented at time point 1258, the output of driver 974 will return to the Hi-Z state as indicated at 1248. Duration $t_{RER}$ represents a specified, minimum disable delay until preceding valid state 1247 ends. If the R/WEN line goes back high such as represented at time point 1259, the output of driver 974 will again return to the valid data output state as indicated at 1249. Duration $t_{REA}$ represents a specified, minimum read enable delay until Hi-Z state 1248 ends.

Referring to FIG. 13, the process for performing an asynchronous read from memory array 901 by way of the Port_1 data bus 884 and the Port_1 address bus 874 will now be described. Control line 934 (R/WEN) needs to be taken high so as to produce a logic '1' at the corresponding input of AND gate 941. Raising R/WEN high is equivalent to applying a logic '0' to the WEN input 954 of control unit 950. WEN is seen to already be in the logic '0' state at time point 1354. The OE signal input on line 883 for AND gate 941 is already assumed to be high as indicated at 1383. RAMEN is also assumed to be high. As seen at 1343, the output of the Port_1 tristate driver 974 is assumed to be outputting valid data from a previous, valid address ADDRS0 prior to address switching time 1374. RMODE is high as shown at 1335. Control unit 950 responsively drives the RS/A signal 953 of FIG. 9 to a selection state that causes multiplexer 973 to bypass register 972. As such, the RWCLK signal 931 has no effect in the asynchronous read operation.

After address switching point 1374, a first, data hold delay $t_{RDH}$ occurs until valid state 1343 ends and a temporary invalid data state 1344 begins. The corresponding valid data state 1345 for ADDRESS1 begins after a read latency delay as specified from point 1374 by $t_{RDO}$.

If the OE line 883 goes low such as represented at time point 1386, the output of driver 974 will switch to the Hi-Z state as indicated at 1346. Duration $t_{OER}$ represents a specified, minimum enable read latency until valid state 1345 ends. If the OE line goes back high such as represented at time point 1387, the output of driver 974 will again return to the valid data output state as indicated at 1347. Duration $t_{OEA}$ represents a specified, minimum enable read access delay until Hi-Z state 1346 ends.

Similarly, if the R/WEN line 934 goes low such as represented at time point 1358, the output of driver 974 will return to the Hi-Z state as indicated at 1348. Duration $t_{RER}$ represents a specified, minimum disable delay until preceding valid state 1347 ends. If the R/WEN line goes back high such as represented at time point 1359, the output of driver 974 will again return to the valid data output state as indicated at 1349. Duration $t_{REA}$ represents a specified, minimum read enable delay until Hi-Z state 1348 ends.

Figure 14:
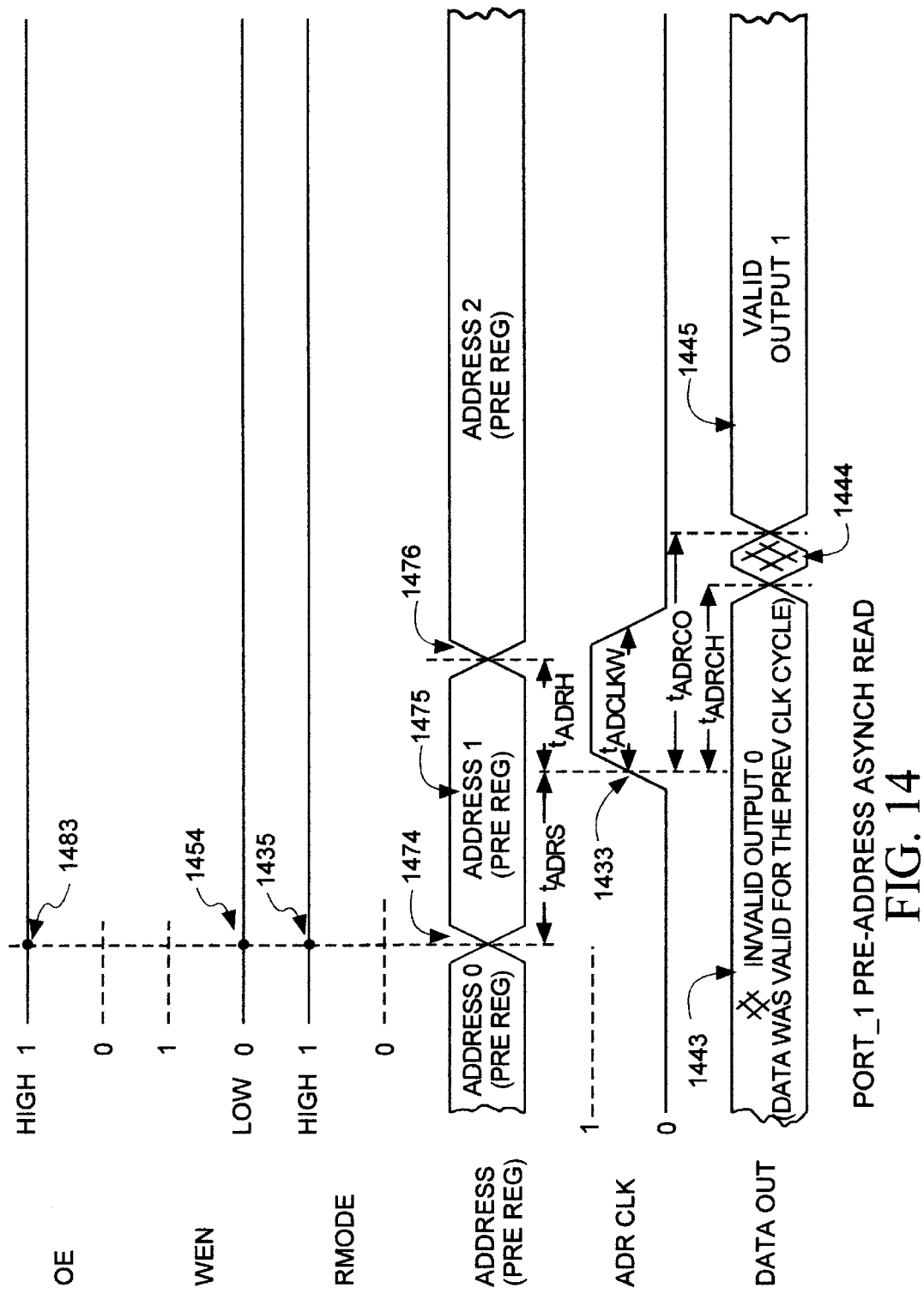
FIG. 14 is a timing diagram showing combinations of events that may occur during an asynchronous read operation wherein the read address is provided in a synchronous manner through Port_1 of FIG. 9.

Referring to FIG. 14, a process for performing an asynchronous read from memory array 901 by way of the Port_1 data bus 884 and the Port_1 address bus 874 and the address-storing register 911 will now be described. Control line 934 (R/WEN) needs to be taken high so as to produce a logic '1' at the corresponding input of AND gate 941. Raising R/WEN high is equivalent to applying a logic '0' to the WEN input 954 of control unit 950. WEN is seen to already be in the logic '0' state at time point 1454. The OE signal input on line 883 for AND gate 941 is already assumed to be high as indicated at 1483. RAMEN is also assumed to be high so that AND gate 908 can pass rising edges of the ADRCLK signal 933 onto a common, address strobing line 958. As seen at 1443, the output of the Port_1 tristate driver 974 is assumed to be outputting something. The output something may be either valid data from a previous, valid address ADDRS0 that was presented prior to address switching time 1474, or it may be invalid data. RMODE is high as shown at 1435. Control unit 950 responsively drives the RS/A signal 953 of FIG. 9 to a selection state that causes multiplexer 973 to bypass register 972. As such, the RWCLK signal 931 has no effect in the asynchronous read operation of FIG. 14.

Configuration memory bit 915 is assumed in FIG. 14 to be set to cause multiplexer 914 to select the Q output of address-storing register 911. As such, the ADRCLK signal on control line 933 determines when the next address signal 1475 on bus 874 takes effect.

Threshold crossing 1433 represents the transition of the ADRCLK signal (933) to the logic '1' state in FIG. 14. Duration $t_{ARs}$ represents a specified, minimum synch-setup time between address transition 1474 and the time that ADRCLK transitions (1433) to logic '1'. Duration $t_{ADRh}$ represents a specified, minimum hold time between the time that ADRCLK transitions (1433) to logic '1' and the time of next address transition 1476.

After address latching point 1433, a first, data hold delay $t_{ADRCH}$ occurs until the prior output state 1443 ends and a temporary invalid data state 1444 begins. The corresponding valid data state 1445 for ADDRESS1 (1475) begins after a read latency delay as specified from point 1433 by $t_{ADRCO}$. There is no need to discuss the effects of switching WEN and OE after the valid data state 1445 begins in view of the above discussions concerning points 1386–1387 and 1358–1359 of FIG. 13.

Referring back to FIG. 9, the configuration of the read-only port (Port_2) is generally similar to that of Port_1 with the exception that there is no write circuitry. The read-only address signal 872 may be latched into the Port_2 address-holding register 921 in synchronism with the ADRCLK signal 933 or it may be coupled asynchronously to the $A_{2in}$ input 928 of Port_2 unit 920 by way of multiplexer 924 depending on the setting of configuration memory area 925. The read-only enable signal (ROEN) is supplied by line 936 to one input of the Port_2 enabling AND gate 942. The RAMEN signal 906 is supplied to another input of AND gate 942. Output 944 of the AND gate 942 couples to the output enable terminal of tri-state drive 964. Output 944 is also coupled to the RE2 input 969 of the Port_2 unit 920. Synch control multiplexer 963 is controlled by the same RS/A signal 953 as synch control multiplexer 973. The Port_2 output data may be provided synchronously through output register 962 or asynchronously from bus point 961 by way of the bypass path of multiplexer 963. The Port_2 read register 962 latches with rising edges on access-enabling line 927. The ROCLK signal of line 932 passes through AND gate 909 to form the strobing pulses of line 927.

Figure 15:
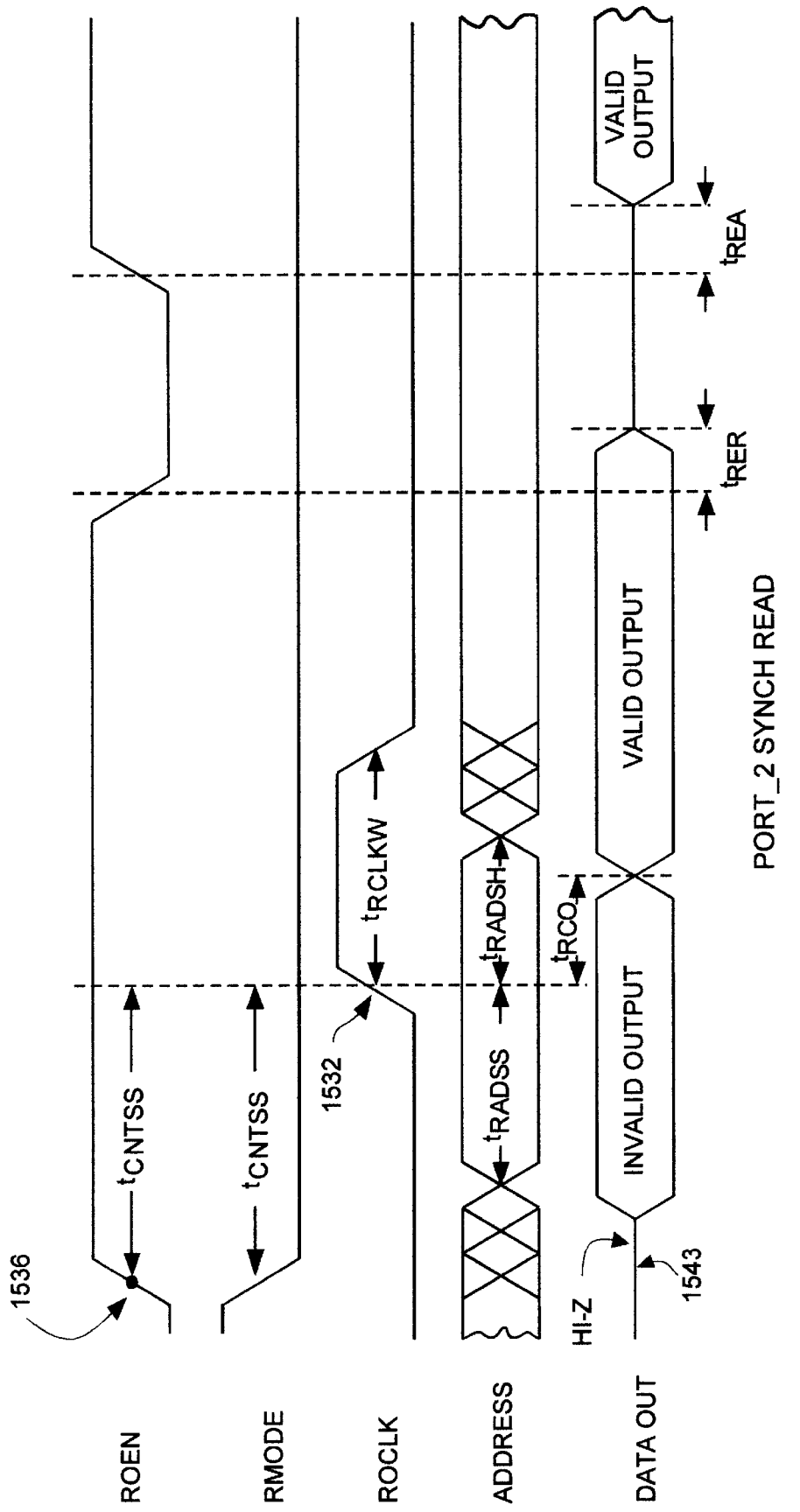
FIG. 15 is a timing diagram showing combinations of events that may occur during a synchronous read operation through Port_2 (read-only port) of FIG. 9.

FIG. 15 shows for Port_2 a similar process for performing a synchronous read from memory array 901 by way of the Port_2 data bus 882 and the Port_2 address bus 872 as was represented by FIG. 12 for corresponding buses 874 and 884. As such, a repeat of the detailed discussion is not needed. One difference in FIG. 15 is that the read-only clock signal (ROCLK) of 932 controls the process instead of the RWCLK signal 931. The threshold crossing point 1532 of the ROCLK signal (932) is therefore the main measuring point in FIG. 15. Another difference in FIG. 15 is that the read-only enable signal (ROEN) of line 936 controls the output of tri-state driver 964. Time point 1536 indicates when ROEN is switched to take tri-state driver 964 out of Hi-Z state 1543. The waveform of the ROEN signal in FIG. 15 is the inverse of the R/WEN signal in FIG. 12.

Figure 16:
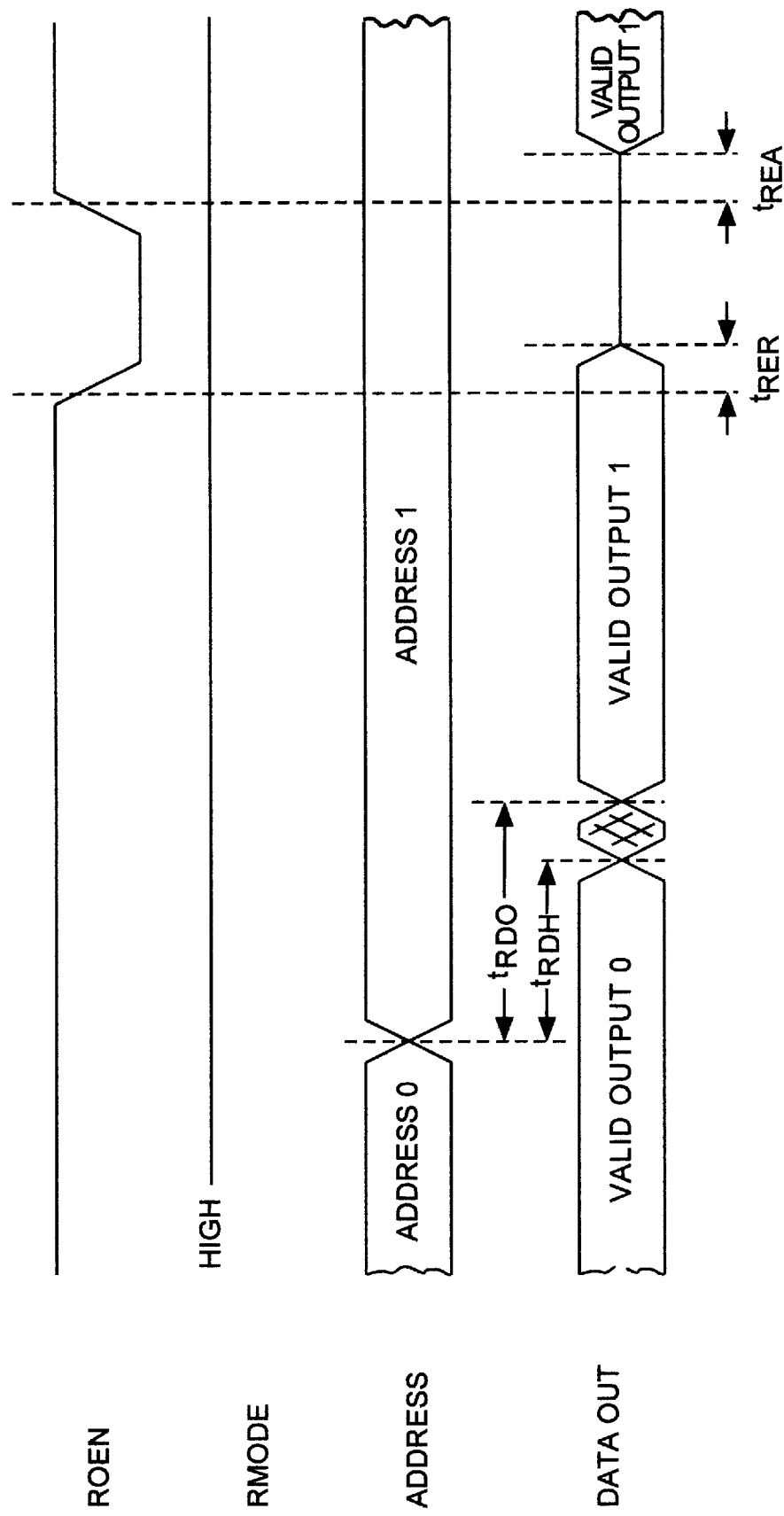
FIG. 16 is a timing diagram showing combinations of events that occur during an asynchronous read operation wherein the read address is provided in an asynchronous manner through Port_2 of FIG. 9.
Figure 17:
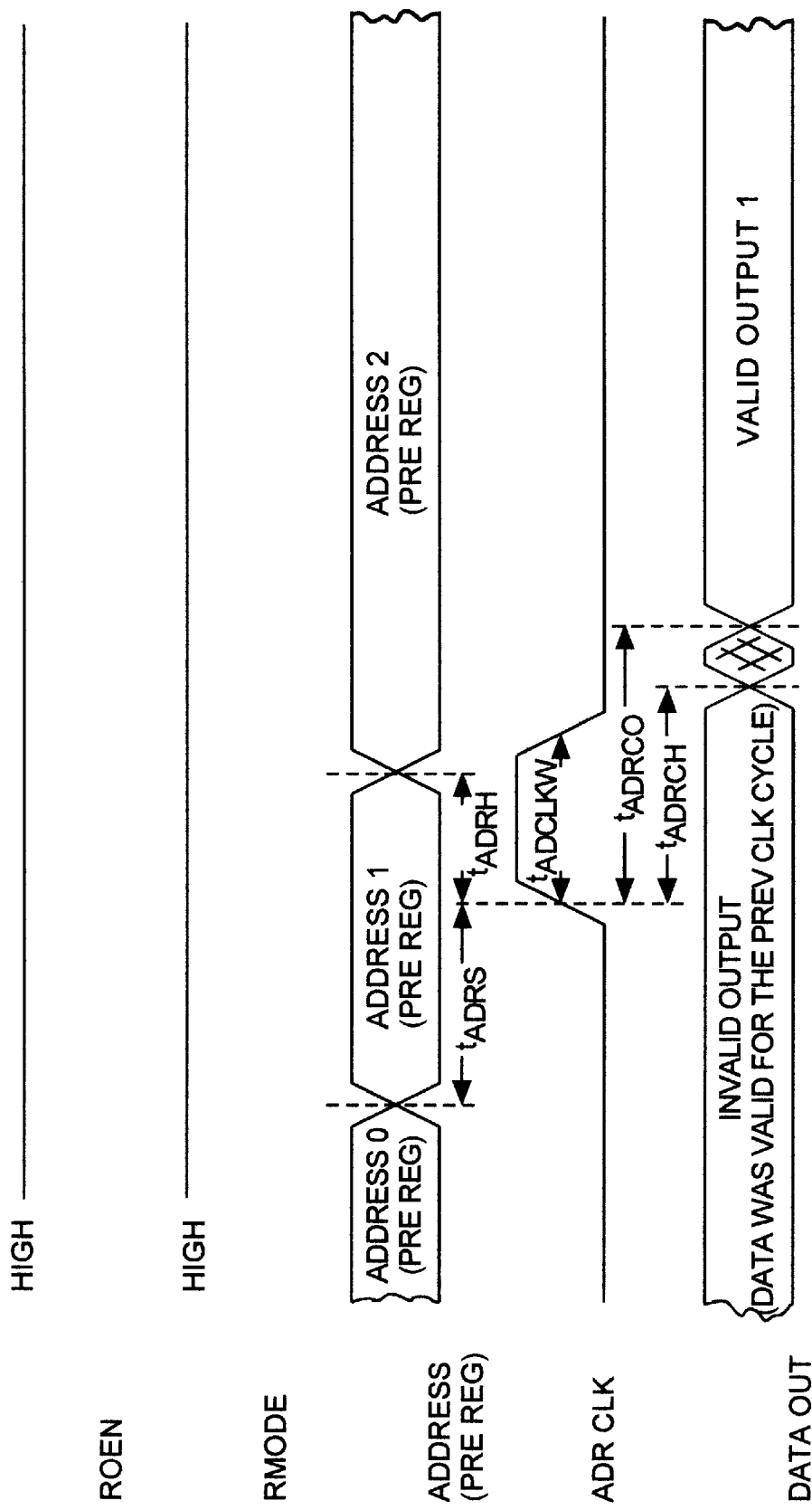
FIG. 17 is a timing diagram showing combinations of events that occur during an asynchronous read operation wherein the read address is provided in a synchronous manner through Port_2 of FIG. 9.

FIGS. 16 and 17 respectively define counterparts for Port_2 of what FIGS. 13 and 14 showed for Port_1. As such, a repeat of the detailed discussion is not made here.

Figure 10:
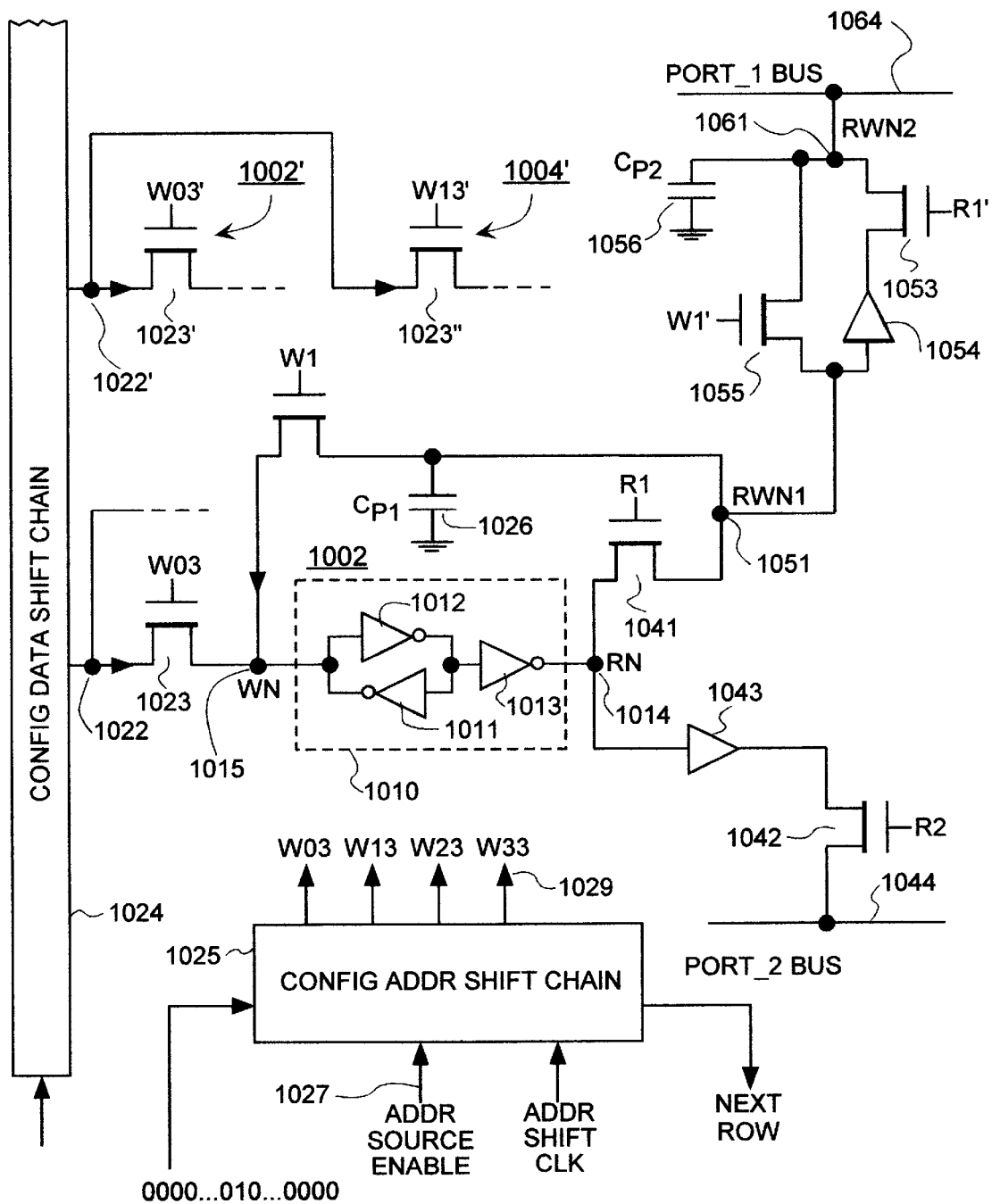
FIG. 10 is a magnified schematic of one embodiment of FIG. 9 showing further details of a repeated memory cell within the SRAM array.

FIG. 10 is a schematic of one embodiment 1002 of a repeated memory cell such as may be used for 902 in the SRAM array 901 of FIG. 9. Other implementations are of course possible. FIG. 10 is presented to show why read-only Port_2 generally operates faster than the read-and-write Port_1.

Dashed box 1010 contains a three inverter latch that may be used for storing a bit of the embedded SRAM array 901. CMOS inverters 1011 and 1012 form a bistable loop. CMOS inverter 1013 couples one end of the loop to read node (RN) 1014. The other end of the loop forms write node (WN) 1015.

Pass transistor W1 (1021) provides a first path by way of which write data may be transferred through Port_1 to write node 1015. Capacitance $C_{P1}$ (1026) is a parasitic capacitance associated with one source/drain terminal of pass transistor W1 (1021).

Pass transistor 1023 (having gate W03) provides a second path by way of which write data may be transferred through a serial configuration chain 1024 to pre-load configuration data into latch 1010 by way of write node 1015. There are actually two serial configuration chains, 1024 and 1025. Chain 1024 carries data bits and is thus referenced as the DATA shift chain 1024. Chain 1025 carries address bits and is thus referenced as the ADDR shift chain 1025. Each of the address output lines of chain 1025 are referenced as line 1029.

It is understood that the serial configuration chains 1024 and 1025 snake serially through other parts of the FPGA, including through the configuration memory of the FPGA, for serially configuring respective parts of the FPGA device. Serial configuration chains 1024 and 1025 permit initialization of the data in the SRAM blocks at the same time that the configuration memory is being loaded. A single serial EPROM device may therefore be used to load both the configuration memory and the SRAM blocks during power up of the FPGA through a serial interface of the FPGA device. Registers of each VGB may be similarly initialized during configuration time. This frees users from having to provide separate facilities for loading initial data into the SRAM blocks or other FPGA parts via other interfaces of the FPGA device.

The individual memory cells of each column of memory cells such as cell 1002 may be addressed by shifting a series of all zeroes and a single logic '1' through ADDR shift chain 1025. An ADDR Source Enable line 1027 needs to go high before one or more logic '1' address signals (1029) can be sourced from the ADDR shift chain 1025. The one or more outputs 1029 of ADDR shift chain 1025 that source respective logic '1's should be made to go low before a next address sourcing operation takes place. This constitutes a break before make operation. While the ADDR Source Enable line 1027 is held low (logic '0'), the address outputs 1029 sink current so as to drive their respective nodes low, but they cannot source current so to drive their respective nodes high.

Pass transistor 1023' (having gate W03') belongs to the next memory cell 1002' of the same column as that of memory cell 1002. The remainder of the next memory cell 1002' is not shown but is understood to be the same as that of cell 1002. It is further understood, although not shown, that there are additional pass transistors with respective gates W03", W03''', etc., in the further cells 1002", 1002''', etc., of the same column. Typically all the gates of the same column are connected together so as to be simultaneously addressed by a single drive line 1029 of ADDR shift chain 1025.

Pass transistor 1023" (having gate W13') belongs to a memory cell 1004' of an adjacent column of memory cells. The remainder of the second-column memory cell 1004' is not shown but is understood to be the same as that of cells 1002 and 1002'. It is further understood, although not shown, that there are additional pass transistors with respective gates W13, W13", W13''', etc., in the further cells of the same second column. Typically all the W13(') gates of the same column are connected together so as to be simultaneously addressed. The source portions of transistors in a same row, such as W03', W13', W23' (last not shown), etc. are typically connected together so as to be simultaneously driven by a same flip flop output node, such as 1022' of the DATA shift chain 1024. One such tying together of sources is shown for transistors 1023' and 1023". Although not fully shown, it is understood that a similar tying together of sources 1022 occurs in the row of transistor 1023 (W03). It is further understood that DATA shift chain 1024 snakes through all columns (e.g., LMC and RMC) of embedded memory and SVGB's and further that ADDR shift chain 1025 snakes through all rows of SVGB's and SRAM blocks.

Each time the ADDR Source Enable line 1027 is temporarily raised high, the ADDR shift chain 1025 addresses the gate or gates (W03, W13, W23, etc.) of those of the configuration pass transistors 1023, 1023', etc., which are to be written through during a respective configuration time interval. If there is only a single logic '1' shifting through chain 1025 then only one addressed node 1029 (e.g., W33 for the fourth cell column—not shown) will go high and the data of the corresponding flip flop nodes (e.g., 1022) in DATA shift chain 1024 will pass to the memory cells of that addressed column.

Configuration time pre-loading of the embedded memory may be used to establish initial data in desired ones of the SRAM blocks. Such pre-loaded SRAM blocks may even be treated as ROM blocks for run-time purposes if R/WEN (934) is held high during FPGA run-time operations that follow configuration. The once-loaded data of such ROM-like SRAM blocks may serve as DSP coefficient data for, by way of example, an FIR filter (finite impulse response) established in adjoining VGB's. Alternatively, each of such ROM-like SRAM blocks may serve as a 5-input LUT (lookup table) having four independent outputs. The outputs of such an LUT may be registered or passed through as unregistered combinatorial signals. (See FIG. 26.) Pass transistor R1 (1041) provides a path by way of which read data may be transferred from read node 1014 for output through Port_1. Pass transistor R2 (1042) provides a path by way of which read data may be transferred from read node 1014 for output through Port_2. As seen, the data that moves through sense amplifier 1043 and next flows through pass transistor R2 for coupling to an array-internal bus 1044 associated with Port_2. Ancillary addressing and timing circuitry is not shown because such circuitry is not relevant to the comparative read delays discussed here for Port_1 and Port_2.

The write signal of W1 and read signal of R1 pass through a first joint node RWN1 (1051). Parasitic capacitance 1026 ($C_{P1}$) couples to first joint node RWN1.

Pass transistor R1' (1053) provides a further path by way of which read data may be transferred from the first joint node RWN1 for output through Port_2. As seen, the data that moves through sense amplifier 1054 and next flows through pass transistor R1' (1053) on its way to an array-internal bus 1064 associated with Port_1. Ancillary addressing and timing circuitry is not shown because such circuitry is not relevant to the comparative read delays discussed here for Port_1 and Port_2.

Pass transistor W1' (1055) provides a further path by way of which write data may be transferred through Port_1 to the first joint node RWN1. Capacitance $C_{P2}$ (1056) is a parasitic capacitance associated with one source/drain terminal of pass transistor $W_1$' (1055).

The write signal of W1' and read signal of R1' pass through a second joint node RWN2 (1061). Parasitic capacitance 1056 couples to second joint node RWN2. Node RWN2 couples to array-internal bus 1064.

Port_1 suffers from larger read delays than does Port_2 at least due to the presence of parasitic capacitances $C_{C1}$ and $C_{P2}$ and the added propagation time of pass transistor 1053. Accordingly, Port_2 can have faster data read times than Port_1. (FIG. 10 is understood to be schematic. In alternate embodiments, single pass transistors such as 1021 may be replaced by CMOS transmission gates. Serial combinations of drivers and pass transistors such as 1043 and 1042 may be replaced by tristate drivers. The basic problem of additional parasitic capacitances in the read/write paths of Port_1 will remain.)

The basic timing diagrams for Port_1 and Port_2 have already been discussed above with reference to FIGS. 11–17. It should be understood that the access time of Port_2 (882) for read operations can be faster than the comparable access time of Port_1 (884) for read operations.

Referring to FIG. 18, one implementation 1877 of a memory control multiplexer area, such as 877 of FIG. 8, is shown. Numbers below write column 1801 (AIL#) represent the adjacent interconnect line numbers of the corresponding HIC 850. The same AIL# numbers are seen in FIG. 5. At the left side of FIG. 18, the different kinds of horizontal interconnect lines are identified as groups of four lines each with the following identifications: MaxL0 (859a), MaxL1 (859b), MaxL2 (859c), 4xL0 (854a), 8xL (858), 2xL0 (852a) and 2xL1 (852b). The dedicated, horizontal clock lines CLK2 and CLK3 are also shown at 853. Horizontal clock lines 853 are hard wired to two of the SCLK lines in bus 861, as shown. There is also a MaxL3 set in HIC 850, which MaxL3 set is not shown in FIG. 18 because no connections are provided between the MaxL3 set and SVIC 860 of the illustrated embodiment.

The lines of SVIC 860 are shown in FIG. 18 under the same designations as used in FIG. 8. Each of line groups 862, 864 and 866 is subdivided into respective components of five address lines, six control lines and five further address lines. Bit significance in each of the five-lines wide address-carrying component 862a, 862b, 864a, 864b, 866a and 866b, progresses from left to right, as follows: 0, 3, 1, 4, 2. Each SVIC address line designated as having a bit significance of 0 carries an address bit of least significance (LSaB). Conversely, each SVIC address line designated as 4 carries the most significant (MSaB) of the five address bits carried by its corresponding SVIC component 862a–866b. This significance distribution is shown, for example, at 1805.

Fully-hollowed circles such as shown at 1807 represent bidirectional PIP's in accordance with FIGS. 3A–3C.

Half-hollowed, half-shaded circles such as within dashed box 1810 each represent a unidirectional PIP that, when activated, drives a corresponding signal from a given line of HIC 850 onto an intersecting vertical line within SVIC section 862. One implementation of such unidirectional PIP's with a shared longline driver 323"/324" is shown in FIG. 3F. Each vertical longline of SMaxL section 862 (FIG. 18) corresponds to line 312" of icon 347 in FIG. 3F.

Dashed box 1810 identifies one group of five PIP's which can be individually activated so as to transfer a 5-bit address signal from respective HIC groups, MaxL0, MaxL1, MaxL2 and 4xL0, onto SVIC component 862b. Note that a more significant address bit (MSaB) of group 1810 can be driven by a line in the 4xL0 set 854a. Comparatively less significant address bits (LSaB) of group 1810 can be driven by lines in the MaxL sets 859a–859c. This arrangement allows the less significant address bits to be broadcast by the MaxL longlines while the MSaB is separately toggled in accordance with a local signal on the corresponding 4xL0 line. In dashed box 1810, the 2ND set of MaxL lines (AIL's #9, #25, #33) may drive address bits 0, 1 and 3 while BOT AIL #35 may drive address bit 2 of SMaxL component 862b.

In adjacent SMaxL component 862a, the TOP set of MaxL lines (AIL's #8, #24, #32) may drive address bits 0, 1 and 3 while BOT AIL #27 may drive address bit 2.

Dashed box 1820 highlights a connection pattern that is inverse to that of box 1810. In dashed box 1820, the 2xL0 and 2xL1 line groups 852a–852b may drive the LSaB lines 0, 1, 2 while two longer horizontal lines in 8xL line group 858 may provide the MSaB's 3–4. The longer 8xL lines may thus broadcast the upper two address bits of dashed box 1820 while the shorter 2xL lines may separately carry different lower-order address bits.

Because each PIP of FIG. 18 is individually programmable during configuration time, users may configure any desired combination of signal transfers from HIC 850 to SVIC 860 as made possible by the illustrated distribution of PIP's. Dashed box 1830 shows another possibility wherein a first group of three lines from HIC set 4xL0 (854a) is combined with another set of two lines from HIC set 8xL (858) to define the five unique address bits driven onto S4xL0 component 864a of the SVIC. LSaB's 0–1 may be driven by 8xL lines while MSaB's 2–4 may be driven by 4xL lines.

Dashed box 1840 shows yet another possibility wherein all five address bits of SVIC component 864b are derived from HIC sets 2xL0 and 2xLl.

As further seen in FIG. 18, SVIC control component 862c may acquire respective control signals from either one or both of the HIC longlines 859a–859c and the shorter HIC lines 858, 854 and 852. On the other hand, SVIC control components 864c and 866c may not acquire control signals from the HIC longlines, but rather only from the 8xL and shorter lines by way of bidirectional PIP's. More specifically, in control component 862c of the SVIC, the 3RD set of MaxL lines (AIL's #10, #26, #34) may provide three of the control signals while BOT AIL #11 provides a fourth. The partially-populated PIP's pattern of FIG. 18 of course repeats at each intersection of SVIC 860 with a HIC so that address and control signals may be sourced from different HIC's.

Figure 19A:
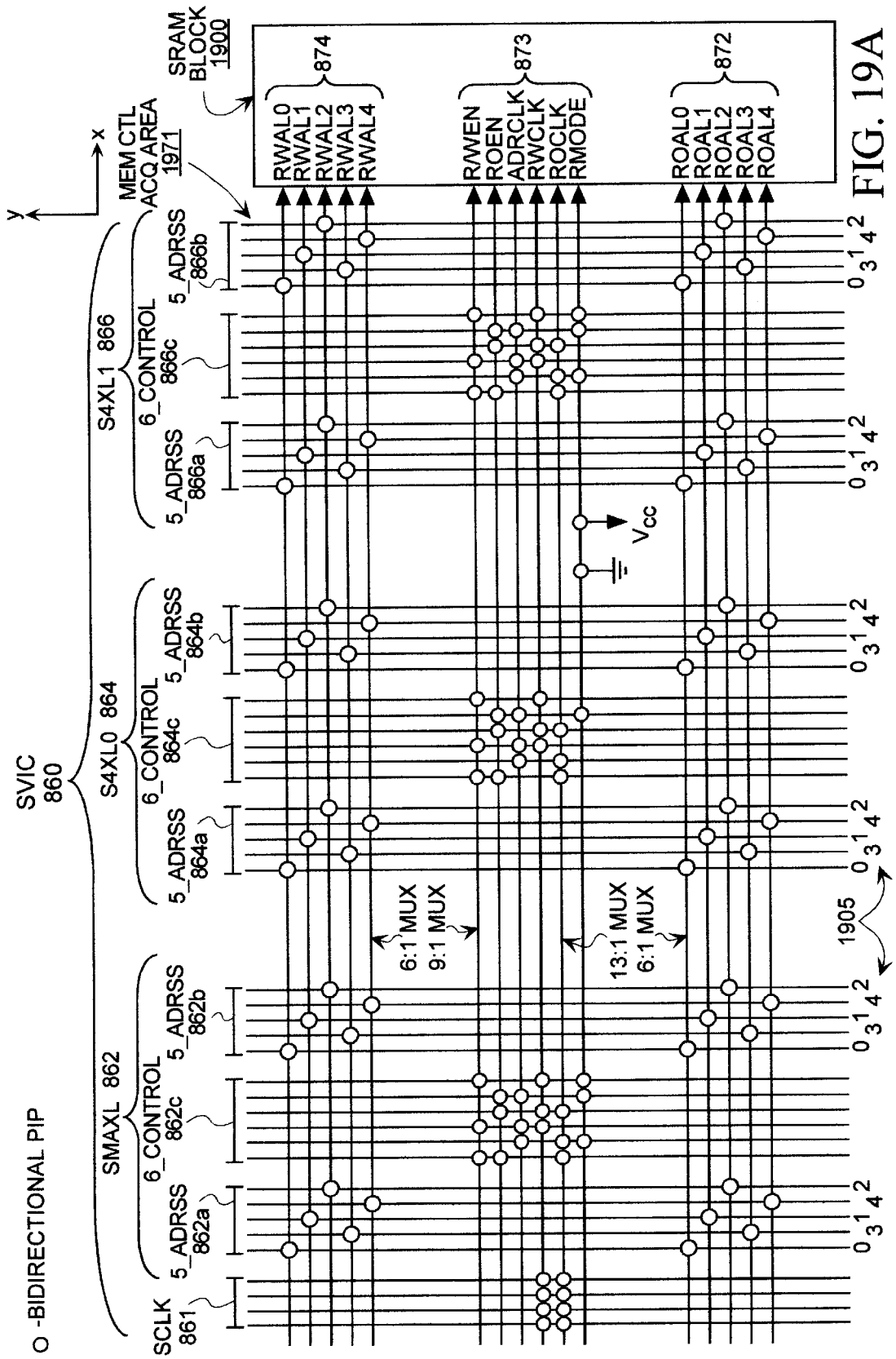
FIG. 19A is a schematic of one embodiment of FIG. 4 showing a user-configurable, intercoupling of address and control signals from an adjacent SVIC to address and control input terminals of a corresponding SRAM block.

Referring to FIG. 19A, there is shown one implementation of memory control acquisition area 1971 corresponding to area 871 of FIG. 8. FIG. 19A may be placed directly below and in alignment with FIG. 18 to see the continuation of the SVIC bus 860 from FIG. 18 into FIG. 19A.

The SRAM block shown at 1900 in FIG. 19A corresponds to the structure 900 shown in FIG. 9. Signals of control port 873 are identified with the same names as those used on control lines 931–935 of FIG. 9. The five address signals of the Port_1 address bus 874 are respectively identified as RWAL0 through RWAL4, the last being the most significant (MSaB). Similarly, address signals of the Port_2 address bus 872 are respectively identified as ROAL0 through ROAL4, where the last is the most significant.

As seen at 1905, the bit significance assigned to each of the address components of SVIC 860 correspond with the bit significance of the address ports in SRAM block 1900 due to the placement of the PIP's of FIG. 19A along each of respective address-carrying components 862a, 862b, 864a, 864b, 866a and 866b. Each address input line such as RWAL0 defines a 6-to-1 multiplexer for acquiring a respective address signal.

Except for the RWCLK and ROCLK lines, the other four control acquiring lines of port 873 each define a 9-to-1 control acquiring multiplexer. Each of the control-sourcing vertical lines in memory control acquisition area 1971 is loaded with a respective three PIP's (except for 2 lines in component 864c). Each of the vertical address lines and the SCLK lines is loaded within area 1971 with the respective two PIP's. Clock-acquiring lines RWCLK and ROCLK each define 13-to-1 multiplexers. The RMODE input line may be user-configured to remain tied to ground (logic '0') or to Vcc (logic '1') instead of being dynamically changeable on the fly.

It is, of course, understood that the PIP distribution shown in memory control acquisition area 1971 of FIG. 19A is but one of many possible variations. Other arrangements are contemplated, particularly those that load each of the horizontal, control/address acquiring line with a corresponding same number of PIP's and that further loads each vertical control/address sourcing line with a same number of PIP's.

Figure 19B:
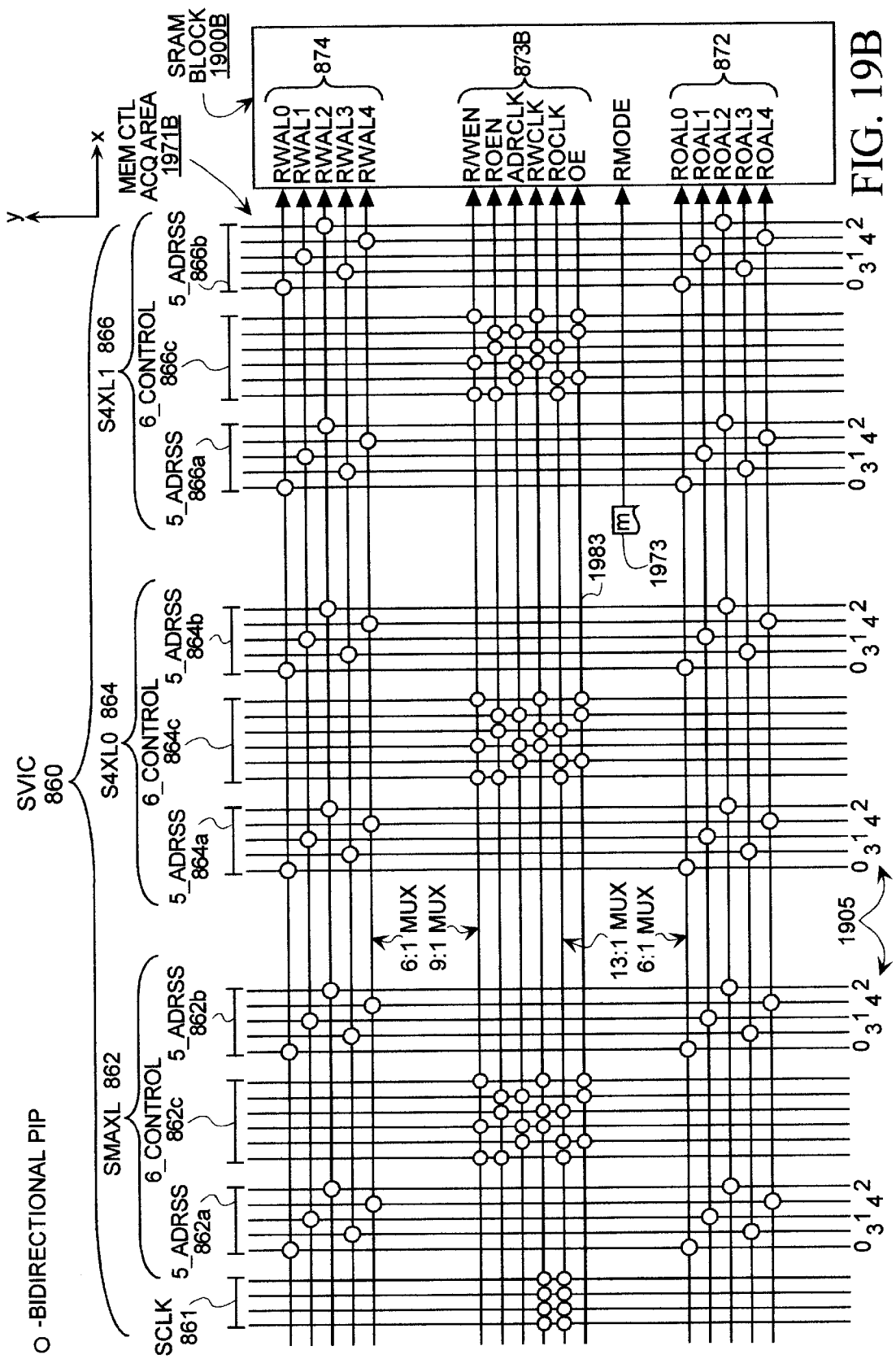
FIG. 19B is a schematic of a second embodiment of FIG. 4 showing a user-configurable, intercoupling of address and control signals from an adjacent SVIC to address and control input terminals of a corresponding second embodiment of the SRAM block.

FIG. 19B illustrates a second implementation of memory control acquisition area 1971B corresponding to area 871 of FIG. 8. The SRAM block shown at 1900B corresponds to the structure 900 shown in FIG. 9 except that the OE signal (883 in FIG. 9) is acquired by way of line 1983 from the SVIC instead of by way of area 878 (FIG. 8) from an adjacent HIC. The RMODE signal is provided from additional configuration memory portion 1973 instead of by way of SVIC 860. This means that RMODE cannot be changed on the fly as in the case of FIG. 19A. On the other hand, the OE signal (1983) can be broadcast vertically down SVIC 860 for simultaneous acquisition by multiple SRAM blocks of a same memory channel (LMC or RMC) via their respective lines 1983. Other signals of control port 873B are identified with the same names as those used in port 873 of FIG. 19A.

Figure 20:
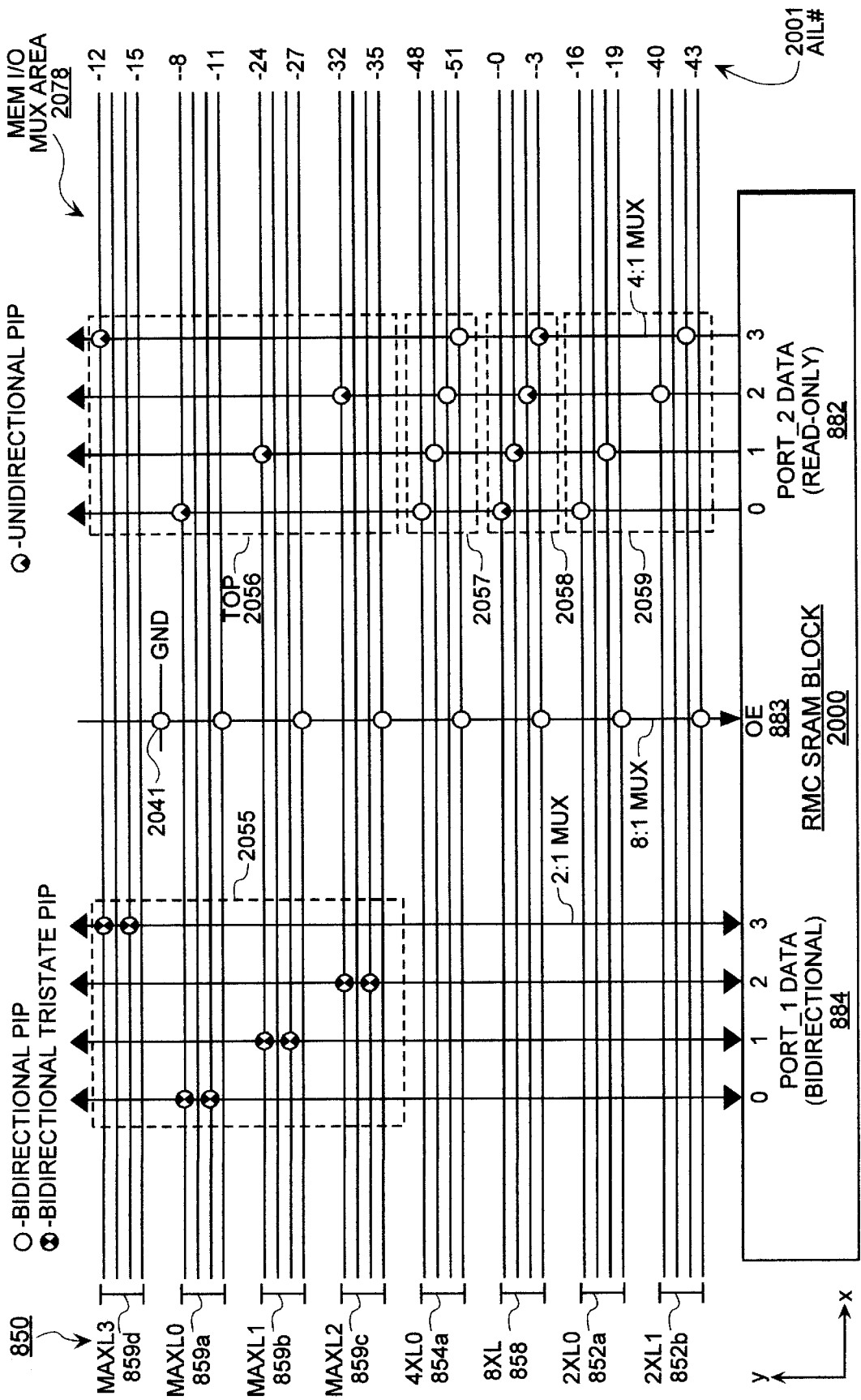
FIG. 20 is a schematic of one embodiment of FIG. 4 showing user-configurable, intercoupling of data and output enable signals between an adjacent HIC and a corresponding SRAM block in a right memory column (RMC)

Referring to FIG. 20, there is shown one implementation 2078 of a memory I/O multiplexer area corresponding to area 878 of FIG. 8. SRAM block 2000 corresponds to an implementation such as 900 (FIG. 9) in a write memory channel (RMC). Of course, if the embodiment of FIG. 19B is used, the OE line 883 and its respective connections would be removed from FIG. 20 (and also from next-described FIG. 21).

Dashed box 2055 surrounds a first set of user-configurable PIP's that permit respective coupling of the Port_1 data bits 0–3 (the last being the MSB) to respective longline sets MaxL0 (859*a*), MaxL1 (859*b*), MaxL2 (859*c*) and MaxL3 (859*d*), and more specifically to lines of the TOP set (AIL's #8, #24, #32 and #12) and/or of the 3RD set (AIL's #10, #26, #34 and #14) of the adjacent HIC. Each of the bidirectional Port_1 data lines of area 2078 defines a 2-to-1 multiplexer for purposes of input (writing data) and a 2-to-1 demultiplexer for purposes of output (reading data). In one embodiment, the bidirectional tristateable PIP's of FIG. 3E are used as indicated by the double-V in-a-circle icons of area 2055 that match that of 337 in FIG. 3E. In the latter case, the PIP_EN line 316' is driven by read-enabling line 943 of FIG. 9. Of course, other implementations of bidirectional PIP's may be alternatively used in area 2055.

OE line 883 (if present, as in the embodiment of FIG. 19A) defines an 8-to-1 multiplexer with respective PIP's coupled to each of the following HIC line sets: MaxL0 (859*a*–BOT), MaxL1 (859*b*–BOT), MaxL2 (859*c*–BOT), 4xL (854*a*), 8xL (858), 2xL0 (852*a*) and 2xL1 (852*b*). In this particular embodiment there is no PIP for connecting OE line 883 to the MaxL3 (859*d*) longline set. There is a PIP 2041, however, for configurably forcing OE line 883 to logic '0' (GND) and for thereby disabling the Port_1 data bus 884 from outputting read data.

Dashed box 2056 surrounds user-configurable PIP's that permit coupling of the Port_2 output data 882 to respective longline sets MaxL1 through MaxL3. More specifically, data bit 0 of Port_2 can couple to TOP longline #8 of MaxL0, while respective other data bits 1–3 of the same Port_2 can respectively couple to TOP AIL's #24 (MaxL1), #32 (MaxL2) and #12 (MaxL3).

Dashed box 2057 contains four user-configurable PIP's for enabling coupling of the Port_2 data 882 onto respective four lines of the 4xL HIC set 854*a*.

Dashed box 2058 similarly contains four PIP's for providing user-configurable coupling of Port_2 data onto respective four lines of the 8xL HIC set 858. Dashed box 2059 contains a distributed set of PIP's for providing user-configurable coupling of Port_2 data onto the 2xL0 (852*a*) and 2xL1 (852*b*) HIC sets.

In one embodiment, the unidirectional tristateable PIP's of FIG. 3D are used for outputting data of Port_2 onto longlines as indicated by the single-V in-a-circle icons of TOP area 2056 that match that of 325 in FIG. 3D. In the latter case, the PIP_EN line 316 is driven by read-enabling line 944 of FIG. 9. Of course, other implementations of bidirectional PIP's may be alternatively used in area 2056. Use of tristateable PIP's in box 2058 is also optional and such drives for the 8xL lines may be replaced with smaller, transmission gate implementations such as that of FIG. 3B.

Note that within the memory-I/O area 2078, each unidirectional line of the Port_2 data bus 882 defines a 4-to-1 demultiplexer. Thus the capacitive loading onto each of the lines in bus 882 is essentially the same.

Figure 21:
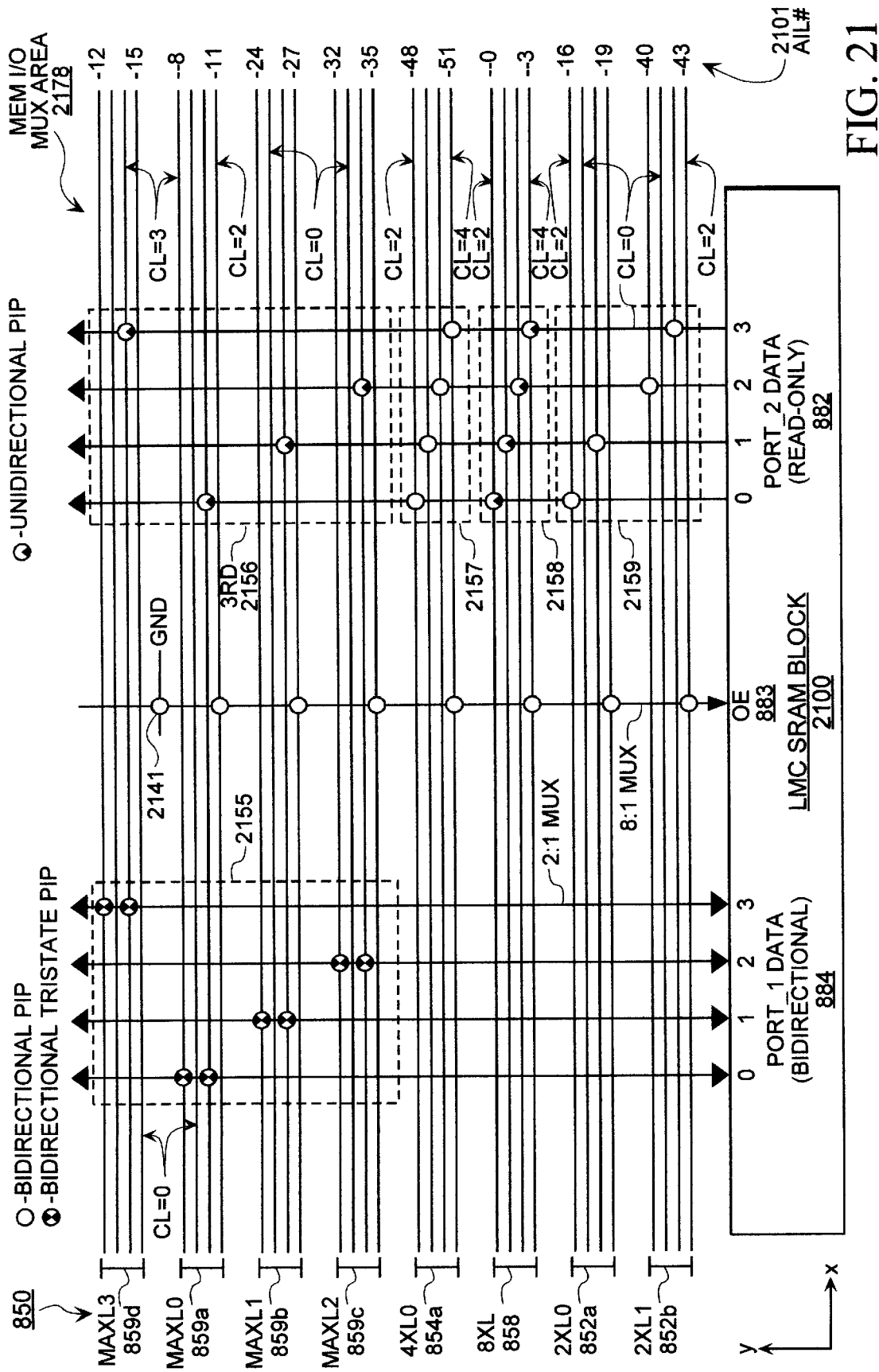
FIG. 21 is a schematic of one embodiment of FIG. 4 showing user-configurable, intercoupling of data and output enable signals between an adjacent HIC and a corresponding SRAM block in a left memory column (LMC)

FIG. 21 shows the corresponding memory I/O multiplexer area 2178 in the left memory channel (LMC). Like reference numbers in the "2100" century series are used in FIG. 21 for elements having like counterparts numbered in the "2000" century series of FIG. 20. As such, the description of FIG. 20 is generally incorporated herein for FIG. 21.

One difference in FIG. 21 occurs within dashed box area 2156. Here, each of the PIP's is shifted down by two longlines as compared to the PIP's of TOP area 2056 of FIG. 20. Thus the PIP's of area 2156 provide configurable connectivity to the 3RD set (AIL's #10, #26, #34 and #14) of the adjacent HIC.

When FIGS. 20 and 21 are put side by side and considered in combination for the number of additional PIP's that are loaded onto each of the HIC lines as a result of combined areas 2078 and 2178, it is seen that lines such as AIL's #13, #15 and #9 bear no additional loading as a result of combined areas 2078 and 2178. This combined additional loading by areas 2078 and 2178 is designated in FIG. 21 as CL=0 (no additional, combined loading). Longlines such as #14 and #8 have a combined additional loading of 3 PIP's (CL=3) as a result of combined areas 2078 and 2178. Note that the CL=3 configuration of TOP and 3RD sets of longlines permit cascading of data from the Port_2 data output 882 of either SRAM block (2000 or 2100) for writing into the Port_1 data bus 884 of the SRAM block of the opposed memory column (to 2100 and 2000, respectively).

Longlines that are respectively used for OE control have an additional loading factor of 2 PIP's (CL=2). These longlines include BOT AIL's #11, #27 and #35.

Quad-length lines #48, #49 and #50 bear an additional load of CL=2. Quad-length line #51 has an additional load of CL=4. Octal-length lines #0, #1 and #2 similarly have an additional loading of CL=2 while quad-length line #3 has an additional loading of CL=4.

Double-length horizontal lines #16, #18, #19, #40, #42 and #43 each have an additional loading of CL=2. Double-length lines #17 and #41 have no additional loading (CL=0) due to combined areas 2078 and 2178. It is understood, of course, that variations on the teachings of FIGS. 20 and 21 may be used in accordance with the invention for corresponding loadings on the HIC lines and the data acquiring lines.

Table 1 shows various configurations of interconnect that can be provided along a given HIC, where respective TOP and 3RD longlines of that HIC may be driven (mastered) by one or another of the LMC (114) and RMC (116) or by another bus master.

TABLE 1

| Config | TOP SET AIL's #8, 24, 32, 12 (driven by R) | | | | 3RD SET AIL's #10, 26, 34, 14 (driven by R) | | | | Config Notes |
|---|---|---|---|---|---|---|---|---|---|
| | FIG. 20 RMC | | FIG. 21 LMC | | FIG. 20 RMC | | FIG. 21 LMC | | |
| # Box = | 55 RW | 56 RO | 55 RW | 56 RO | 55 RW | 56 RO | 55 RW | 56 RO | |
| PIP off/on (0/1) X = none | 0 | 0 | 0 | X | 0 | X | 0 | 0 | No coupling to TOP and 3RD MaxL lines |
| A | 1 RW | 0 | 0 | X | 0 | X | 1 RW | 0 | >RMC Port_1 RW op's conducted on TOP set >LMC Port_1 RW op's conducted on 3RD set (8 bits total) |
| B1 | 1 R | 0 | 1 W | X | 0 | X | 0 | 0 | >RMC Port_1 driving one of TOP & 3RD sets >LMC Port_1 |

TABLE 1-continued

| Config | TOP SET AIL's #8, 24, 32, 12 (driven by R) | | | | 3RD SET AIL's #10, 26, 34, 14 (driven by R) | | | | Config Notes |
|---|---|---|---|---|---|---|---|---|---|
| | FIG. 20 RMC | | FIG. 21 LMC | | FIG. 20 RMC | | FIG. 21 LMC | | |
| # Box = | 55 RW | 56 RO | 55 RW | 56 RO | 55 RW | 56 RO | 55 RW | 56 RO | |
| B2 | 0 | 0 | 0 | X | 1 W | X | 1 R | 0 | receiving on same one of TOP & 3RD sets (4 bit cascade) >LMC Port_1 driving one of TOP & 3RD sets >RMC Port_1 receiving on same one of TOP & 3RD sets (4 bit cascade) |
| C1 | 1 W | 1 R | 0 | X | 0 | X | 1 W | 0 | >RMC Port_2 driving TOP set, other nibble master driving 3RD set >RMC & LMC Port_1's receiving 8 bits total on TOP and 3RD sets |
| C2 | 0 | 0 | 1 W | X | 1 W | X | 0 | 1 R | >LMC Port_2 driving 3RD set, other master driving TOP >LMC & RMC Port_1's receiving on TOP and 3RD sets |
| D | 0 | R | 0 | X | 0 | X | 0 | R | >Other Bus Masters driving TOP and 3RD sets >RMC & LMC Port_1's receiving on TOP and 3RD sets |

At any given instance, no more than one tristate driver should be outputting to a given longline. Otherwise, there would be bus mastering contention. Table 1 is organized as two major columns, one for the TOP set (AIL's #8, #24, #32 and #12) and the other for the 3RD set (AIL's #10, #26, #34 and #14). It assumes that out-enables are generally not being used for time-domain multiplexing. Under this condition, the bus master for the given line, if any, is the memory port that is reading out (R) data onto the corresponding line. The PIP's on each such AIL are individually identified in Table 1 by whether they are located in the RMC (FIG. 20) or the LMC (FIG. 21), and then whether they are located within dashed box 2×55 or 2×56, where the digits 2× can be either 20 or 21 as defined by the Fig. number.

The state of each individual PIP in Table 1 is indicated as '0' if the corresponding PIP is inactive or open and as '1' if the PIP is activated to form a connection between its crossing lines. For each activated PIP, it is further indicated whether the corresponding memory port is either reading (R) or writing (W) or performing both operations (RW) on a time-multiplexed basis.

Most of the rows of Table 1 have a configuration number assigned in the leftmost column and additional notes about the configuration placed in the rightmost column.

Configuration #A illustrates the case where coupling between the embedded memory and only the TOP set is provided only by correspondingly activated PIP's in dashed box 2055; and further wherein coupling between the embedded memory and only the 3RD set is provided only by correspondingly activated PIP's in dashed box 2155. Under this condition, each corresponding Port_1 in the RMC (FIG. 20) and in the LMC (FIG. 21) may be performing either a respective read or write operation on its respective TOP set or 3RD set of longlines without competing with one another for same longlines. As many as 8 bits of memory data may be moving at the same time through the Ma×L lines of each given HIC for writing into or reading from the RMC (FIG. 20) and LMC (FIG. 21) read/write ports of the HIC-adjacent SRAM block.

The row directly above that of configuration #A represents the case whether there is no coupling between the embedded memory and either of the TOP and 3RD longline sets. In this case, other resources within the FPGA chip 100 such as adjacent SVGB's and adjacent IOB's may be using the TOP and 3RD longline sets without competition from the embedded memory. Alternatively, signals can be transferred from intersecting switch boxes onto the TOP and 3RD longline sets. Data may still be simultaneously read out from the embedded memory via the read only ports and the 2×L, 4×L, 8×L lines.

Configuration #B1 represents the case where RMC Port_1 (FIG. 20) is outputting four respective bits of stored data for writing into LMC Port_1 (FIG. 21) by way of the TOP longline set. Alternatively, if the R and W indicators are moved to the right side of Table 1, that would represent RMC Port_1 sending 4 bits of stored data to LMC Port_1 via the 3RD longline set.

Configuration #B2 represents the converse situation where LMC Port_1 is driving data by way the 3RD longline set into RMC port 1.

Configuration #C1 represents the situation where RMC Port_2 (read-only) is outputting 4 bits of stored data onto the TOP longline set while the same data is being written from the same TOP longline set into Port_1 of the RMC. In the same configuration #C1 a non-memory bus master is driving the 3RD longline set while the latter data is being simultaneously written into Port_1 of the IMC. Configuration #C2 shows an inverse situation where the IJMC Port_2 (read-only) is outputting 4 bits of stored data onto the 3RD longline set for writing into RMC Port_1 (read/write).

Configuration #D shows the situation where data is being simultaneously sourced from the RMC and LMC read-only ports (Port_2) respectively onto the TOP longline set and the 3RD longline set.

Configurations other than those explicitly shown in Table 1 may also be used while keeping in mind that the X symbol indicates there is no PIP at the respective position and that the read-only port (Port_2) cannot perform a write operation. Multiple ones of the ports can be performing read operations for outputting data onto a same AIL on a time-multiplexed basis by using appropriate ones of the OE (883), ROEN (936), and R/WEN (934) control signals for defining noncontentious time slots for each of the respective read operations.

Figure 22:
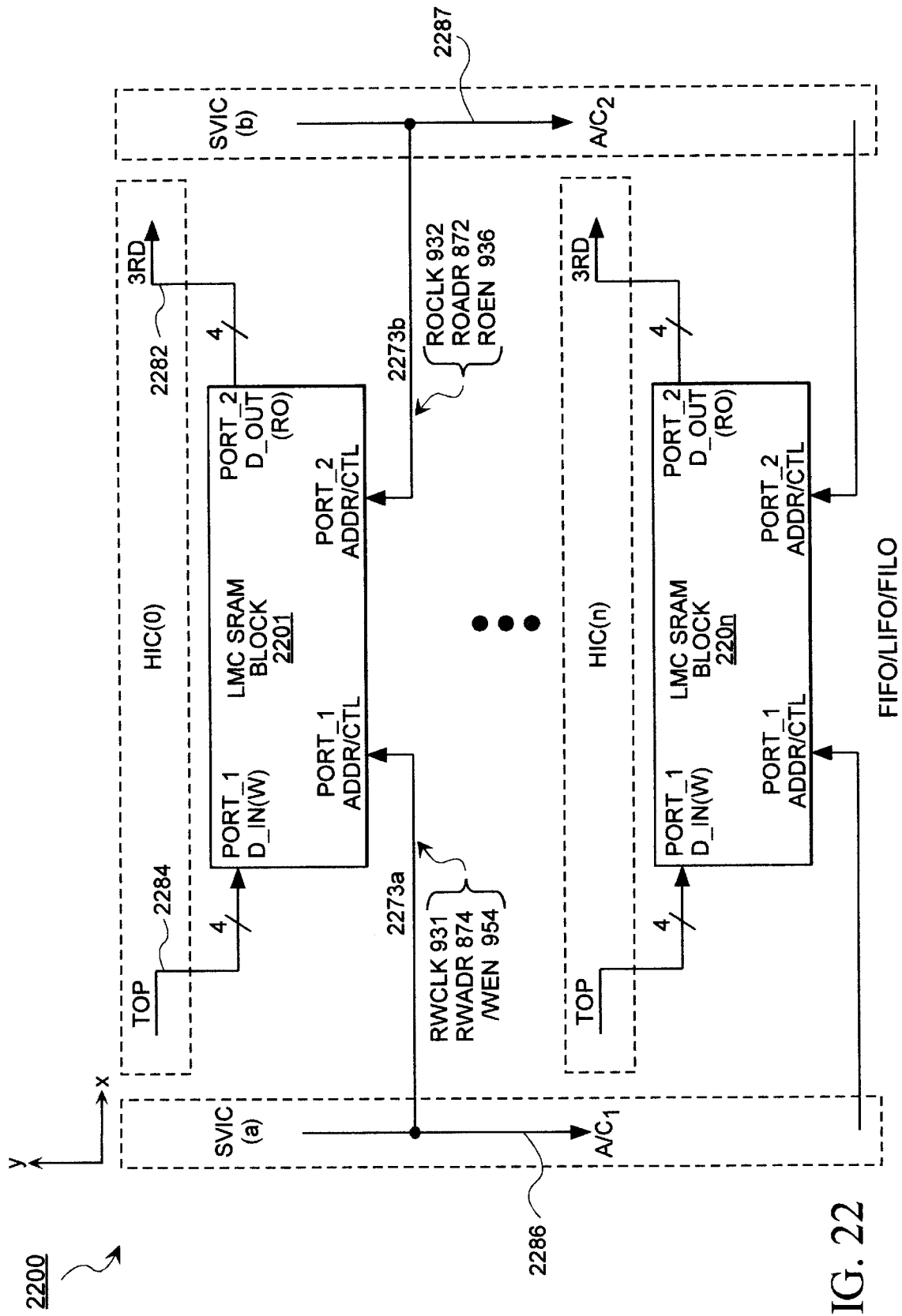
FIGS. 22 and 23 diagram configurations for LIFO or like data buffering structures that may be respectively implemented in the LMC and RMC.

FIG. 22 illustrates a basic implementation 2200 within the context of the FPGA embedded memory architectures disclosed herein for one of a FIFO (first-in/first-out) or a LIFO (last-in/first-out) or a FILO (first-in/last-out) structure or other like buffering structures. As well known, FIFO's and the like have separately clocked inputs and outputs which may be used for transferring signals either between an asynchronous first digital system and a synchronous second digital system or between two synchronous digital systems that operate at different clock rates and/or phases.

LMC SRAM block 2201 is illustrated as being configured to receive first parallel data (up to 4 bits wide) from TOP longline set 2284 into its Port_1 for writing into memory. The corresponding clock, address and write-enable signals are received by bus 2273a from SVIC portion (a).

LMC SRAM block 2201 is further illustrated as being configured to read out second parallel data (up to 4 bits wide) to 3RD longline set 2282 from its Port_2 (read-only port). The corresponding clock, address and read-enable signals are received by bus 2273b from SVIC portion (b). SVIC portions (a) and (b) are part of a same user-configurable SVIC in the LMC (Left Memory Column, see 860 of FIG. 8) but are shown as separate entities for purposes of explanation.

The respective address signals, RWADR 874 and ROADR 872 of respective ports, Port_1 and Port_2 may be generated independently as desired and over time in any appropriate sequence so as to implement a FIFO, or LIFO, or any other such data buffering structure. The respective clock signals, RWCLK 931 and ROCLK 932 may also be generated independently as desired over time in any appropriate rate and/or phase. Write-enabling for Port-1 and read-enabling for Port_2 may be further controlled if desired with respective control signals, /WEN 954 and ROEN 936.

The number of data bits that are simultaneously transferred through such a FIFO/LIFO/Other structure 2200 can be granularly modified as desired by further providing additional SRAM blocks such as 220n in the same LMC and with the same configurations. Note that the same control signals (clocks and addresses) may be broadcast vertically along the SVIC as indicated by lines 2286 and 2287 for respective address/control sets A/C$_1$ and A/C$_2$ so that a relatively small amount of interconnect resources may be used to similarly control plural SRAM blocks.

Figure 23:
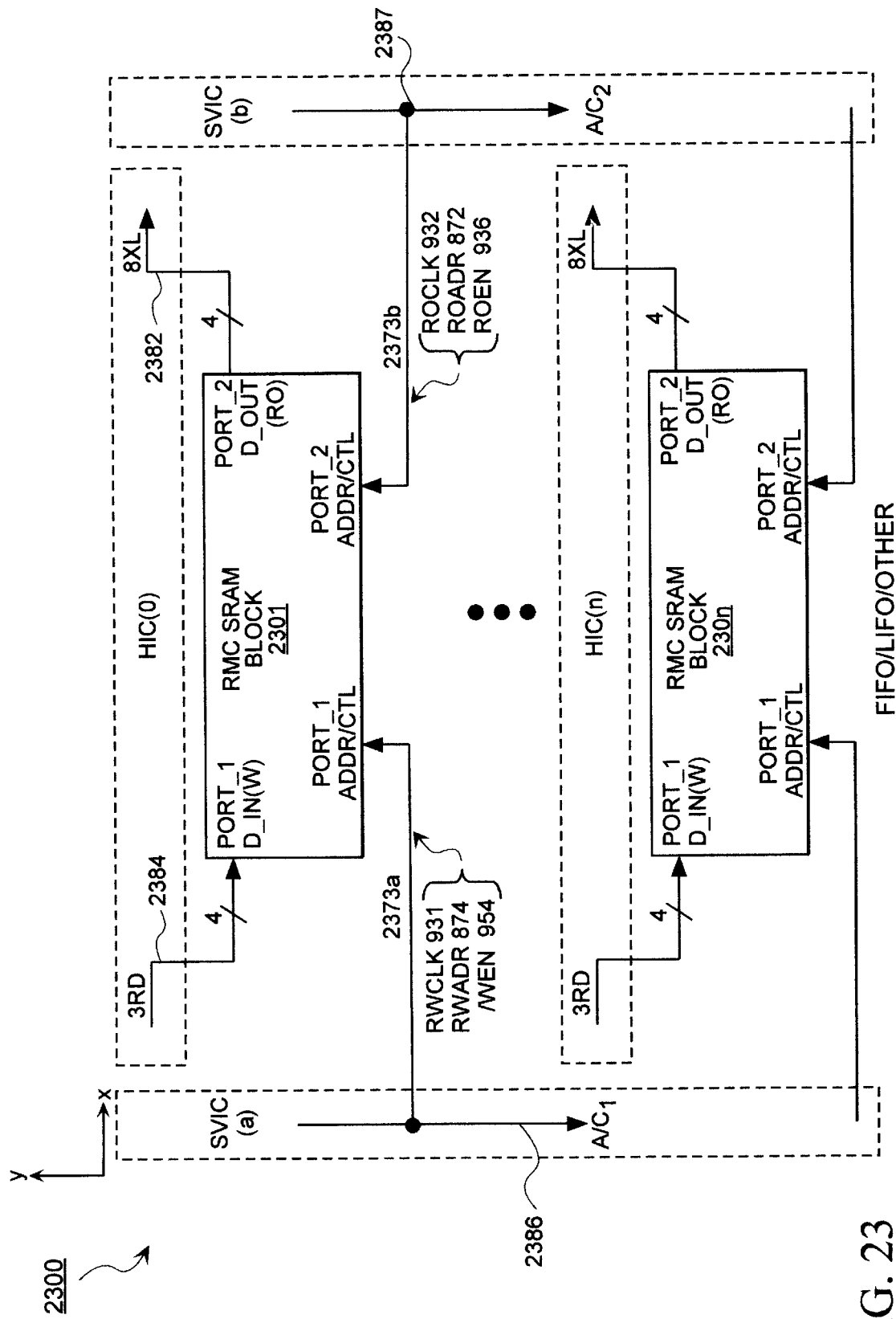

FIG. 23 illustrates a similar configuration 2300 for the Right Memory Column (RMC) which may be used to implement a FIFO/LIFO/Other data buffering structure. Like reference numbers in the "2300" century series are used in FIG. 23 for elements having like counterparts numbered in the "2200" century series of FIG. 22. As such, the description of FIG. 22 is generally incorporated herein for FIG. 23. Note that unlike FIG. 22, bus 2384 (Port_1) is configured to connect to the 3RD longline set and bus 2382 (Port_2) is configured to connect to and drive the 8×L lines set (858). Alternatively, of course, bus 2382 (Port_2) could have been configured to connect to and drive 4 lines in any one of the 4×L or 2×L lines sets. The implementations 2200 (FIG. 22) and 2300 (FIG. 23) may be used simultaneously to create deeper FIFO/LIFO or other such buffering structures. Line contention is avoided in such an arrangement because the TOP longline set services Port_1 of implementation 2200, the 3RD longline set services Port_2 of implementation 2200 and at the same time Port_1 of implementation 2300, and the 8×L octal-length line set (858) services Port_2 of implementation 2300. Although not shown, it is understood that the left-side IOB's may be driving three-quarters of the TOP longline set while additional right-side IOB's may be driving the remaining one-quarter of the TOP longline set so as to import chip-external signals into the described FIFO/LIFO/other structure.

Figure 24:
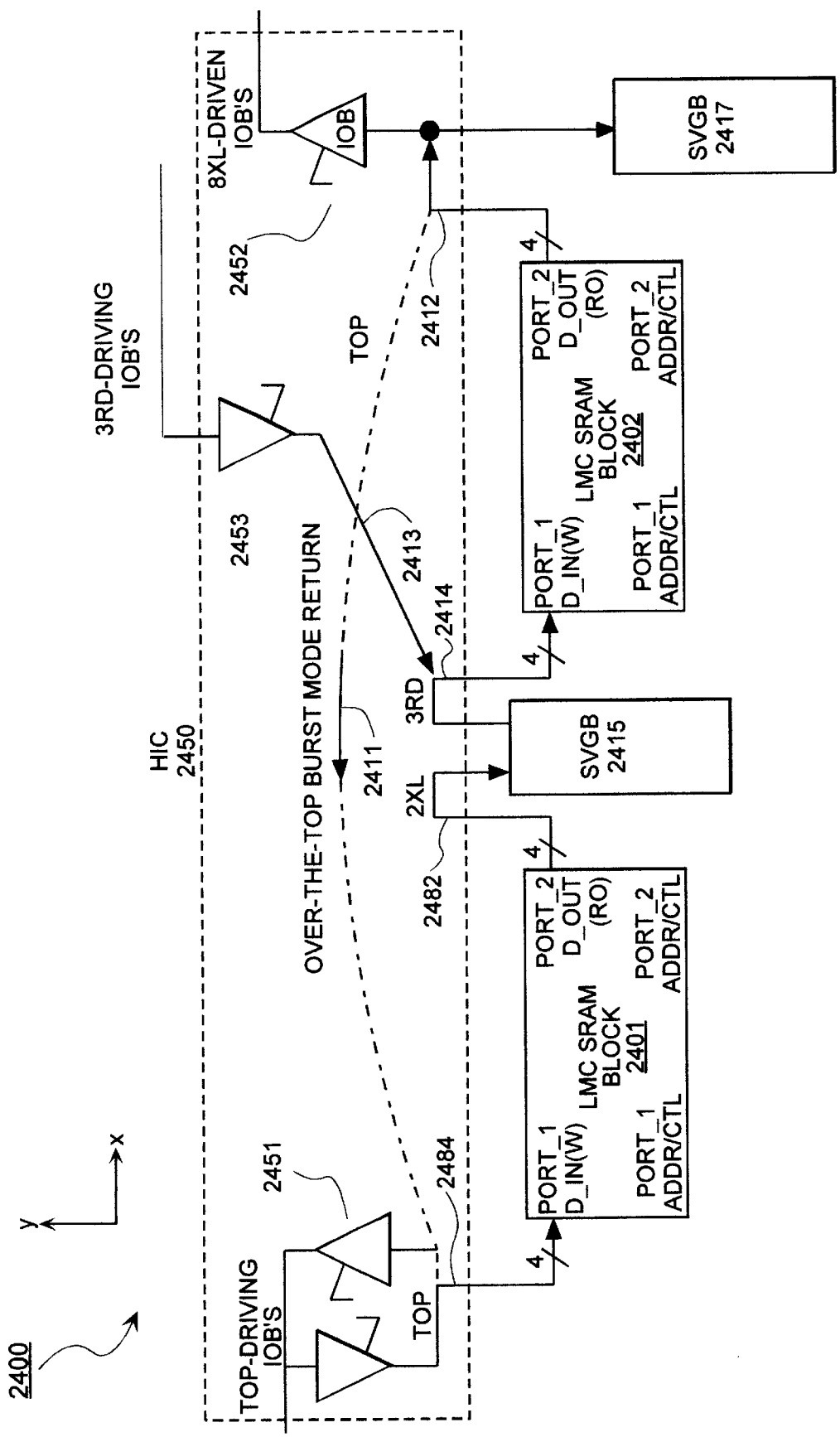
FIG. 24 diagrams a configuration wherein intermediate SVGB processing occurs between data buffering structures implemented in the LMC and RMC.

FIG. 24 illustrates another configuration 2400 in which a first SVGB 2415 (preferably positioned in the central columns 115) is provided for processing the Port_2 output data of LMC SRAM block 2401 prior to sending the processed data to Port_1 of RMC SRAM block 2402.

Dashed box 2450 represents the adjacent HIC. TOP-driving IOB's are shown at 2451. 8×L-driven IOB's are shown at 2452. 3RD-driving IOB's are shown at 2453. Connection 2484 represents the coupling via the TOP longline set to Port_1 of the LMC block 2401 of signals acquired from outside the FPGA chip 100 by the TOP-driving IOB's 2451. Connection 2482 represents the coupling via 2×L lines (or alternatively via 4×L, or 8×L lines) of stored data signals from Porte2 of LMC block 2401 to first SVGB 2415. Connection 2414 represents the coupling via the 3RD longline set to Port_1 of the RMC block 2402 of result signals produced by the first SVGB 2415. Connection 2412 represents the coupling of stored data signals from Port_2 of RMC block 2402 to subsequent circuitry.

The coupling of connection 2412 can occur via any one or more of 2×L, 4×L, 8×L lines or even Ma×L lines. Dashed return path 2411, for example, represents a possible return of the RMC output data back to IOB's 2451 via the same TOP longline set that is used by connection 2484. In this case, of course, the TOP longline set is shared on a time-multiplexing basis by the tristate longline drivers of IOB's 2451 and those of RMC Port_2. Data processing is preferably carried out on a pipelined burst mode basis wherein newly-acquired input data is transferred via the TOP longline set 2484 during a first time slot into LMC 2401. In a subsequent second time slot, already-processed data is transferred via the TOP longline set 2411 for output from the chip 100 by the same TOP-driving IOB's 2451 that initially acquired the pre-processing input data.

Connection 2413 represents the coupling via the 3RD longline set to Port_1 of the RMC block 2402 of input data acquired by the 3RD-driving IOB's 2453. Of course, the 3RD longline set would have to be shared on a time-multiplexing basis by the tristate longline drivers of IOB's 2453 and those of SVGB 2415 if both are going to supply data into RMC Port_1.

The subsequent circuitry for connection 2412 can include further processing circuits such as the illustrated second SVGB 2417 and/or circuitry for outputting data from the chip 100 such as the illustrated 8×L-driven IOB's 2452. A variety of other uses and configurations should become apparent to those skilled in the art based on the foregoing discussion. Of course, data-width can be expanded granularly as was done in FIGS. 22–23 by broadcasting same address and/or control signals along the respective Left and Right Memory Columns (LMC and RMC). Storage data depth can also be expanded granularly as will be explained later for FIGS. 27–28.

Figure 25:
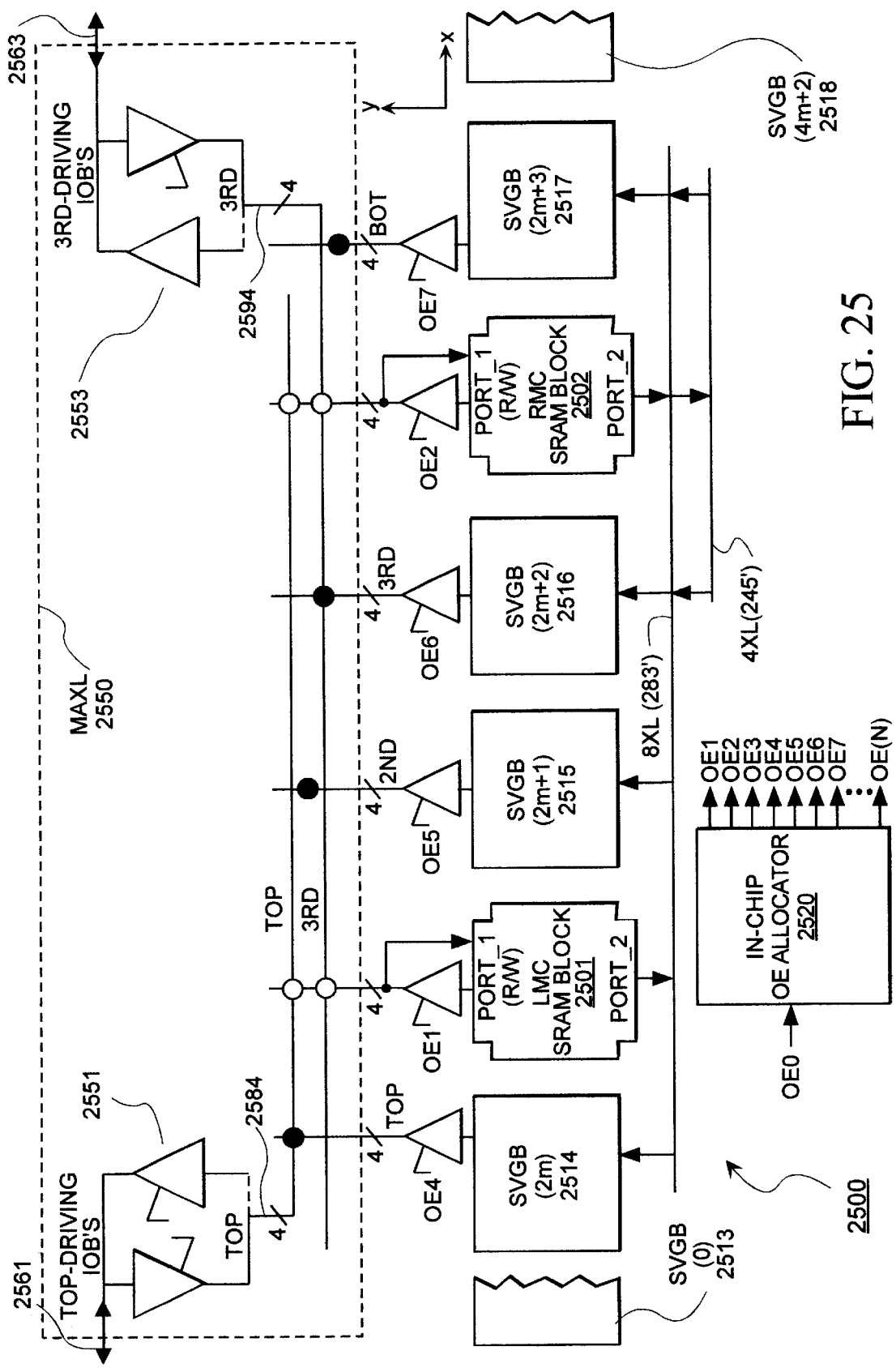
FIG. 25 diagrams a configuration wherein a bidirectional interconnect bus that extends out of the FPGA device is shared by plural blocks of embedded memory through first ports (RW ports) thereof while memory stored data is transferred at high-speed out of second ports (RO ports) thereof by way of shorter interconnect lines.

FIG. 25 provides another view of an FPGA chip 2500 conforming to the above principles. A Ma×L lines portion of a given HIC is shown within dashed box 2550. Portion 2550 includes TOP longline set 2584 (4 MaxL lines) and 3RD longline set 2594 (another 4 MaxL lines). A first set of four IOB's is denoted at 2551 as TOP-driving IOB's. Each such TOP-driving IOB has a tristate longline driver for driving a chip-external signal onto respective MaxL line of the TOP longline set 2584. Each such TOP-driving IOB further has a tristate external-line driver for driving a chip-internal signal onto respective line of an external bus 2561. The TOP-driving IOB's 2551 can be configured so that the TOP longline set 2584 can function as a bidirectional extension of four respective lines of the chip-external bus 2561.

A second set of four IOB's is denoted at 2553 as 3RD-driving IOB's. Each such 3RD-driving IOB has a tristate longline driver for driving a chip-external signal onto respective MaxL line of the 3RD longline set 2594. Each such TOP-driving IOB further has a tristate external-line driver for driving a chip-internal signal onto respective line of a second external bus 2563. The 3RD-driving IOB's 2553 can be configured so that the 3RD longline set 2594 can function as a bidirectional extension of four respective lines of the second chip-external bus 2563. The first and second chip-external buses, 2561 and 2563 may each be part of a wider outside-the-chip bus, in which case the combination of TOP longline set 2584 and 3RD longline set 2594 can function as a bidirectional extension of the outside-the-chip bus, 2561/2563.

Tristate longline drivers of respective SRAM blocks 2501 (LMC) and 2502 (RMC) are shown outside their SRAM blocks for purposes of explanation. These illustrated drivers each correspond to element 974 of FIG. 9. Tristate longline drivers of respective SVGB's 2514–2517 are also shown outside their SVGB's for purposes of explanation. These drivers each correspond to elements N1–N4 of FIGS. 7A–7D.

It is assumed that there is a total of 4m+3 SVGB's in each row of FPGA chip 2500, where m is an integer greater than zero. SVGB 2513 is the leftmost one of its respective super row and is numbered as SVGB(0). SVGB 2518 is the rightmost one of the same super row and is numbered as SVGB(4m+2). SVGB 2515 is approximately the rightmost one of the left half of the super row and is numbered as (2m+1). SVGB 2516 is the approximately the leftmost one of the right half of the super row and is thus numbered as (2m+2). SVGB's 2514 and 2517 are correspondingly numbered as (2m) and (2m+3). SRAM block 2501 is located between SVGB's 2514 and 2515. SRAM block 2502 is located between SVGB's 2516 and 2517.

The illustrated example assumes that SVGB(0) 2514 drives the TOP longline set. SVGB's numbered as 4, 8, . . . 4m therefore also drive the TOP longline set. The shared tristate longline drivers (N1–N4) of SVGB 2514 are therefore shown coupled to the TOP longline set 2584 in accordance with FIG. 7A. Similarly, the shared tristate longline drivers (N1–N4) of SVGB 2515 couple to the 2ND longline set in accordance with FIG. 7B, the shared tristate longline drivers (N1–N4) of SVGB 2516 couple to the 3RD longline set 2594 in accordance with FIG. 7C, and the shared tristate longline drivers (N1–N4) of SVGB 2517 couple to the BOT longline set in accordance with FIG. 7D. The Port_1 tristate longline drivers of LMC SRAM block 2501 and RMC SRAM block 2502 are configurably couplable to either of the TOP and 3RD longline sets, 2584 and 2594 in accordance with FIG. 20–21.

Output enabling lines of the tristate longline drivers of SVGB's 2514–2517 are respectively identified as OE4–OE7. Output enabling lines of the tristate longline drivers of SRAM blocks 2501 and 2502 are respectively identified as OE1 and OE2. As seen in FIG. 25, because any one of SRAM blocks 2501, 2502 or any one of 50% of the SVGB's in the row (e.g., SVGB(0), SVGB(2), SVGB(2m), SVGB(2m+2), SVGB(4m+2)) can become a bus master over at least one of the TOP and 3RD longline sets, 2584 and 2594, some means should be provided for determining which one is bus master at which point in time. Such a means is identified in the example of FIG. 25 as an in-chip OE allocator 2520. OE allocator 2520 may activate a respective two of output enabling lines OE1–OE(N) for picking the respective bus master of the TOP and 3RD longline sets, 2584 and 2594. OE allocator 2520 may further activate a respective two of output enabling lines OE3–OE(N−1) for picking the respective bus master of the 2ND and BOT longline sets, where OE3 (not shown) is an output enabling line of a device that can master the 2ND or BOT longline set. The in-chip OE allocator 2520 may be implemented by in-chip VGB's or SVGB's that drive either horizontal or vertical buses for distributing the respective output enabling signals, OE1–OE(N). For the embodiment of FIG. 19A, the SRAM OE signal (883) will eventually be transmitted through a HIC for coupling into the corresponding SRAM block as shown in FIGS. 20–21. For the embodiment of FIG. 19B, the SRAM OE signal (1983) will eventually be transmitted through a SVIC 860 for coupling into the corresponding SRAM block 1900B. For SVGB's having shared control sections such as Crtl of FIG. 4, the corresponding DYOE signal (see FIGS. 7A–7D) may be configurably acquired from either one of an adjacent HIC or a VIC.

In cases where the chip-internal, TOP and 3RD longline sets, 2584 and 2594 are serving as extensions of respective chip-external buses, 2561 and 2563, a time slot allocating signal OE0 will typically be supplied to the OE allocator 2520 to indicate that—as opposed to giving control to an external bus master—one of the longline driving resources within the FPGA chip 2500 may become master over the overall bus (which bus extends both inside and outside chip 2500). The internal-enabling signal, OE0 may be sourced from outside chip 2500 or may be developed within chip 2500 and sent out to let external devices know when chip 2500 is asserting mastery over the overall bus (e.g., 2561 plus 2584).

It can be appreciated that buses 2584 and/or 2594 may be congested with heavy data traffic, and that as a result, each of SRAM blocks 2501 and 2502 may have barely enough time slots allocated to them for importing data (writing data) into their respective memory arrays, let alone for exporting stored data out to the shared buses 2584 and/or 2594. It can be seen however, that Port_2 connections to 2xL, 4xL, or 8xL lines of the same HIC may serve as high-speed backdoors by way of which memory stored data can be read out more quickly for use by neighboring SVGB's. The illustrated example shows 8xL line 283' (see also FIG. 2) being shared on a time-multiplexed basis by the tristateable Port_2's of the LMC SRAM block 2501 and of the RMC SRAM block 2502 for transferring stored data to any one or more of SVGB's 2514–2517. Additionally, or alternatively, a 4xL line such as 245' may be used for quickly transferring stored data from a single one of the SRAM blocks (e.g., 2502) to immediately neighboring SVGB's (such as 2516 and 2571 for the case of RMC SRAM block 2502).

One contemplated usage method has each of SRAM blocks 2501 and 2502 functioning as a FIFO for acquiring raw data in appropriate time slots from outside FPGA chip 2500 by way of IOB's 2551 and/or 2553 and respective buses 2584 and/or 2594. The so acquired and stored data is then passed on to available SVGB's in FIFO style via the backdoor pathways (283' or 245') for subsequent processing. The SVGB's (2514–2517) have internal registers in which they may store result data produced from such processing. When an appropriate time slot is signaled to each such SVGB (2514–2517) by its respective output enabling signal (OE4–OE7), the register-stored, result data of that SVGB may be output onto the time-multiplexed bus (2561/2584 and/or 2594/2563) for acquisition by a subsequent processing unit. The subsequent processing unit may be yet another chip-internal SVGB that can acquire data from the MaxL lines 2550 or a chip-external device (e.g., another like FPGA device) that can acquire data from the chip external buses 2561 and/or 2563.

Figure 26:
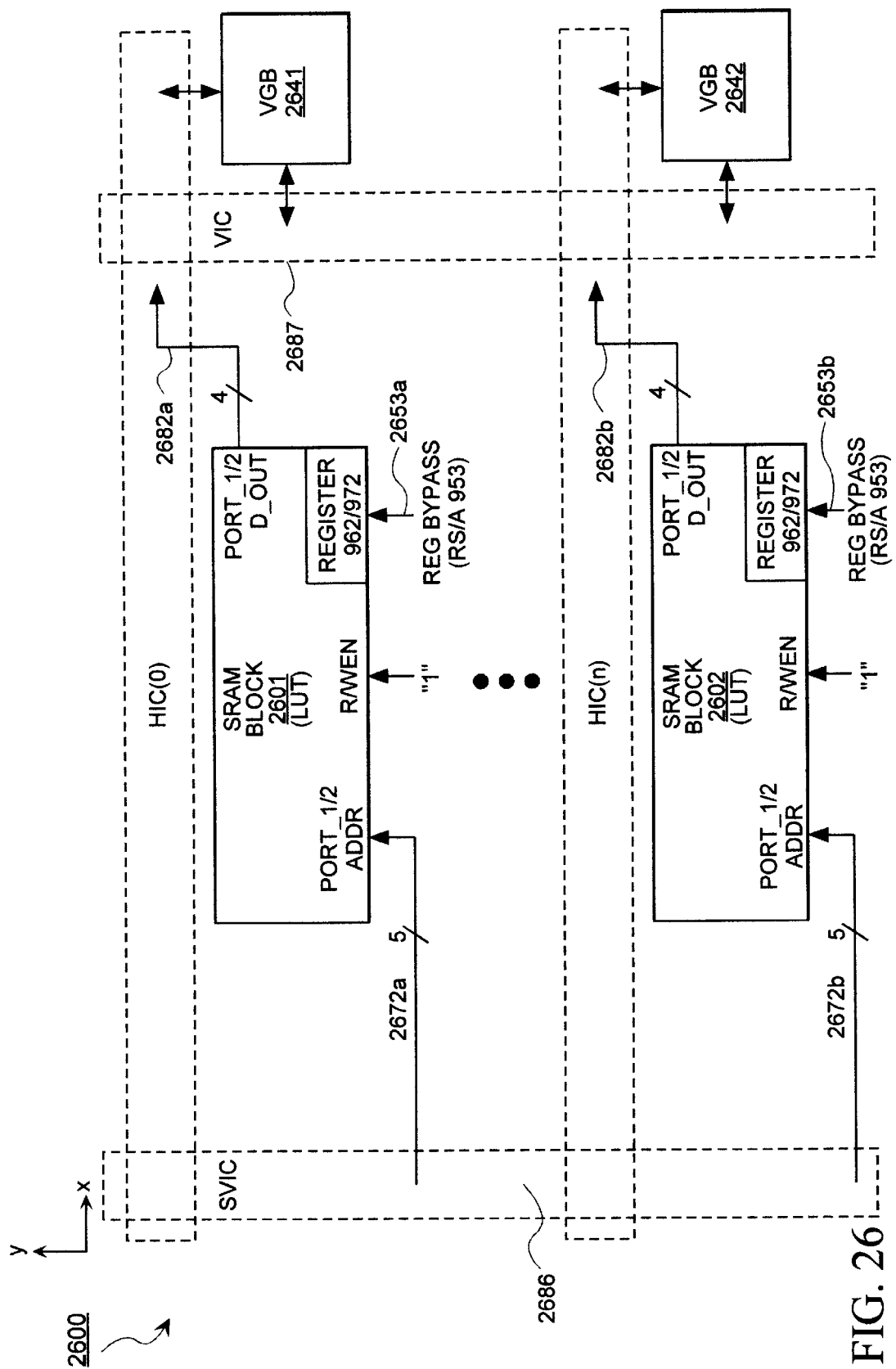
FIG. 26 diagrams a configuration wherein SRAM blocks are used as 5-input LUT's embedded among VGB's.

FIG. 26 diagrams a configuration 2600 wherein SRAM blocks such as 2601 and 2602 are used as 5-input LUT's embedded among VGB's such as 2641 and 2642. The storage data within SRAM blocks 2601–2602 may be loaded via a serial configuration chain such as shown in FIG. 10 or by writing via the read/write ports (Port_1's) of the respective blocks 2601–2602. With the storage data loaded in place, the respective R/WEN terminals (934) of SRAM blocks 2601–2602 may be driven high to disable writing into the blocks. While R/WEN is high (logic '1') the corresponding SRAM block may be considered as a preloaded ROM block that has a 5-bit address input 2672 for each port (Port_1 or Port_2) and a corresponding 4-bit data output 2682 for each port (Port_1 or Port_2). Suffixes 'a' and 'b' are used in the reference numbers of respective SRAM blocks 2601 and 2602 for inputs and outputs.

The data output 2682 of the SRAM blocks 2601–2602 may be stored in an internal output register (see 962 of FIG. 9) or the output register may be bypassed so that storage data is output in a nonregistered combinatorial fashion. Line 2653 corresponds to the RS/A line 953 of FIG. 9 and controls the LUT output for switching between the registered and nonregistered modes.

SRAM blocks 2601–2602 may be used as additional logic resources when in the LUT mode. The 5-bit address input signals 2672a–2672b are passed from an intersecting HIC to the SVIC bus 2686 and from there to the corresponding address port of the 5-input LUT (2601 and/or 2602). The 5-bit address input signals 2672a–2672b may be sourced from VGB's such as 2641–2642 or from IOB's (not shown).

Responsive LUT 4-bit outputs (2682a–2682b) are passed to the adjacent HIC. From there, the LUT output signals may be routed to VGB's such as 2641–2642 or to IOB's (not shown). LUT output signals may be routed to VIC's such as 2687 either through switchboxes (not shown) or through VGB's such as 2641–2642.

Each of the 4-bit outputs of the SRAM implemented LUT's (2601–2602) may constitute an independent 1-bit function of the 5-bit address input 2672. As such, the SRAM blocks 2601–2602 may be used as additional logic resources that complement the logic resources found within surrounding VGB's such as 2641–2642. Because there are two independent address inputs and two independent data outputs (Port_1 and Port_2) in each SRAM block, each such multi-ported SRAM block (e.g., 2601) may be treated as two independent LUT's that happen to have been programmed the same way. Each of the two such independent LUT's can receive its own, different inputs (address signals) and out a correspondingly different response pattern. Replication of a same LUT function in multiple LUT's is common in data bus oriented circuits. When such implementations are desired, each SRAM block can serve as a compact means of simultaneously implementing two basically identical LUT's. (The identity is not perfect of course because of the different connectivity options provided by Port_1 and Port_2 of FIGS. 20–21 within embodiments 19A–19B.)

Figure 27:
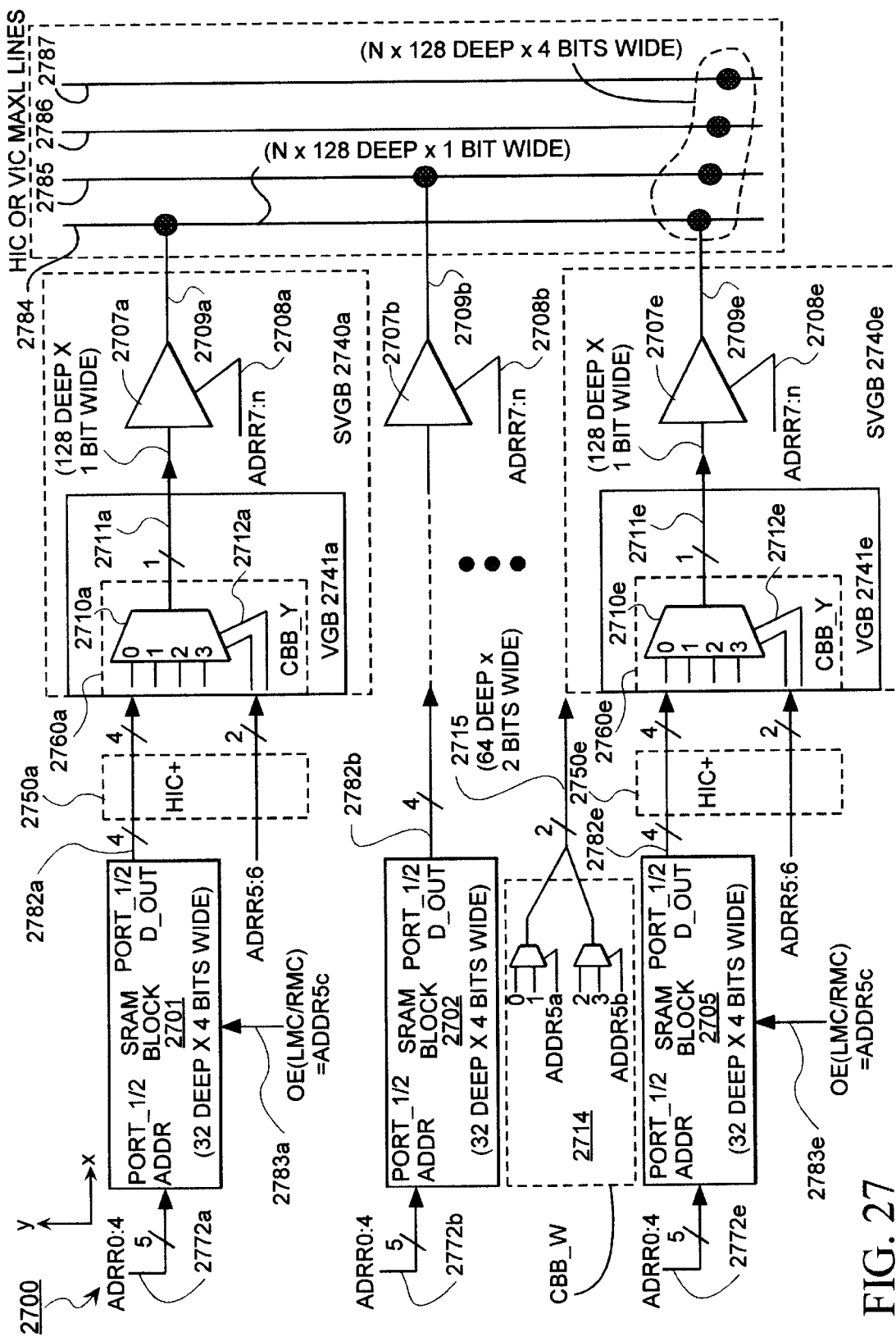
FIG. 27 diagrams a configuration wherein the apparent storage depth of each SRAM block is expanded for reading purposes.

FIG. 27 diagrams a configuration 2700 wherein the apparent storage depth of each SRAM block may be expanded for reading purposes. A 32-nibbles deep and 4-bits (per nibble) wide SRAM block is shown at 2701. Five address bits, collectively referenced as ADDR0:4, are received by way of bus 2772a (via the SVIC 860). The responsive 4 data bits are seen on data bus 2782a of SRAM block 2701 when the output enabling terminal 2783a is activated. Output enabling terminal 2783a corresponds to OE line 883 of FIG. 9 when Port_1 is the data output, and to ROEN line 936 of FIG. 9 when Port_2 is the data output.

The adjacent interconnect mesh of the FPGA device (100), including the HIC adjacent to SRAM block 2701 which first receives the output data signal 2782a, is represented by dashed box 2750a.

After passing through the adjacent interconnect 2750a (the adjacent HIC, plus optional more interconnect), the responsive 4 data bits of SRAM block 2701 are applied to a Configurable Building Block portion 2760a (e.g., CBB_Y) of either an immediately adjacent VGB 2741a or a more distant VGB. As was explained with respect to FIG. 1, each CBB may be configured to implement a 4:1 dynamic multiplexer. Such a 'dynamic' multiplexer is able to switchably select different ones of its inputs during run-time use of the FPGA. This is to be distinguished from static kinds of FPGA multiplexers whose re-selection abilities are limited to configuration time only (only to the time when the configuration memory of the FPGA device is being loaded with new configuration data and part of that data defines the selection to be made by a 'static' multiplexer).

One such CBB-implemented, 4:1, dynamic multiplexer is shown at 2710a as being within CBB_Y 2760a and as having output terminal 2711a. A pair of dynamic selection control terminals belonging to the 4:1 multiplexer 2710a are shown at 2712a. Control terminals 2712a receive 2 bits of selection data from the adjacent interconnect (HIC+) 2750a. These 2 bits are collectively referenced as dynamic address bits, ADDR5:6. The combination of ADDR5:6 (2712a) and ADDR0:4 (2772a) may define a 7-bit address word that is referenced herein as ADDR0:6.

The combination of SRAM block 2701, HIC+ 2750a and 4:1 multiplexer 2710a may be viewed as a memory device that is organized as 128 deep by one bit wide (128×). The output 2711a of the combination 2701/2750a/2710a provides 1-bit of storage data from SRAM block 2701 in response to the 7-bit address word, ADDR0:6.

In an alternate implementation which is shown by dashed box 2714, the single 4:1 dynamic multiplexer 2710a is replaced by the implementation in CBB 2760a of two 2:1 dynamic multiplexers (the latter implementation may be in a CBB_W instead of a CBB_Y). The implemented two 2:1 dynamic multiplexers of substitute box 2714 may each receive a respective pair of bits, 0–1 and 2–3, from SRAM block 2701 via HIC+2750a. Each 2:1 dynamic multiplexer may further receive at its respective selection control terminal, a same ADDR5 bit or an independent ADDR5a or ADDR5b bit from HIC+2750a. This combination of SRAM block 2701, HIC+ 2750a and the pair of 2:1 multiplexers (substitute box 2714) implemented in CBB 2760a may be viewed as a memory device that is organized as 64 deep by two bits wide (64×2) as shown at 2715. In the latter organization, the same address bit ADDR5 would be routed to the ADDR5*a* and ADDR5*b* selection control terminals of each of the pair of 2:1 dynamic multiplexers (2714).

If ADDR5*a* and ADDR5*b* are different, then the combination of SRAM block 2701, HIC+ 2750*a* and the pair of 2:1 multiplexers (substitute box 2714) implemented in CBB 2760*a* may be viewed as two memory devices that are each organized as 64 deep by one bit wide (2×64×1) but share lower address bits, ADDR0:4. Details of how to implement either two 2:1 dynamic multiplexers in a CBB or a single 4:1 dynamic multiplexer may be found in the above cited application Ser. No. 08/948,306 filed Oct. 9, 1997 by Om P. Agrawal et al. and originally entitled, "VARIABLE GRAIN ARCHITECTURE FOR FPGA INTEGRATED CIRCUITS".

Continuing with the single 4:1 dynamic multiplexer implementation that is shown in box 2760*a* of FIG. 27, VGB 2741*a* resides inside the superstructure, SVGB 2740*a*. As was explained for FIGS. 7A–7D, each SVGB superstructure includes shared longline drivers into which result signals of encompassed VGB's may be configurably routed for output onto adjacent MaxL lines. Tristate driver 2707*a* represents one such, shared longline driver. Tristateable output 2709*a* of driver 2707*a* connects to MaxL line 2784. (Line 2784 could belong to a TOP longline set of a HIC or to another longline in a VIC.) The output enable terminal 2708*a* of shared longline driver 2707*a* may be driven by a dynamic control signal (DyOE of FIG. 7A). Again, the details of how a DyOE signal may be developed and routed to terminal 2708*a* may be found in the above cited application Ser. No. 08/948,306.

Every fourth SVGB along a super row or super column has shared tristate drivers connecting to same longlines as depicted by FIGS. 7A–7D. SVGB 2740*e* of FIG. 27 represents such a same-connected super-VGB whose shared tristate driver 2707*e* also connects to MaxL line 2784. Suffixes 'a' and 'e' are used in FIG. 27 for the reference numbers of respective SRAM blocks 2601 and 2605 for inputs and outputs. SRAM block 2705 may be in the same memory column (LMC or RMC) as that of 2701, although that is not necessary. MaxL line 284 may be a vertical input channel (VIC) although that is not necessary. This orientation is selected because it is easier to visualize a column of SRAM blocks driving a nearby column of SVGB's, and the latter driving an adjacent VIC.

The combination of SRAM block 2705, HIC+2750*e* and 4:1 multiplexer 2710*e* may be viewed as a second memory device that is organized as 128 deep by one bit wide (128×1) and connects to the same longline 2784 as does combination 2701/2750*a*/2710*a*. The binary complement of the DyOE signal that is applied to terminal 2708*a* may be applied to control terminal 2708*e*. In such a case, the output on line 2784 may be seen as that from a memory device that is 256 words deep by one bit wide (256×1) that responds to 8 address bits, the latter being ADDR0:6 plus an ADDR7 signal applied to 2708*a* and its complement which is applied to 2708*e*. (This assumes the same ADDR0:4 signal being routed to each of SRAM blocks 2701 and 2705, and the same ADDR5:6 signal being routed to each of control terminal pairs 2712*a* and 2712*e*.)

At a next level of usage, more than two of the SRAM and SVGB combinations that drive line 2784 can be used to implement a memory device that is n times 128 words deep by one bit wide (N×128×1) where N is an integer greater than 2. In this latter case, some sort of decoder function that provides an N:1 demultiplexer function would have to be implemented with ancillary VGB's (not shown) to pick one of control terminals 2708*a*, 2708*e*, 2708*i* (not shown), etc. in response to higher order address bits, ADDR7:n.

At the same time that usage is made of the SRAM and SVGB combinations that drive line 2784 to implement a memory device that outputs onto line 2784 and is N times 128 words deep by one bit wide (N×128×1), the SRAM and SVGB combinations that drive a second MaxL line 2785 may be used to implement a second memory device that outputs onto line 2785 and is N times 128 words deep by one bit wide (N×128×1). This usage is represented by SRAM block 2702 and its dashed connection to tristate driver 2707*b*. The same may be done for MaxL lines 2786 and 2787 so as to granularly build up to an implementation that is n times 128 words deep by 4 bits wide (N×128×4).

In a supplemental or alternative approach, the SRAM port output enables 2783*a* . . . 2783*e* of both memory columns (LMC and RMC) may be driven by an ADDR5*c* signal having complementary polarity for the respective Left and Right Memory Columns (LMC and RMC) while the same basic structure 2700 is repeated in both memory columns (LMC and RMC). There are two variations on this complementary use of the LMC and RMC. In the first variation, a same line in HIC+ 2750 is tristateably driven by one wire of say, bus 2782*a* of the LMC and it is also tristateably driven by a respective one wire of same bus 2782*a* of the RMC. The opposite polarity signals that are respectively applied to the output enabling terminals 2783*a* respectively in the LMC and RMC define address bit, ADRR5*c* and provide an effective depth of 64 bits and a width of 4 bits on HIC+ 2750*a* without need for additional resources such as CBB 2760 and shared longline driver 2707*a*.

In the second variation, a same longline 2784 that is tristateably driven by shared longline driver 2707*a* of the LMC is also tristateably driven by the corresponding shared longline driver 2707*a* of the RMC. Appropriate decoding is provided by way of ancillary VGB's for causing one address bit to select either the LMC or the RMC as the current driver of shared line 2784. This doubles the apparent data depth of the effective memory device formed by such a configuration (to say 256 deep by one bit per row of SRAM blocks).

Although each SRAM block is presented herein as being no more than 32 words deep and no more than 4 bits wide per addressable word, alternate embodiments are within the contemplation of the invention wherein: (a) word depth is no more than 16 words deep (for finer granularity and elimination of 3 address lines in the SVIC); or (b) word depth is 64 or more words deep (for providing coarser granularity at the cost of adding 3 address lines in the SVIC for each doubling of storage capacity in the SRAM blocks). Additionally, if the data width of each VGB is increased from 4 bits to a larger number, and the interconnect channels are similarly widened to carry such wider data words, it is within the contemplation of the invention to similarly widen the word width in the SRAM blocks so as to provide for matched transfer of parallel data form one FPGA resource to a next.

Figure 28:
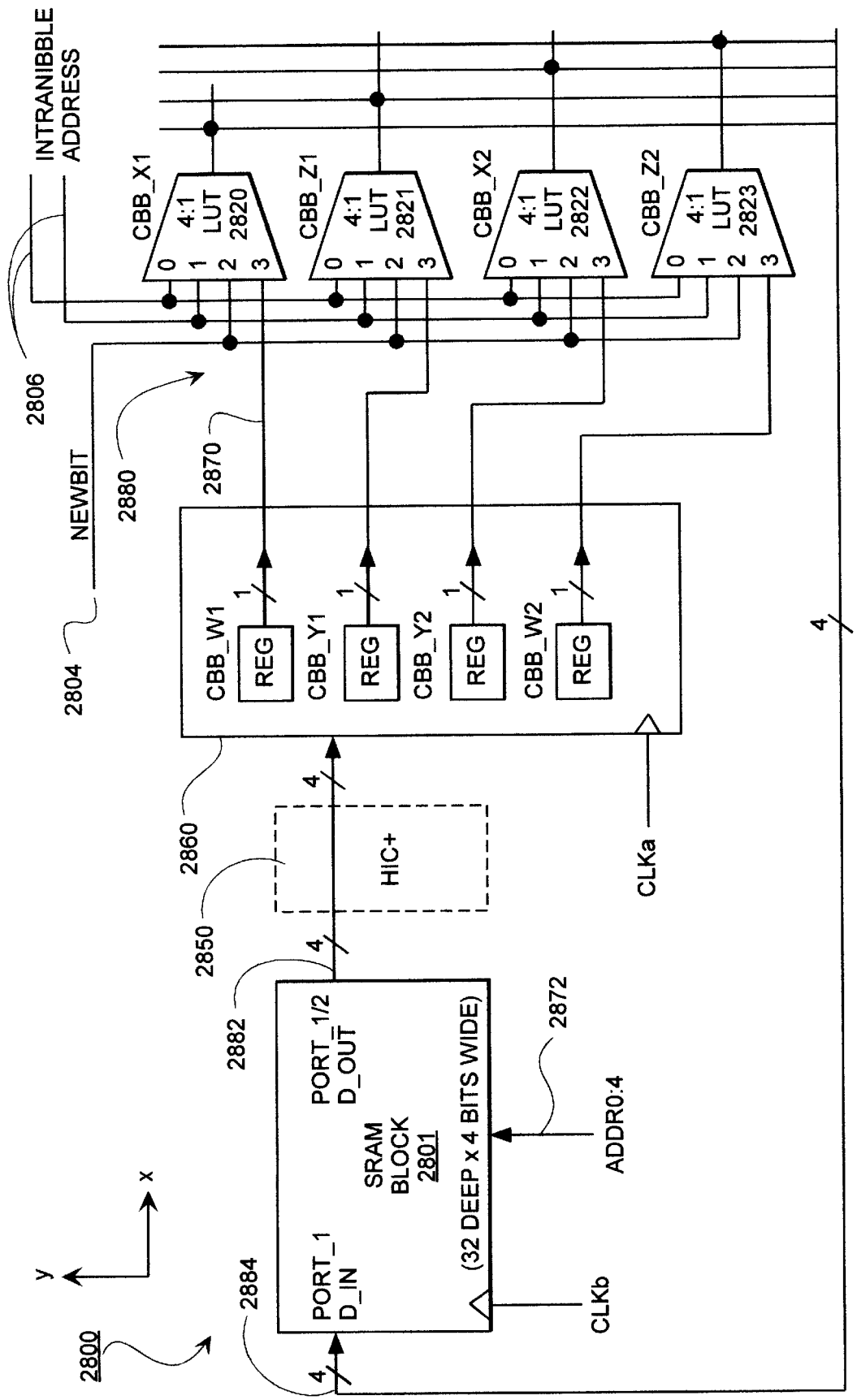
FIG. 28 diagrams a configuration wherein the apparent storage depth of each SRAM block is expanded for writing purposes.

FIG. 28 diagrams a configuration 2800 under which the apparent storage depth of each SRAM block may be expanded for writing purposes. Here, SRAM block 2801 is to appear as 128-deep by 1-bit wide and a new bit is to be written into an addressed location within SRAM block 2801. The new bit is supplied on line 2804. An intra-nibble address is supplied on a pair of lines referenced as 2806. The intra-nibble address 2806 identifies the specific bit (00–11) within an addressed nibble of SRAM block 2801 that is to be over written by the new bit 2804. The 5-bit wide, nibble-addressing signal is supplied to SRAM block 2801 on bus 2872.

A bit-specific overwrite operation may proceed as follows. A five-bit address signal ADDR0:4 is applied to SRAM block 2801 via bus 2872 for reading out a corresponding nibble onto bus 2882. (Bus 2882 can be taken off Port_1 or Port_2.) After passing through the adjacent interconnect 2850 (the adjacent HIC, plus optional more interconnect), the responsive 4 data bits of SRAM block 2801 are applied to a group first 2860 of Configurable Building Blocks. In the illustrated example, the 4 CBB's are identified as CBB_W1, CBB_Y1, CBB_Y2 and CBB_W2, where the first pair belong to a first VGB and the second pair belong to an adjacent second VGB.

Each CBB of first group 2860 includes a bit-storing register into which a respective one bit of bus 2882 is stored upon activation of clock edge CLKa. (Details of how to configure a group of CBB's to behave as such may be found in the above cited application Ser. No. 08/948,306.)

The register-stored nibble is then transferred via a 4-line bus 2870 to a second group 2880 of four CBB's. Bus 2870 is implemented by an appropriate part of the FPGA interconnect. The CBB's of group 2880 are identified as CBB_X1, CBB_Z1, CBB_X2 and CBB_Z2, where the first pair may belong to the same first VGB as that of CBB_W1 and CBB_Y1; and where the second pair may belong to the same second VGB as that of CBB_Y2 and CBB_W2. This specific organization is not necessary but may be convenient for purposes of tight packing.

The four CBB's of second group 2880 are further identified as 2820 through 2823. Each of CBB's 2820–2823 receives the two, intra-nibble address bits 2806 on its respective data inputs, 0 and 1. Each of CBB's 2820–2823 receives the new-bit signal 2804 on its respective data input, 2. Each of CBB's 2820–2823 further receives a corresponding one of the four lines of bus 2870 at its respective data input, 3. Each of CBB's 2820–2823 additionally outputs one of either the new-bit signal 2804 or the respective old-bit of bus 2870 onto write-back bus 2884 in accordance with a configuration-defined, local function that responds to intra-nibble address bits 2806.

CBB 2820 is configured to output the new-bit signal (data input 2) if the two-bit, intra-nibble address is 00 and to otherwise output its corresponding old-bit (data input 3). CBB 2821 is configured to output the new-bit signal (data input 2) if the intra-nibble address is 01 and to otherwise output its corresponding old-bit (data input 3). CBB 2822 is configured to output the new-bit signal (data input 2) if the intra-nibble address is 10 and to otherwise output its corresponding old-bit (data input 3). CBB 2823 is configured to output the new-bit signal (data input 2) if the intra-nibble address is 11 and to otherwise output its corresponding old-bit (data input 3).

Write-back bus 2884 couples to Port_1 of the SRAM block 2801, where Port_1 is configured to write in synchronous response to clock edge CLKb. Clock edge CLKb is a complement of clock edge CLKa, and later in time such that an old nibble is stored in the four registers of CBB group 2860 at a first time point and the new-nibble (overwritten by the new-bit 2804) is written back to the same location in SRAM block 2801 at a later time point.

If data-out bus 2882 is one and the same as write-back bus 2884, meaning that Port_1 is being used for both output of the old-nibble and write-back of the new nibble, the outputs of CBB's 2820–2823 should be appropriately tristated so as to accommodate time-multiplexed use of the Port_1. (Details of how to configure so-called CSE output stages of CBB's to behave as tristated outputs may be found in the above cited application Ser. No. 08/948,306.) Variations on the process depicted by FIG. 28 may be had by using the internal registers (972, 962, 976 in FIG. 9) or internal registers of CBB group 2880 for providing substitute or additional storage for nibbles passing through the illustrated write-back loop.

The above disclosure is to be taken as illustrative of the invention, not as limiting its scope or spirit. Numerous modifications and variations will become apparent to those skilled in the art after studying the above disclosure.

By way of example, instead of having only two columns of embedded memory respectively designated for the TOP longline set and the 3RD longline set, it is also within the contemplation of the invention to provide four columns of embedded memory respectively designated for the TOP through 3RD longline sets. Different numbers of columns of embedded memory may also be provided.

Given the above disclosure of general concepts, principles and specific embodiments, the scope of protection sought is to be defined by the claims appended hereto.

What is claimed is:

1. A field programmable gate array device comprising:
    (a) a first plurality, P1 of repeated logic units wherein:
        (a.1) each said logic unit is user-configurable to receive and process at least a second plurality, P2 of input logic bits and to responsively produce result data having at least a third plurality, P3 of output logic bits,
        (a.2) said logic units are distributed among a plurality of horizontal rows, with each row of the plurality of rows having a fourth plurality, P4 of said logic units;
        (a.3) said logic units are further distributed among a plurality of vertical columns, with each column of the plurality of columns having a fifth plurality, P5 of said logic units;
    (b) a sixth plurality, P6 of horizontal interconnect channels (HIC's) correspondingly distributed adjacent to said horizontal rows of logic units, wherein:
        (b.1) each said horizontal interconnect channel (HIC) includes at least P3 interconnect lines, and
        (b.2) each said horizontal row of P4 logic units is configurably couplable to a corresponding one of the P6 HIC's at least for receiving input logic bits from the corresponding HIC or at least for outputting result data to the corresponding HIC;
        (b.3) each said logic unit can internally process its respective second plurality of input logic bits without using said horizontal interconnect channels or other general interconnect for such internal processing; and
    (c) an embedded memory subsystem, wherein said embedded memory subsystem includes:
        (c.1) a seventh plurality, P7 of independently-usable memory blocks, and wherein:
        (c.1a) each said memory block is embedded within one of said rows of logic units and is configurably couplable to the corresponding HIC of said row for transferring storage data by way of the corresponding HIC of that row of P4 logic units; and
        (c.1b) plural ones of said memory blocks are arranged to define one or more columns of embedded memory within said field programmable gate array device with each such column having an eighth plurality, P8 of said memory blocks.

2. A field programmable gate array device according to claim 1 wherein:

(c.1c) each said memory block is organized as a ninth plurality, P9 of addressable sets of storage data bits, where each addressable set of storage data bits includes at least P3 bits that are transferable by wave of the corresponding HIC of its corresponding row of P4 logic units, said P3 plurality of bits corresponding to the P3 plurality of output logic bits producible by each said logic unit.

3. A field programmable gate array device according to claim 2 wherein:

(c.1c1) each of P2 and P3 is an integer equal to or greater than 4.

4. A field programmable gate array device according to claim 2 wherein:

(c.1c1) each addressable set of storage data bits consists of P3 bits and P3 is an integer equal to or greater than 4.

5. field programmable gate array device according to claim 1 wherein:

(a.4) groups of said logic units are further wedged together such that no HIC's pass between the wedged together logic units, and such that each group of logic units defines a logic superstructure and (c.1c) groups of said memory blocks are also wedged together such that no HIC's pass between the wedged together memory blocks, and such that each group of memory blocks defines a memory superstructure that is configurably-couplable to a corresponding logic superstructure.

6. A field programmable gate array device according to claim 1 wherein said embedded memory subsystem includes:

(c.2) at least one special interconnect channel for supplying address signals to a respective set of said memory blocks.

7. A field programmable gate array device according to claim 6 wherein:

(c.lb1) there are at least two of said columns of embedded memory; and (c.2a) there are at least two of said special interconnect channels, and each respective special interconnect channel is for supplying address signals to a respective one of the at least two columns of embedded memory.

8. A field programmable gate array device [100] according to claim 6 wherein:

(c.1c) each said memory block has at least first and second data ports each for outputting storage data;

(c.1d) each said memory block has at least first and second address ports each for receiving address signals identifying the storage data to be output by a corresponding one of the at least first and second data ports;

(c.2a) the at least one special interconnect channel includes first and second address-carrying components along which independent address signals may be respectively carried for application to respective ones of the first and second address ports of at least two memory blocks.

9. A field programmable gate array device according to claim 8 wherein:

(c.1d) each said memory block has a controls-receiving port for receiving control signals that control operations of said memory block; and (c.2a1) the at least one special interconnect channel includes at least one controls-carrying component along which operations-controlling signals may be respectively carried for application to the controls-receiving ports of at least two memory blocks.

10. The field programmable gate array device according to claim 1 wherein:

(c.1a1) said configurable coupling of each said memory block to the corresponding HIC of said row allows said transferring of storage data to the corresponding HIC immediately by way of said configurable coupling.

11. The field programmable gate array device according to claim 10, wherein said configurable coupling of each said memory block to the corresponding HIC includes:

(c.1a2) at least eight bidirectional, programmable interconnect points each for carrying both read data and write data bits.

12. The field programmable gate array device according to claim 11, wherein each said bidirectional, programmable interconnect point (PIP) can be programmably disabled and each said bidirectional PIP includes a tri-state output driver for driving a corresponding interconnect line in said corresponding HIC, where said tri-state output driver enters a high-impedance output mode when the bidirectional, programmable interconnect point is programmably disabled.

13. The field programmable gate array device according to claim 10, wherein said configurable coupling of each said memory block to the corresponding HIC includes:

(c.1a2) at least eight unidirectional, programmable interconnect points each for carrying read data.

14. The field programmable gate array device according to claim 13, wherein each said unidirectional, programmable interconnect point (PIP) can be programmably disabled and each said unidirectional PIP includes a tri-state output driver for driving a corresponding interconnect line in said corresponding HIC, where said tri-state output driver enters a high-impedance output mode when the unidirectional, programmable interconnect point is programmably disabled.

15. In a field programmable gate array device (FPGA) having a user-configurable interconnect network that includes a plurality of horizontal interconnect channels each with a diversified set of long-haul interconnect lines and shorter-haul interconnect lines, an embedded memory subsystem comprising:

(a) a plurality of multi-ported memory blocks each arranged adjacent to a horizontal interconnect channel (HIC) of the interconnect network;

wherein:

(a.1) each multi-ported memory block includes a read/write data port and a read-only data port;

(a.2) each read-only data port is connectable by user-configurable intercouplings to both the long-haul interconnect lines and the shorter-haul interconnect lines;

(a.3) each read/write data port is connectable by user-configurable intercouplings only to the long-haul interconnect lines.

16. In an FPGA device having an array of variable grain blocks and diversified interconnect resources including double-length lines, quad-length lines and octal-length lines, where each variable grain block (VGB) includes at least two, together-foldable Configurable Building Blocks (CBB's) and each CBB includes at least one user-configurable lookup table; and where each double-length line spans the distance of essentially two adjacent VGB's; an embedded memory subsystem comprising:

first and second columns of memory blocks situated such that each of the first and second columns intersects with, and is configurably couplable to, the double-length lines.

17. A signaling method for use in an FPGA device having:
(0.1) plural variable grain blocks (VGB's),
(0.1a) where each variable grain block (VGB) includes at least two, Configurable Building Blocks (CBB's) that are foldable-together and each CBB includes at least one user-configurable lookup table;
(0.2) diversified interconnect resources for interconnecting VGB's and other FPGA resources, said interconnect resources including:
(0.2a) first continuous-length lines each spanning along at least two adjacent VGB's,
(0.2b) second continuous-length lines that are each substantially longer than one of said first continuous-length lines, and
(0.2c) third continuous-length lines that are each substantially longer than one of said second continuous-length lines; and
(0.3) an embedded memory subsystem comprising:
(0.3a) one or more columns of independently-usable memory blocks where the columns intersect with said diversified interconnect resources and are configurably couplable to adjacent parts of the diversified interconnect resources,
(0.3b) where the memory blocks each have at least one address input port and at least one data output port, said at least one data output port being configurably couplable to adjacent parts of the diversified interconnect resources,
(0.3c) one or more special interconnect channels for supplying address signals to address input ports of memory blocks in a column of said memory blocks;
said signaling method comprising the steps of:
(a) sourcing an address signal into the diversified interconnect resources of the FPGA device;
(b) routing the sourced address signal by way of said diversified interconnect resources and a corresponding special interconnect channel to an address input port of a given memory block;
(c) outputting responsive storage data signals from the data output port of the given memory block; and
(d) routing the responsive storage data signals through the diversified interconnect resources of the FPGA device to one or more target resources in the FPGA.

18. The signaling method of claim 17, wherein said step (a) of sourcing an address signal into the diversified interconnect resources includes:
(a.1) sourcing at least part of said address signal from a VGB.

19. The signaling method of claim 17, wherein said FPGA device has input/output blocks (IOB's) configurably couplable to adjacent parts of the diversified interconnect resources and wherein said step (a) of sourcing an address signal into the diversified interconnect resources includes:
(a.1) sourcing at least part of said address signal from an IOB.

20. The signaling method of claim 17, wherein said step (d) of routing the responsive storage data signals to one or more target resources includes:
(d.1) routing the responsive storage data signals to a target VGB.

21. The signaling method of claim 17, wherein said FPGA device has input/output blocks (IOB's) configurably couplable to adjacent parts of the diversified interconnect resources and wherein said step (d) of routing the responsive storage data signals to one or more target resources includes:
(d.1) routing the responsive storage data signals to a target IOB.

22. The signaling method of claim 17, wherein each said special interconnect channel (SVIC) comprises its own and respective special interconnect resources including:
(0.3c1) first special continuous-length lines each spanning along at least 4 adjacent memory blocks; and
(0.3c2) second special continuous-length lines that are each substantially longer than one of said first special continuous-length lines, and wherein said step (b) of routing the sourced address signal by way of a corresponding special interconnect channel includes:
(b.1) broadcasting first address bits by way of said first special continuous-length lines to correspondingly localized groups of memory blocks; and
(b.2) broadcasting second address bits by way of said second special continuous-length lines to correspondingly less-localized groups of memory blocks.

23. A method for use in an FPGA device having plural variable grain blocks (VGB's), diversified interconnect resources, and an embedded memory subsystem comprising one or more columns of memory blocks situated for configurable coupling via the diversified interconnect resources to the VGB's, where the memory blocks each have at least one address input port for receiving a first plurality, P1 of address bits and at least one data output port for outputting a second plurality, P2 of responsive storage bits for each supplied address, said method comprising the steps of:
(a) supplying a first part of a wide address signal having more than P1 address bits to the P1-wide address input port of a given memory block;
(b) supplying a second part of said wide address signal to one or more selection control terminals of an N-to-1 dynamic multiplexer implemented within one of said VGB's, where N is at least 2;
(c) supplying to a plurality of N data input terminals of said N-to-1 dynamic multiplexer, a plurality of no more than N of the responsive storage bits output by the given memory block in response to said first part of the wide address signal; and
(d) using an output of said N-to-1 dynamic multiplexer as data output by the given memory block in response to said wide address signal.
(e) supplying a new bit as another of the selectable two supplied bits of said lookup tables; and
(f) writing-back the outputs of the P2 lookup tables into the given memory block.

24. A method for use in an FPGA device having plural variable grain blocks (VGB's), diversified interconnect resources, and an embedded memory subsystem comprising one or more columns of memory blocks situated for configurable coupling via the diversified interconnect resources to the VGB's, where the memory blocks each have at least one address input port for receiving a first plurality, Pi of address bits and at least one data output port for outputting a second plurality, P2 of responsive storage bits for each supplied address, said method comprising the steps of:
(a) supplying a first part of a wide address signal having more than P1 address bits to the P1-wide address input port of a given memory block;
(b) supplying a second part of said wide address signal to data-input terminals of a plurality of P2 lookup tables that are each configured to select and output one of two supplied bits in response to said second part of the wide address signal, where the P2 lookup tables are implemented within one or more of said VGB's;

(c) storing the data output by the given memory block in response to the first part of the wide address signal;

(d) supplying respective bits of said stored output data to respective ones of the P2 lookup tables as one of the selectable two supplied bits of said lookup tables;

(e) supplying a new bit as another of the selectable two supplied bits of said lookup tables; and (f) writing-back the outputs of the P2 lookup tables into the given memory block.

25. An integrated FPGA circuit comprising:

(a) an array of variable grain blocks, (a.1) where each variable grain block (VGB) includes a first plurality, P1 of Configurable Building Elements (CBE's) of first functional complexity that are programmably foldable-together to thereby programmably define within the VGB, logic units of greater, second functional complexity where each CBE includes at least one user-configurable lookup table having a second plurality, P2 of at least 3 LUT inputs, and where each said VGB can be programmably configured to produce from its CBE's at least a third plurality, P3 of at least 4 result signals, where each of said P3 VGB result signals can be an independent function of P2 or more input signals supplied to the VGB;

(b) a diversified and configurable interconnect network having:

(b.1) a fourth plurality, P4 of general interconnect channels where each general interconnect channel includes:

(b.1a) a first set of continuous first-length lines each spanning along at least two adjacent VGB's, (b.1b) a second set of continuous second-length lines each being substantially longer than a corresponding one of said first-length lines, (b.1c) a third set of continuous third-length lines each being substantially longer than a corresponding one of said second-length lines, and where said configurable interconnect network further has:

(b.2) configurable switchboxes for programmably connecting respective ones of said first-length and second-length lines;

(c) an embedded memory subsystem comprising:

(c.1) one or more memory columns each having a fifth plurality, P5 of independently-usable memory blocks situated such that each of the memory columns intersects with, and is configurably couplable to said diversified interconnect network, (c.1a) where each said memory block stores uniquely addressable data words each having at least P3 bits, each said memory block has at least a bidirectional first data port for inputting and outputting P3 bits of storage data, and each said memory block has at least a first address port for receiving more than P3 address bits for uniquely addressing word storage locations of the memory block for access by way of the first data port; and (c.1b) where the first data port of each given memory block is configurably couplable to plural ones of the continuous third-length lines of an adjacent one of said P4 general interconnect channels.

26. The integrated FPGA circuit of claim 25 wherein:

(c.1c) each said memory block further has a second data port for outputting P3 bits of storage data, and each said memory block further has a second address port for receiving more than P3 address bits for uniquely addressing word storage locations of the memory block for access by way of the second data port; and (c.1d) the second data port of each given memory block is configurably couplable at least to plural ones of the continuous third-length lines of an adjacent one of said P4 general interconnect channels.

27. The integrated FPGA circuit of claim 26 wherein:

(c.1e) the second data port of each given memory block is further configurably couplable to plural ones of the continuous first-length lines of an adjacent one of said P4 general interconnect channels.

28. The integrated FPGA circuit of claim 27 wherein:

(c.1f) the second data port of each given memory block is further configurably couplable to plural ones of the continuous second-length lines of an adjacent one of said P4 general interconnect channels.

29. The integrated FPGA circuit of claim 26 wherein the embedded memory subsystem includes for each memory column:

(c.2) a special vertical interconnect channel (SVIC) extending along the memory column and having first and second address-conveying buses for transmitting respective first and second address signals respectively to the first and second address ports of memory blocks in said memory column.

30. The integrated FPGA circuit of claim 29 wherein the SVIC further has:

(c.2a) a common controls-conveying bus for transmitting control signals to memory blocks in said memory column, where said control signals include one or more signals selected from the group consisting of:

(c.2a1) an address clock for synchronizing address capture operations of a respective one or both of the first and second data ports of corresponding memory blocks;

(c.2a2) a first data clock for synchronizing data access operations of a respective one or both of the first and second data ports of corresponding memory blocks;

(c.2a3) a second data clock for synchronizing data access operations of a respective one or both of the first and second data ports of corresponding memory blocks;

(c.2a4) a first output enabling signal for selectively enabling and disabling data output by corresponding first data ports of corresponding memory blocks; and (c.2a5) a second output enabling signal for selectively enabling and disabling data output by corresponding second data ports of corresponding memory blocks.

31. The integrated FPGA circuit of claim 30 wherein said common controls-conveying bus is for simultaneously transmitting at least said following control signals:

(c.2a1') the address clock (c.2a2') the first data clock; and (c.2a3') the second data clock.

32. The integrated FPGA circuit of claim 30 wherein said SVIC includes distribution means for distributing address and control signals globally and in more localized fashion to respective memory blocks of a corresponding memory column.

33. The integrated FPGA circuit of claim 25 wherein:

(c.1c) plural memory blocks of a given memory column are wedged-together such that a general interconnect channel does not pass between the wedged-together memory blocks.

34. The integrated FPGA circuit of claim 33 wherein:

(a.2) plural ones of said VGB's are wedged-together such that a general interconnect channel does not pass between the wedged-together VGB's, and wedged-together VGB's are provided in rows that further contain said wedged-together memory blocks.

35. An integrated FPGA circuit comprising:

(a) a diversified and configurable interconnect network having:
  (a.1) a first plurality, P1 of general interconnect channels where each general interconnect channel includes:
    (a.1a) a first set of continuous first-length interconnect lines;
    (a.1b) a second set of continuous second-length interconnect lines each being substantially longer than a corresponding one of said first-length interconnect lines, and
    (a.1c) a third set of continuous third-length interconnect lines each being substantially longer than a corresponding one of said second-length interconnect lines, and where said configurable interconnect network further has:
  (a.2) configurable switchboxes programmably connecting respective ones of said first-length and second-length interconnect lines;
(b) an array of variable grain blocks (VGB's),
  (b.1) where each variable grain block (VGB) includes a second plurality, P2 of Configurable Building Blocks (CBB's) that are each capable of producing and storing at least one bit of result data and where each said VGB can be programmably configured to produce from its CBB's at least a third plurality, P3 of at least 4 result signals and said VGB-produced result signals can be output to adjacent interconnect lines;
    (a.1a') wherein each said first-length interconnect line spans along at least two adjacent VGB's;
(c) an embedded memory subsystem comprising:
  (c.1) a fourth plurality, P4 of independently-usable memory blocks situated such that each memory block is configurably couplable to an adjacent channel of said diversified interconnect network,
    (c.1a) where each said memory block stores uniquely addressable data words each having at least P3 bits, each said memory block has at least a bidirectional first data port for inputting and outputting P3 bits of storage data, and each said memory block has at least a first address port for receiving more than P3 address bits for uniquely addressing word storage locations of the memory block for access by way of the first data port.

36. The integrated FPGA circuit of claim 35 wherein:

(c.1b) each said memory block further has a second data port for outputting at least P3 bits of storage data, and each said memory block further has a second address port for receiving more than P3 address bits for uniquely addressing word storage locations of the memory block for access by way of the second data port.

37. The integrated FPGA circuit of claim 36 wherein:

the embedded memory subsystem includes for respective groups of plural memory blocks:
  (c.2) a special interconnect channel (SIC) extending along the memory blocks of a respective group and having first and second address-conveying buses for transmitting respective first and second address signals respectively to the first and second address ports of memory blocks in said group of memory blocks.

38. The integrated FPGA circuit of claim 35 wherein:

the embedded memory subsystem includes for respective groups of plural memory blocks:
  (c.2) a special interconnect channel (SIC) extending along the memory blocks of a respective group and having at least one address-conveying bus for transmitting address signals respectively to the address ports of memory blocks in said group of memory blocks.

39. The integrated FPGA circuit of claim 38 wherein the SIC further has:

(c.2a) a common controls-conveying bus for transmitting control signals to memory blocks in said memory blocks group, where said control signals include one or more signals selected from the group consisting of:
  (c.2a1) an address clock for synchronizing address capture operations of respective data ports of corresponding memory blocks;
  (c.2a2) a first data clock for synchronizing data access operations of respective data ports of a first subset of corresponding memory blocks;
  (c.2a3) a second data clock for synchronizing data access operations of respective data ports of a second subset of corresponding memory blocks;
  (c.2a4) a first output enabling signal for selectively enabling and disabling data output by corresponding data ports of a first subset of corresponding memory blocks; and
  (c.2a5) a second output enabling signal for selectively enabling and disabling data output by corresponding data ports of a second subset of corresponding memory blocks.

40. An integrated FPGA circuit comprising:

(a) a configurable interconnect network having a plurality of general interconnect channels each with a plurality of differentiated interconnect lines;
(b) an array of user-configurable, variable grain blocks (VGB's) that are interconnectable by said configurable interconnect network; and
(c) an embedded memory subsystem comprising:
  (c.1) a plurality of independently-usable memory blocks situated such that each memory block is configurably couplable to an adjacent channel of said diversified interconnect network,
    (c.1a) where plural ones of said memory blocks are wedged-together such that a general interconnect channel does not pass between the wedged-together memory blocks.

41. The integrated FPGA circuit of claim 40 wherein:

(a.1) plural ones of said VGB's are wedged-together such that a general interconnect channel does not pass between the wedged-together VGB's, and wedged-together VGB's are provided in rows that further contain said wedged-together memory blocks.

42. The integrated FPGA circuit of claim 40 wherein:

(c.1b) each said memory block stores uniquely addressable data words, each said memory block has at least a bidirectional first data port for inputting and outputting storage data words, and each said memory block has at least a first address port for receiving address bits for uniquely addressing word storage locations of the memory block for access by way of the first data port; and the embedded memory subsystem further includes for respective groups of plural memory blocks:

(c.2) a special interconnect channel (SIC) extending along the memory blocks of a respective group and having at least one address-conveying bus for transmitting address signals respectively to the address ports of memory blocks in said group of memory blocks.

43. The integrated FPGA circuit of claim 42 wherein:

(c.1c) each said memory block further has a second data port for outputting storage data words, and each said memory block further has a second address port for receiving address bits for uniquely addressing word storage locations of the memory block for access by way of the second data port; and (c.2a) said special interconnect channel (SIC) further includes a second address-conveying bus for transmitting address signals respectively to the second address ports of memory blocks in said group of memory blocks.

44. The integrated FPGA circuit of claim 43 wherein the SIC further has:

(c.2a) a common controls-conveying bus for transmitting control signals to memory blocks in said memory blocks group, where said control signals include one or more signals selected from the group consisting of:

(c.2a1) an address clock for synchronizing address capture operations of respective data ports of corresponding memory blocks;

(c.2a2) a first data clock for synchronizing data access operations of respective data ports of a first subset of corresponding memory blocks;

(c.2a3) a second data clock for synchronizing data access operations of respective data ports of a second subset of corresponding memory blocks;

(c.2a4) a first output enabling signal for selectively enabling and disabling data output by corresponding data ports of a first subset of corresponding memory blocks; and (c.2a5) a second output enabling signal for selectively enabling and disabling data output by corresponding data ports of a second subset of corresponding memory blocks.

\* \* \* \* \*

UNITED STATES PATENT AND TRADEMARK OFFICE
CERTIFICATE OF CORRECTION

PATENT NO.   : 6,127,843
DATED        : October 3, 2000
INVENTOR(S)  : Om P. Agrawal et al.

It is certified that error appears in the above-identified patent and that said Letters Patent is hereby corrected as shown below:

Column 1,
Line 24, "Ser. No. 08/995,615" should be -- Ser. No. 08/995,614 --;
Line 29, "Ser. No. 08/995,615" should be --Ser. No. 08/995,612 --;
Line 34, "Ser. No. 08/995,615" should be -- Ser. No. 08/997,221 --.

Column 2,
Line 2, "22V10TM" should be -- 22V10™ --.

Figure 1B:
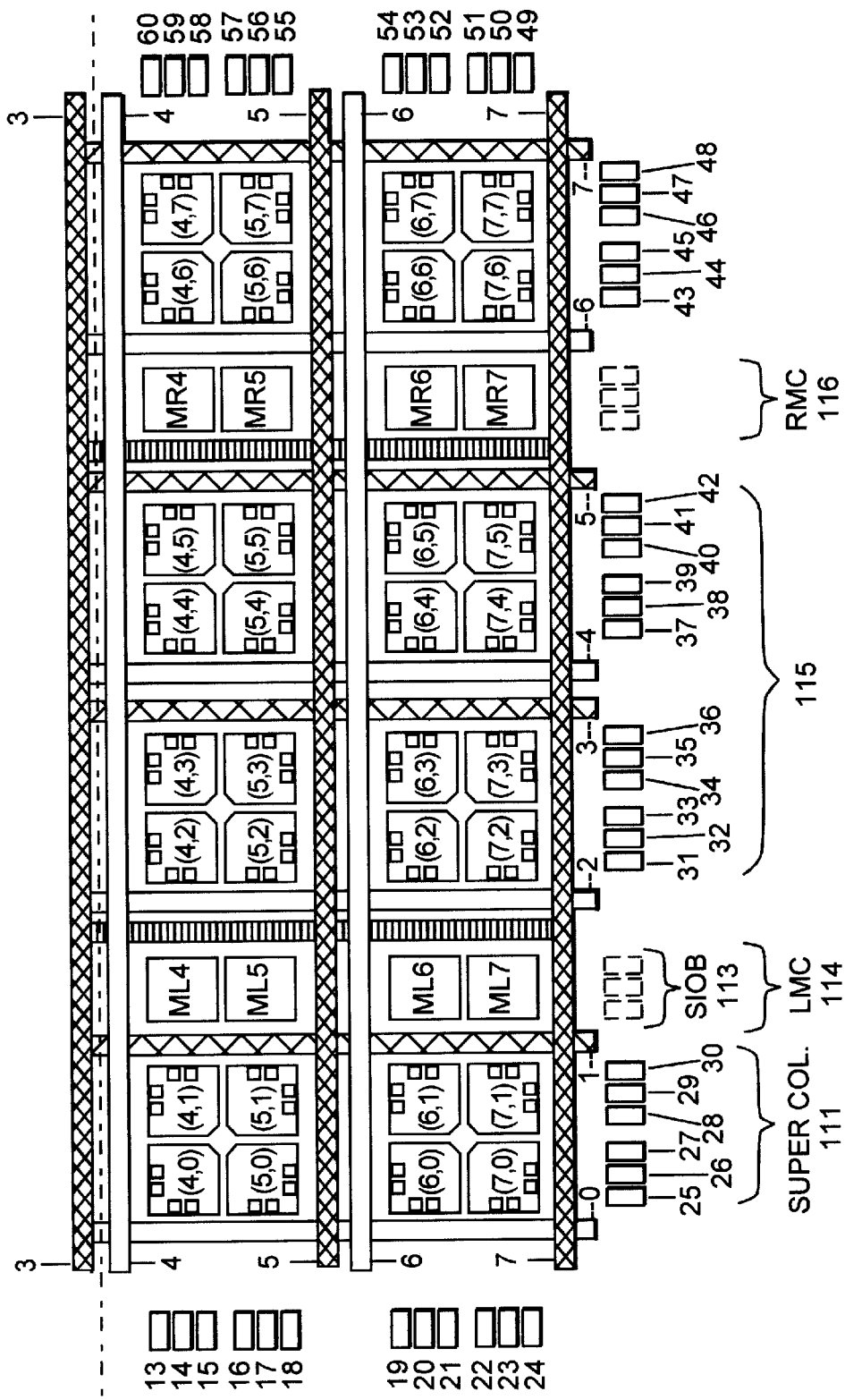
Figure 2:
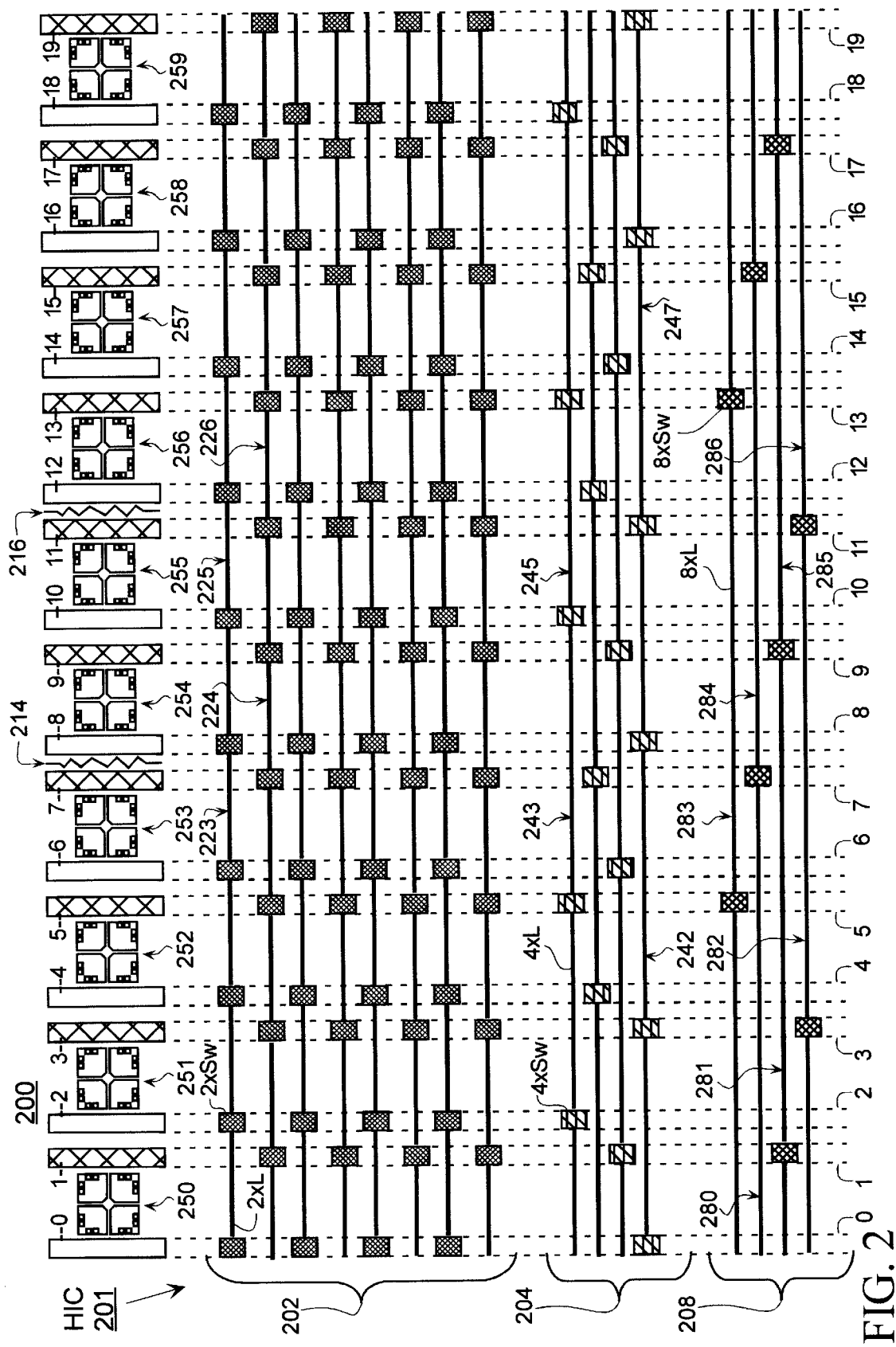
FIG. 2 is a diagram showing the placement of switch boxes along double length, quad length, and octal length lines within normal interconnect channels of another, like FPGA device having a 20×20 matrix of VGB's with embedded LMC and RMC.

Column 7,
Line 12, "FIG. 1 and 1A-1B" should be -- FIGS. 1A-1B --;
Line 33, "FIG. 4 AND 4A-4B" should be -- FIGS. 4A-4B --.

Column 14,
Line 28, "SxL" should be -- 8xL --.

Column 16,
Line 12, "VDDI" should be -- $V_{DD}$, --;
Line 56, "logic I11" should be -- logic '1' --;
Line 62, "D IN" should be -- D_IN -- and "D OUT" should be -- D_OUT --.

Column 24,
Line 3, delete "a" before "FIG 7A".

Column 38,
Line 21, "$W_1$'" should be -- W1' --;
Line 27, "$C_{C1}$" should be -- $C_{P1}$ --.

Column 44,
Line 55, "IMC" should be -- LMC --;
Line 56, "IJMC" should be -- LMC --.

UNITED STATES PATENT AND TRADEMARK OFFICE
CERTIFICATE OF CORRECTION

PATENT NO. : 6,127,843
DATED : October 3, 2000
INVENTOR(S) : Om P. Agrawal et al.

It is certified that error appears in the above-identified patent and that said Letters Patent is hereby corrected as shown below:

Column 50,
Line 48, "(128x)" should be -- (128x1) --.

Column 55,
Line 6, "wave" should be -- way --;
Line 20, "field" should be -- A field --.

Column 58,
Lines 44-47, delete paragraphs (e) and (f).

Signed and Sealed this

Fourteenth Day of August, 2001

*Attest:*

*Attesting Officer*

NICHOLAS P. GODICI
*Acting Director of the United States Patent and Trademark Office*